(12) United States Patent
Mizukami et al.

(10) Patent No.: US 7,950,963 B2
(45) Date of Patent: May 31, 2011

(54) CONNECTOR WITH REINFORCED MOUNTING STRUCTURE AND METHOD OF MANUFACTURING CONNECTOR

(75) Inventors: Kazuhiro Mizukami, Shinagawa (JP); Toshihiro Kusagaya, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 12/906,194

(22) Filed: Oct. 18, 2010

(65) Prior Publication Data
US 2011/0039429 A1 Feb. 17, 2011

Related U.S. Application Data

(62) Division of application No. 12/503,159, filed on Jul. 15, 2009, now Pat. No. 7,837,475.

(30) Foreign Application Priority Data

Aug. 15, 2008 (JP) .................................. 2008-209305
Aug. 15, 2008 (JP) .................................. 2008-209306
Aug. 15, 2008 (JP) .................................. 2008-209307

(51) Int. Cl.
*H01R 13/648* (2006.01)
(52) U.S. Cl. ............................................... 439/607.07
(58) Field of Classification Search ............ 439/607.07, 439/607.05, 607.09, 607.11, 607.13, 566, 439/567, 65
See application file for complete search history.

(56) References Cited

U.S. PATENT DOCUMENTS

| | | | |
|---|---|---|---|
| 6,375,508 B1 | 4/2002 | Pickles et al. | |
| 6,663,429 B1 | 12/2003 | Korsunsky et al. | |
| 6,918,774 B2 | 7/2005 | Wu | |
| 7,040,901 B2 | 5/2006 | Benham et al. | |
| 7,338,291 B2 | 3/2008 | Takada | |
| 7,837,475 B2 * | 11/2010 | Mizukami et al. | 439/65 |
| 2003/0003803 A1 | 1/2003 | Billman et al. | |
| 2005/0032430 A1 | 2/2005 | Otsu et al. | |
| 2008/0108233 A1 | 5/2008 | Jeon | |
| 2009/0068887 A1 | 3/2009 | Ito | |
| 2009/0163047 A1 | 6/2009 | Jeon | |

* cited by examiner

*Primary Examiner* — Hae Moon Hyeon
(74) *Attorney, Agent, or Firm* — IPUSA, PLLC

(57) ABSTRACT

A connector includes a wiring board; a lead connecting the wiring board electrically to an external board; and a conductive layer connecting the lead to the wiring board so as to allow the lead to move when the conductive layer is melted. The lead includes first through third regions. The first region, in contact with the conductive layer, is sandwiched between the second and third regions lower in wettability with respect to the liquid melt of the conductive layer than the first region. The wiring board includes a first region and second regions. The first region, in contact with the conductive layer, is sandwiched between the second regions lower in wettability with respect to the liquid melt than the first region. The center of the first region of the lead is offset and away from the external board relative to the center of the first region of the wiring board.

3 Claims, 50 Drawing Sheets

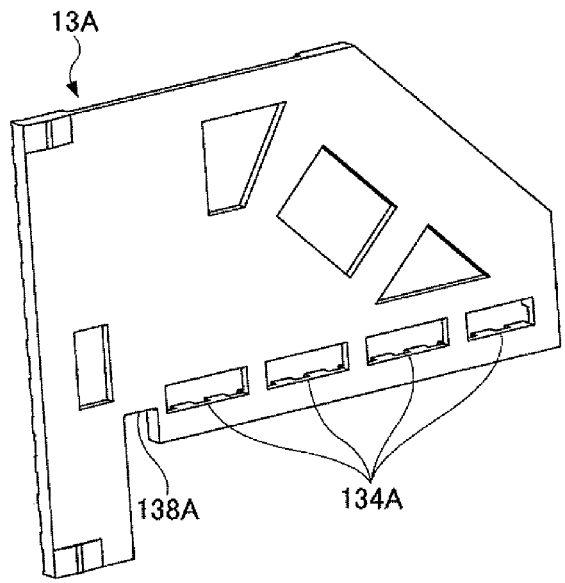
FIG.23A
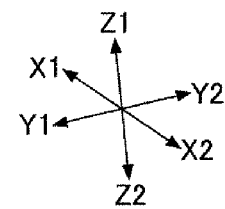
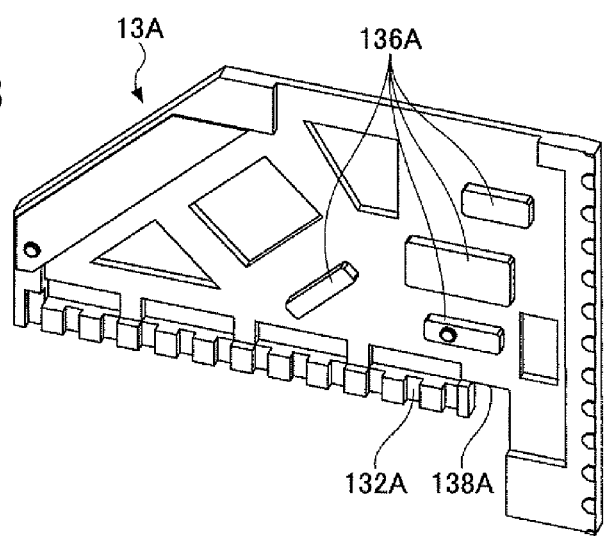
FIG.23B
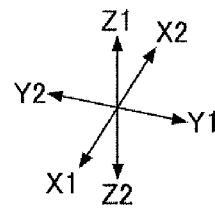

FIG.38
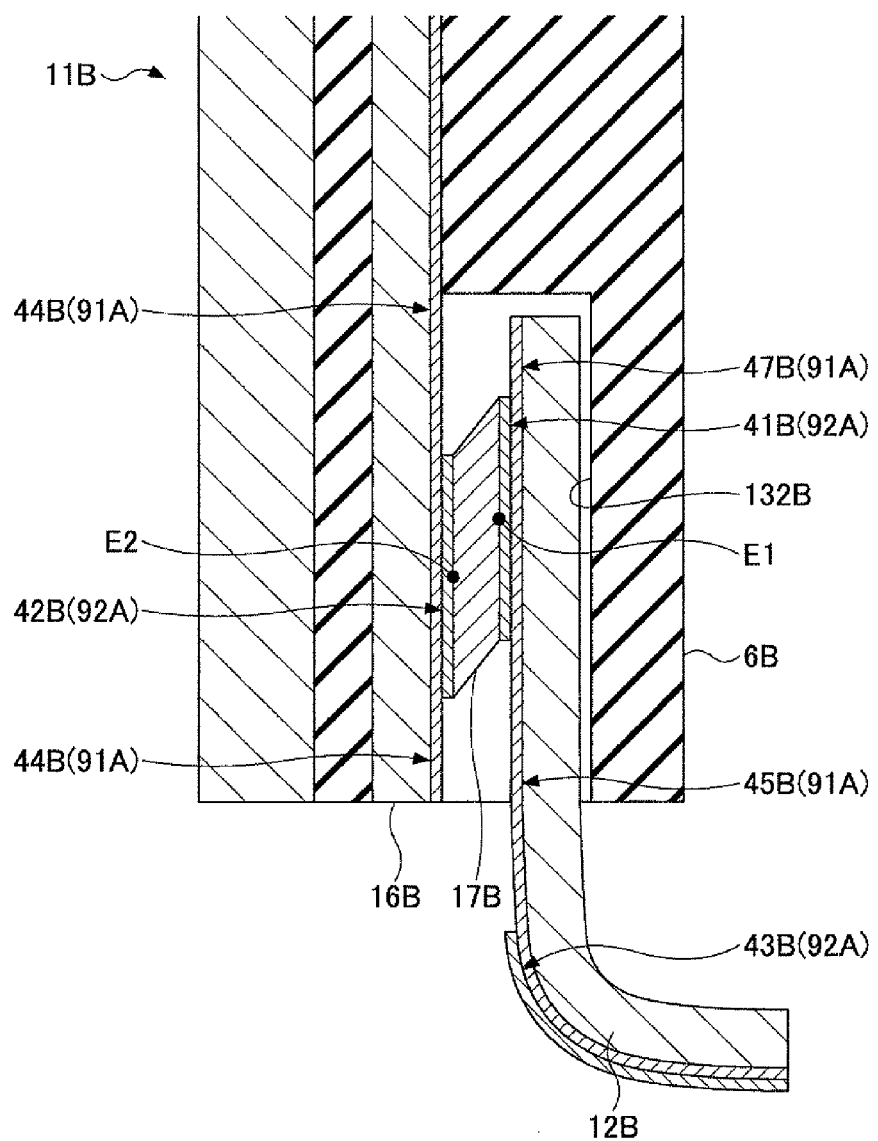
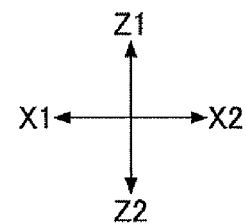

FIG.40
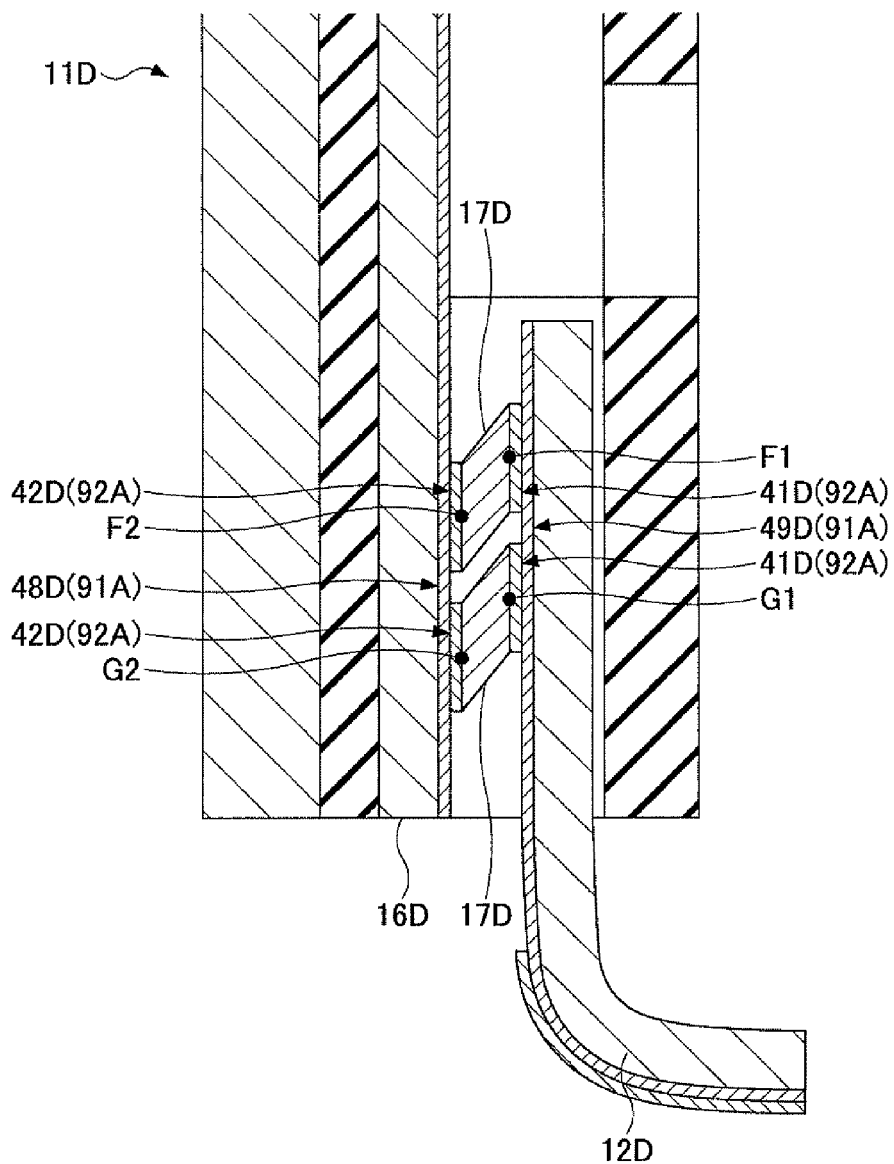
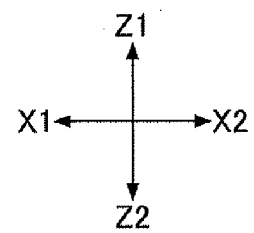

CONNECTOR WITH REINFORCED MOUNTING STRUCTURE AND METHOD OF MANUFACTURING CONNECTOR

CROSS-REFERENCE TO RELATED APPLICATIONS

The present application is a division of U.S. patent application Ser. No. 12/503,159, filed on Jul. 15, 2009, now U.S. Pat. No. 7,837,475 which is based on Japanese Priority Patent Applications No. 2008-209305, filed on Aug. 15, 2008, No. 2008-209306, filed on Aug. 15, 2008, and No. 2008-209307, filed on Aug. 15, 2008. The disclosure of the prior applications is hereby incorporated herein in its entirety by reference.

BACKGROUND OF THE INVENTION

1. Field of the Invention

The present invention relates to a connector to be mounted on an external board, a connector mounting structure for mounting the connector on the external board, and a method of manufacturing the connector to be mounted on the external board.

2. Description of the Related Art

Data transmission systems include an ordinary transmission system and a differential transmission system. The ordinary transmission system employs an electric wire for each data item. The differential transmission system, using a pair of electric wires for each data item, simultaneously transmits a "+" signal to be transmitted and a "−" signal equal in magnitude and opposite in direction to the "+" signal. The differential transmission system, which has the advantage of being less susceptible to noise compared with the ordinary transmission system, is widely used in fields where signals are transmitted at high speed.

FIG. 1 is a schematic perspective view of a conventional differential transmission connector unit 1.

The differential transmission connector unit 1 includes a plug connector 2 and a jack connector 3. The plug connector 2 is mounted on a backplane (external board) 4. The jack connector 3 is mounted at an end of a daughterboard (external board) 5. The jack connector 3 and the plug connector 2 are connected so that the daughterboard 5 and the backplane 4 are electrically connected by the connector unit 1. (See, for example, United States Patent Application Publication No. 2008/0108233 A1.)

FIG. 2 is an exploded perspective view of the conventional jack connector 3.

As illustrated in FIG. 2, the jack connector 3 includes a first insulative housing 6, a second insulative housing 7, and multiple modules 10. The first insulative housing 6 is configured to be fit in a housing 8 (FIG. 1) of the plug connector 2. The second insulative housing 7 is configured to support the modules 10 parallel to each other.

FIG. 3 is a schematic perspective view of the conventional module 10. FIG. 4 is an exploded perspective view of the conventional module 10.

Referring to FIG. 3 and FIG. 4, the module 10 includes a wiring board 11 with multiple pad electrodes 16; multiple leads 12 for electrically connecting the wiring board 11 and the external board 5 (FIG. 1); multiple solder layers (conductive layers) 17; and an insulative spacer 13. The leads 12 are connected to the corresponding pad electrodes 16 through the corresponding solder layers 17.

FIG. 5 is a cross-sectional view of part of the conventional module 10.

The spacer 13 is fixed on the wiring board 11. The spacer 13 has multiple guide grooves 132 on its surface facing the wiring board 11. The guide grooves 132 extend in a direction in which the leads 12 extend. The leads 12 are allowed to move inside the corresponding guide grooves 132 when the solder layers 17 melt.

FIG. 6A is a front-side cross-sectional view of the conventional jack connector 3 placed on the daughterboard 5. FIG. 6B is a schematic cross-sectional view of the jack connector 3 of FIG. 6A taken along one-dot chain line A-A.

A solder paste 19 for bonding the leads 12 is applied on the surface of the daughterboard 5. In the case illustrated in FIGS. 6A and 6B, there is a gap between some of the leads 12 and the solder paste 19 because of the warpage of the daughterboard 5.

FIG. 7A is a front-side cross-sectional view of the conventional jack connector 3 placed on the daughterboard 5 after heating (reflow soldering). FIG. 7B is a schematic cross-sectional view of the jack connector 3 of FIG. 7A taken along one-dot chain line A-A.

When the solder paste 19 is melted by heating, each solder layer 17 melts, so that the leads 12 are movable inside the corresponding guide grooves 132. In this state, the leads 12 are pushed into the corresponding guide grooves 132 because of gravity so as to absorb the warpage of the daughterboard 5. As a result, the leads 12 are connected to the daughterboard 5 after heating.

SUMMARY OF THE INVENTION

According to one aspect of the present invention, a connector includes a wiring board; a lead configured to connect the wiring board electrically to an external board; a conductive layer configured to connect the lead to the wiring board so as to allow the lead to move in predetermined directions relative to the wiring board when the conductive layer is melted; and a reinforcement member configured to reinforce a mechanical connection of the wiring board and the external board.

According to one aspect of the present invention, a connector includes a wiring board; a lead configured to connect the wiring board electrically to an external board; and a conductive layer configured to connect the lead to the wiring board so as to allow the lead to move in predetermined directions relative to the wiring board when the conductive layer is melted, wherein the lead includes a first region, a second region, and a third region, the first region being in contact with the conductive layer and being sandwiched between the second region and the third region in directions parallel to the predetermined directions, the second region and the third region being lower in wettability with respect to a liquid melt of the conductive layer than the first region, the wiring board includes a first region and a pair of second regions, the first region being in contact with the conductive layer and being sandwiched between the second regions in the directions parallel to the predetermined directions, the second regions being lower in wettability with respect to the liquid melt of the conductive layer than the first region, and a center of the first region of the lead is offset in a direction parallel to the predetermined directions and away from the external board relative to a center of the first region of the wiring board.

According to one aspect of the present invention, a connector includes a wiring board having a first side and a second side facing away from each other; a plurality of leads configured to connect the wiring board electrically to an external board, the leads being provided on the first and second sides of the wiring board; and a plurality of conductive layers configured to connect the corresponding leads to the wiring board so as to allow the leads to move in predetermined directions relative to the wiring board when the conductive layers are melted, the conductive layers being provided on the first and second sides of the wiring board.

According to one aspect of the present invention, a method of manufacturing a connector includes connecting a first lead to a first side of a wiring board through a first conductive layer having a first melting point; and connecting a second lead to a second side of the wiring board through a second conductive layer having a second melting point lower than the first melting point, the second side of the wiring board facing away from the first side thereof, said connecting the second lead being performed at a temperature lower than the first melting point and higher than the second melting point.

BRIEF DESCRIPTION OF THE DRAWINGS

Other objects, features and advantages of the present invention will become more apparent from the following detailed description when read in conjunction with the accompanying drawings, in which:

FIGS. 23A and 23B are perspective views of a spacer of the module according to the first embodiment of the present invention;

FIG. 38 is a cross-sectional view of part of the other jack connector, illustrating the positional relationship between a lead and a corresponding pad electrode 16B according to the second variation of the first embodiment of the present invention;

FIG. 40 is a cross-sectional view illustrating the positional relationship between a lead and a pad electrode in a case where multiple conductive layers are provided between the lead and the pad electrode according to the second variation of the first embodiment of the present invention;

DETAILED DESCRIPTION OF THE PREFERRED EMBODIMENTS

Figure 1:
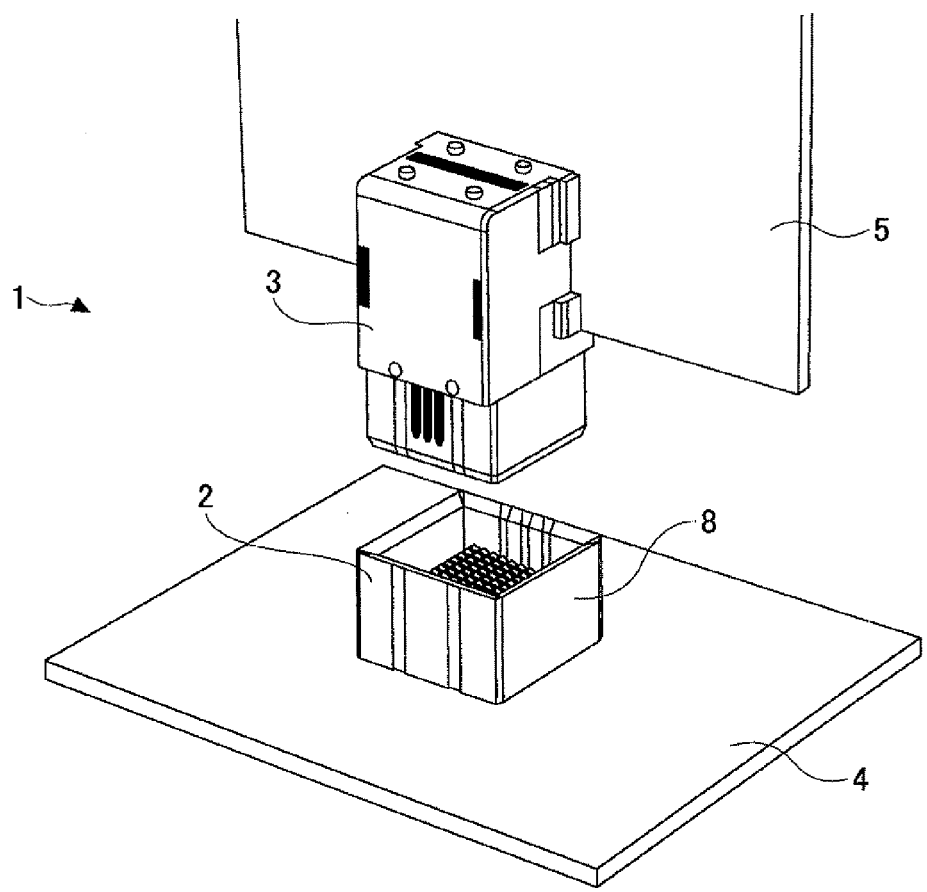
FIG. 1 is a schematic perspective view of a conventional differential transmission connector unit.
Figure 2:
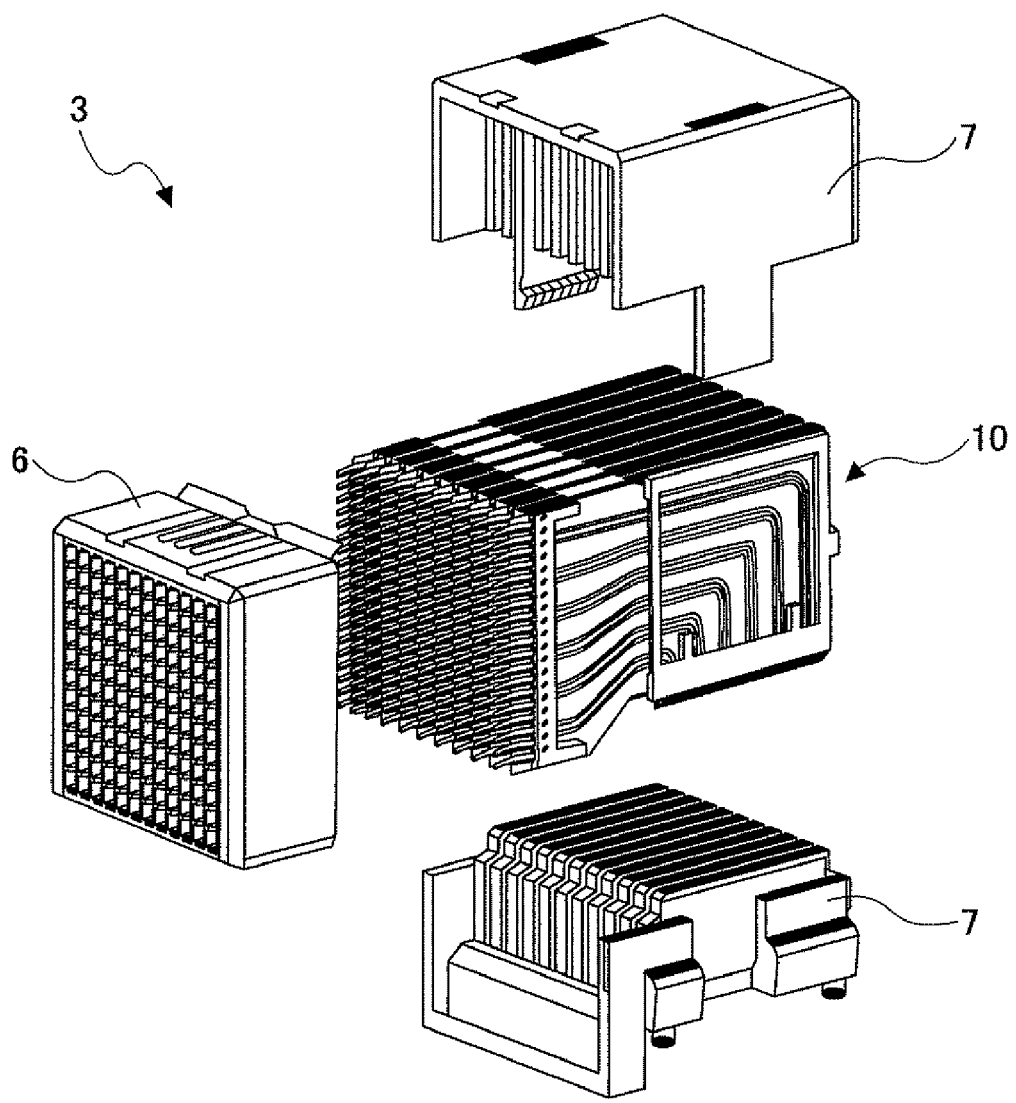
FIG. 2 is an exploded perspective view of a conventional jack connector.
Figure 3:
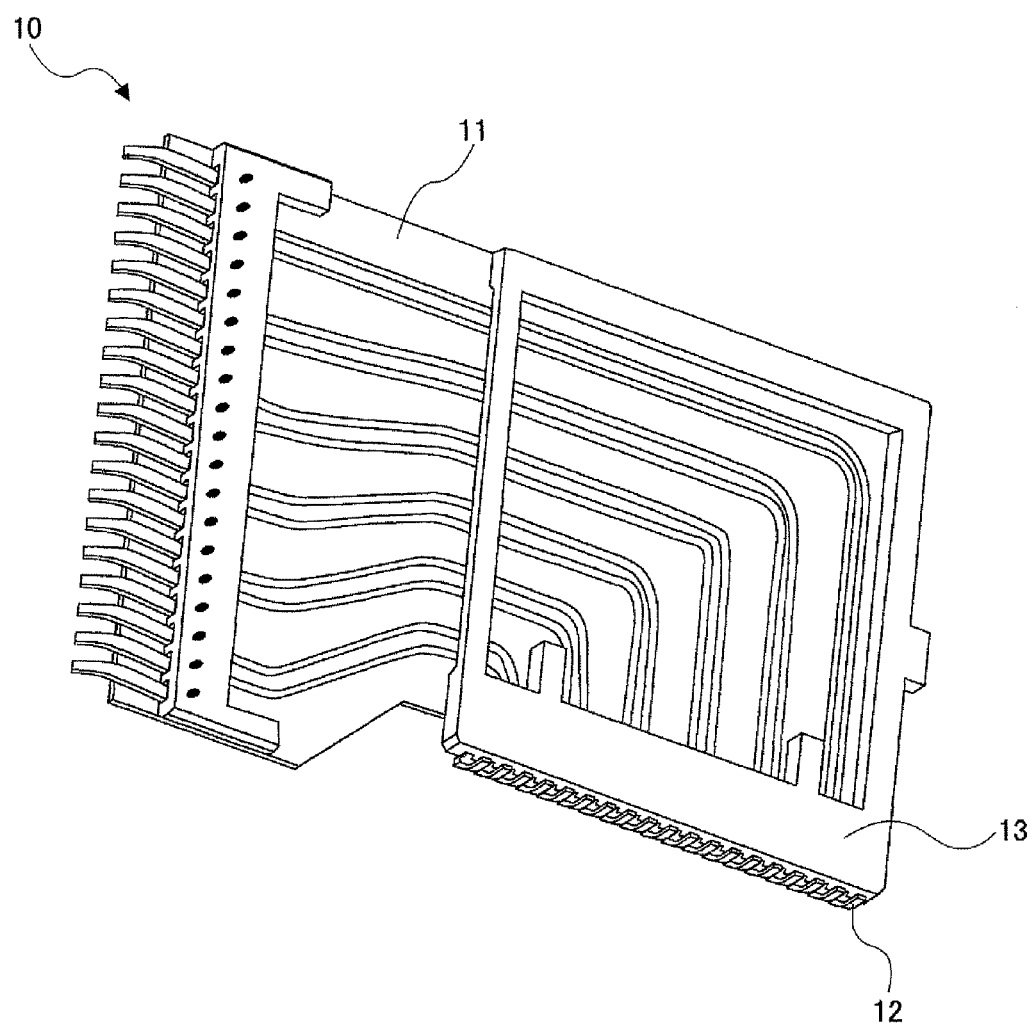
FIG. 3 is a schematic perspective view of a conventional module.
Figure 4:
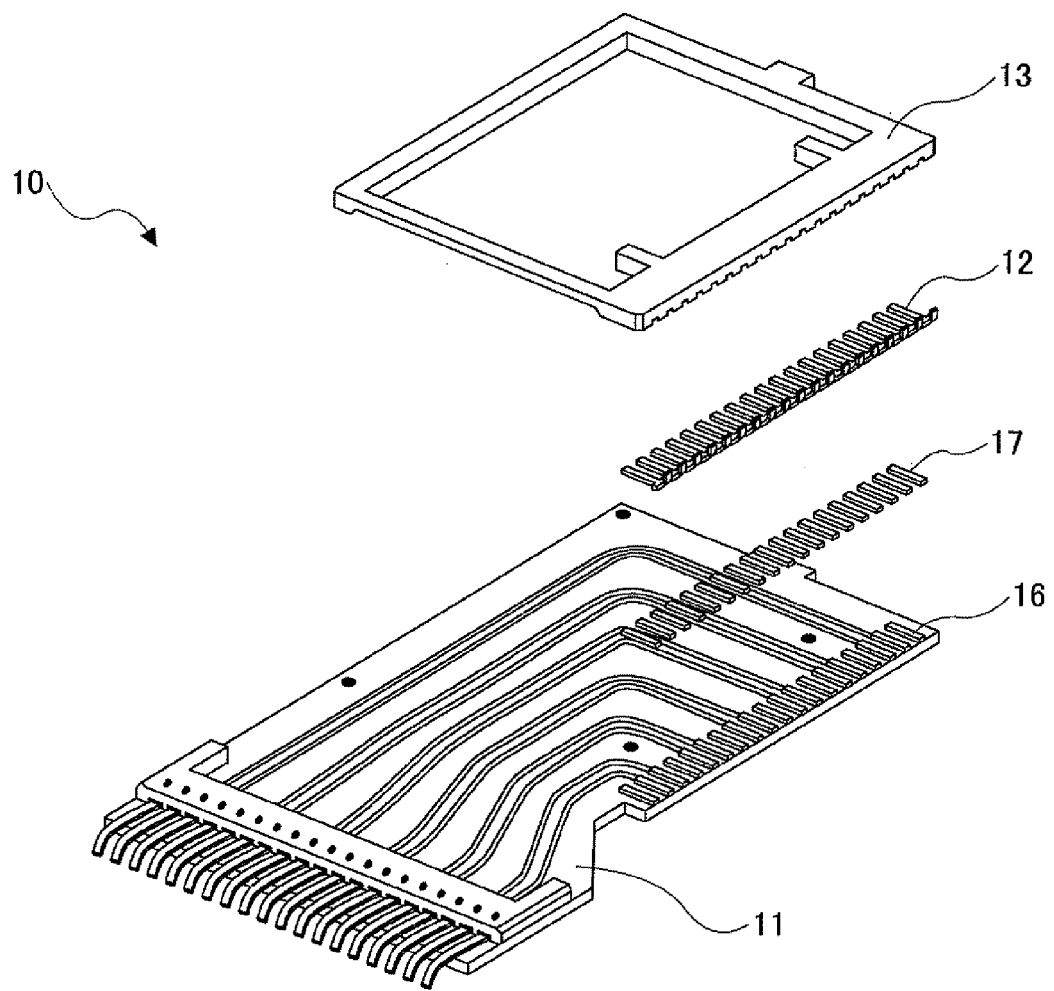
FIG. 4 is an exploded perspective view of the conventional module.
Figure 5:
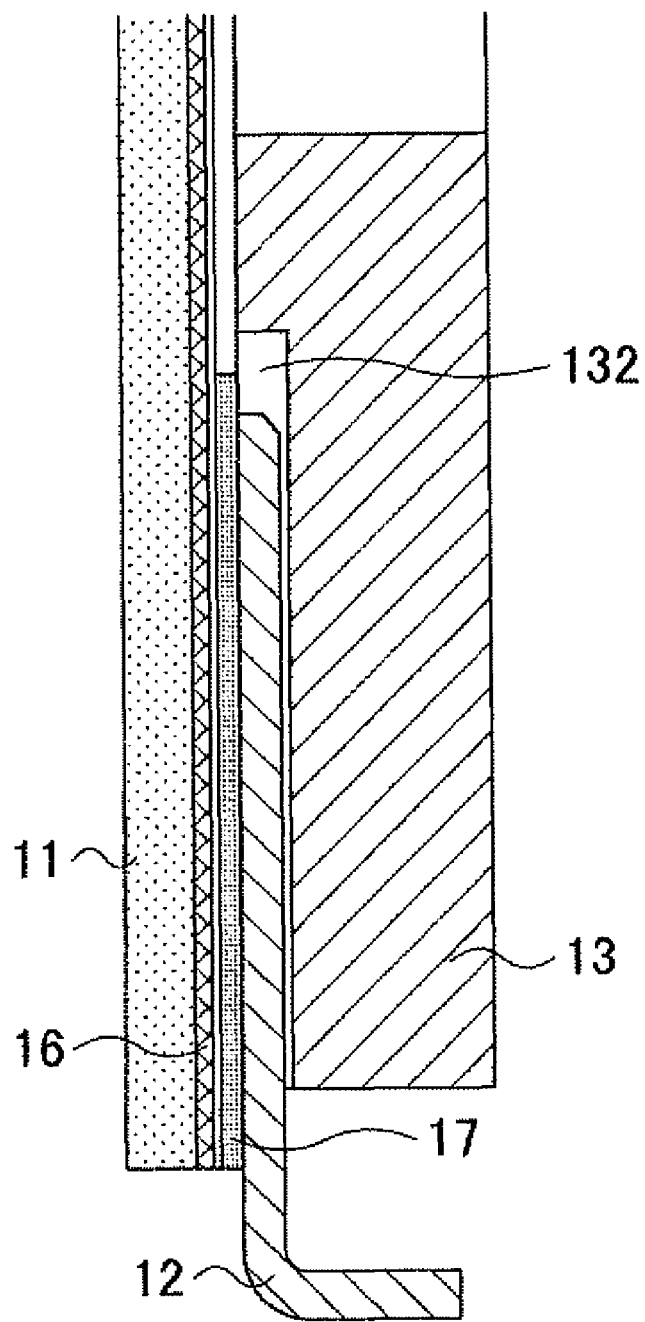
FIG. 5 is a cross-sectional view of part of the conventional module.
Figure 6B:
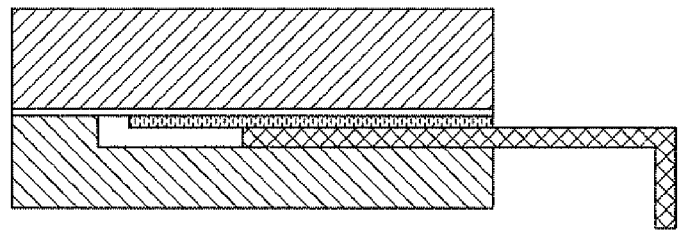
FIG. 6B is a schematic cross-sectional view of the jack connector of FIG. 6A taken along one-dot chain line A-A.
Figure 6A:
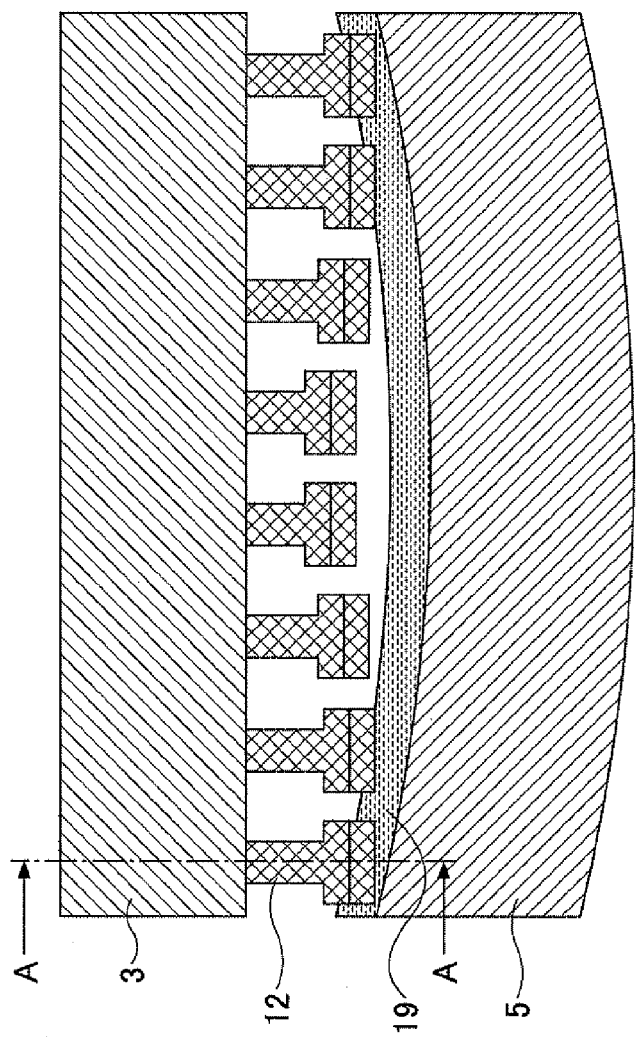
FIG. 6A is a front-side cross-sectional view of the conventional jack connector placed on a daughterboard.
Figure 7B:
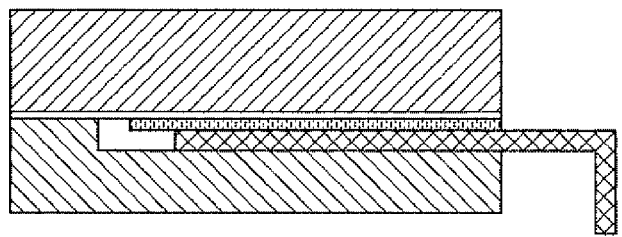
FIG. 7B is a schematic cross-sectional view of the jack connector of FIG. 7A taken along one-dot chain line A-A.
Figure 7A:
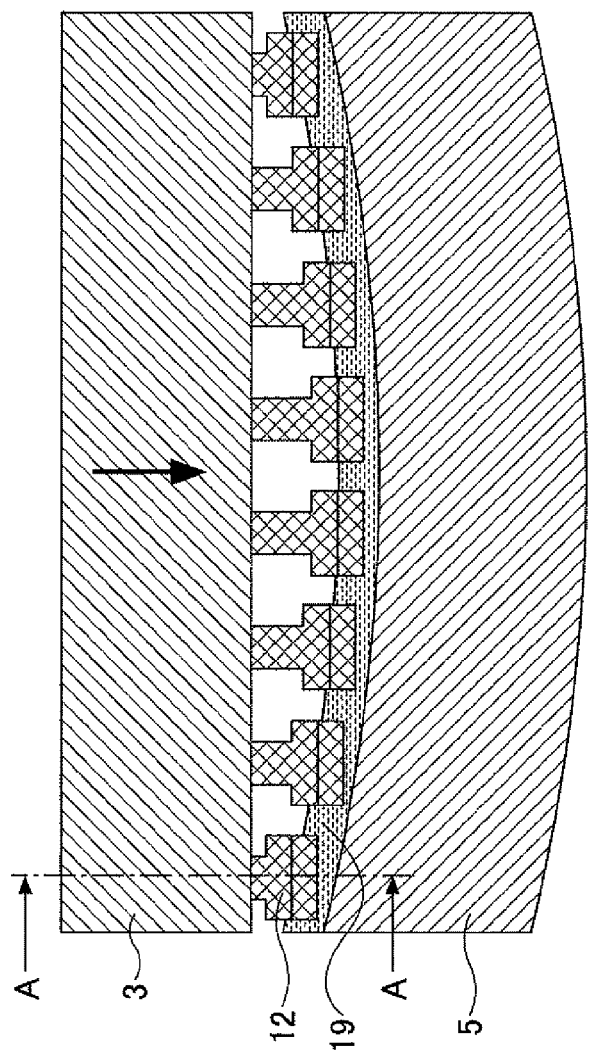
FIG. 7A is a front-side cross-sectional view of the conventional jack connector placed on the daughterboard after heating.

As described above, according to United States Patent Application Publication No. 2008/0108233 A1, the leads 12 are pushed into the corresponding guide grooves 132 because of gravity so as to absorb or counter the warpage of the daughterboard 5, so that the leads 12 are connected to the daughterboard 5 after heating.

However, since the leads 12 are surface-mounted on the daughterboard 5 by soldering, an external stress may be applied to the connections (soldered parts) of the leads 12 and the daughterboard 5 on application of an external stress to the connector unit 1 or the daughterboard 5, so that the connections may be degraded.

Further, since the solder layers 17 melt at the time of mounting the leads 12 on the daughterboard 5, the molten solder of the solder layers 17 may move on the leads 12 and the wiring board 11 so as to cause unintended damage to the surroundings.

Moreover, it is desired to reduce the size of such a connector where leads are allowed to move so as to absorb the warpage of an external substrate at the time of mounting the leads (connector) thereon as illustrated in United States Patent Application Publication No. 2008/0108233 A1.

According to one aspect of the present invention, a connector is provided whose leads are movable so as to absorb the warpage of an external board at the time of mounting and whose durability against an external stress is improved.

According to one aspect of the present invention, a connector is provided whose leads are movable so as to absorb the warpage of an external board at the time of mounting and that prevents the liquid melt of a conductive layer from causing unintended damage to the surroundings.

According to one aspect of the present invention, a connector is provided whose leads are movable so as to absorb the warpage of an external board at the time of mounting and that is reduced in size.

According to one aspect of the present invention, a connector mounting structure for mounting one or more of the above-described connectors on an external board is provided.

According to one aspect of the present invention, a method of manufacturing one or more of the above-described connectors is provided.

A description is given below, with reference to the accompanying drawings, of embodiments of the present invention.

First Embodiment

Figure 8:
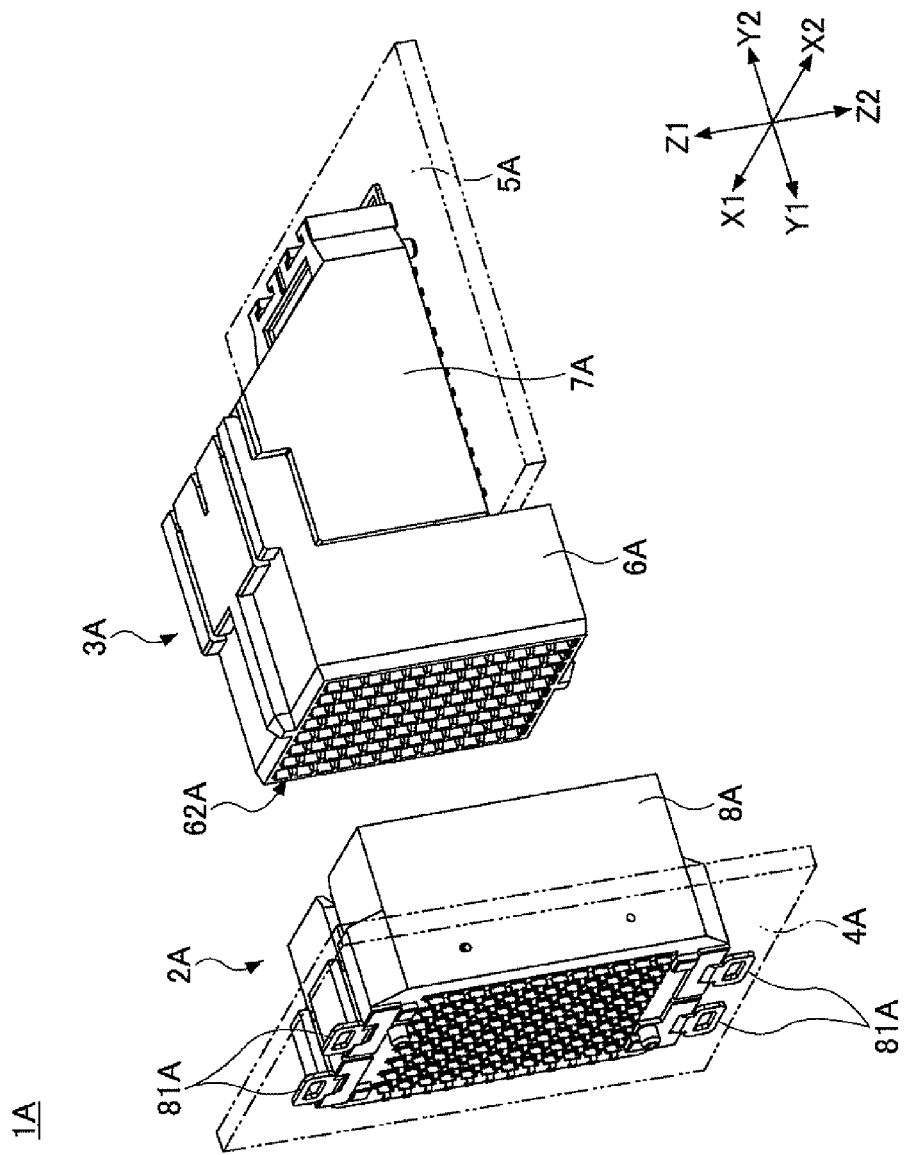
FIG. 8 is a perspective view of a differential transmission connector unit according to a first embodiment of the present invention.

FIG. 8 is a perspective view of a differential transmission connector unit 1A according to a first embodiment of the present invention. In FIG. 8 and subsequent drawings for the first embodiment, the same elements as those illustrated in FIG. 1 through FIG. 7B are referred to by the same reference numerals.

Referring to FIG. 8, the differential transmission connector unit 1A includes a plug connector 2A and a jack connector 3A. The plug connector 2A is mounted on a backplane (external board or circuit board) 4A. The jack connector 3A is mounted at an end of a daughterboard (external board or circuit board) 5A. The jack connector 3A and the plug connector 2A are connected so that the daughterboard 5A and the backplane 4A are electrically connected by the connector unit 1A.

In FIG. 8 and subsequent drawings for the first embodiment, Y1-Y2 indicates the directions in which the jack connector 3A and the plug connector 2A are connected relative to each other, Z1-Z2 indicates the directions in which leads 12A (FIG. 9) extend, and X1-X2 indicates the directions in which multiple modules 10A (FIG. 9) of the jack connector 3A are arranged. Further, Y1 indicates the direction in which the plug connector 2A is mounted on the backplane 4A, and Z2 indicates the direction in which the jack connector 3A is mounted on the daughterboard 5A. The X1-X2 directions, Y1-Y2 directions, and Z1-Z2 directions are perpendicular to one another.

A description is given below first of a configuration of the jack connector 3A and then of a configuration of the plug connector 2A.

Figure 9:
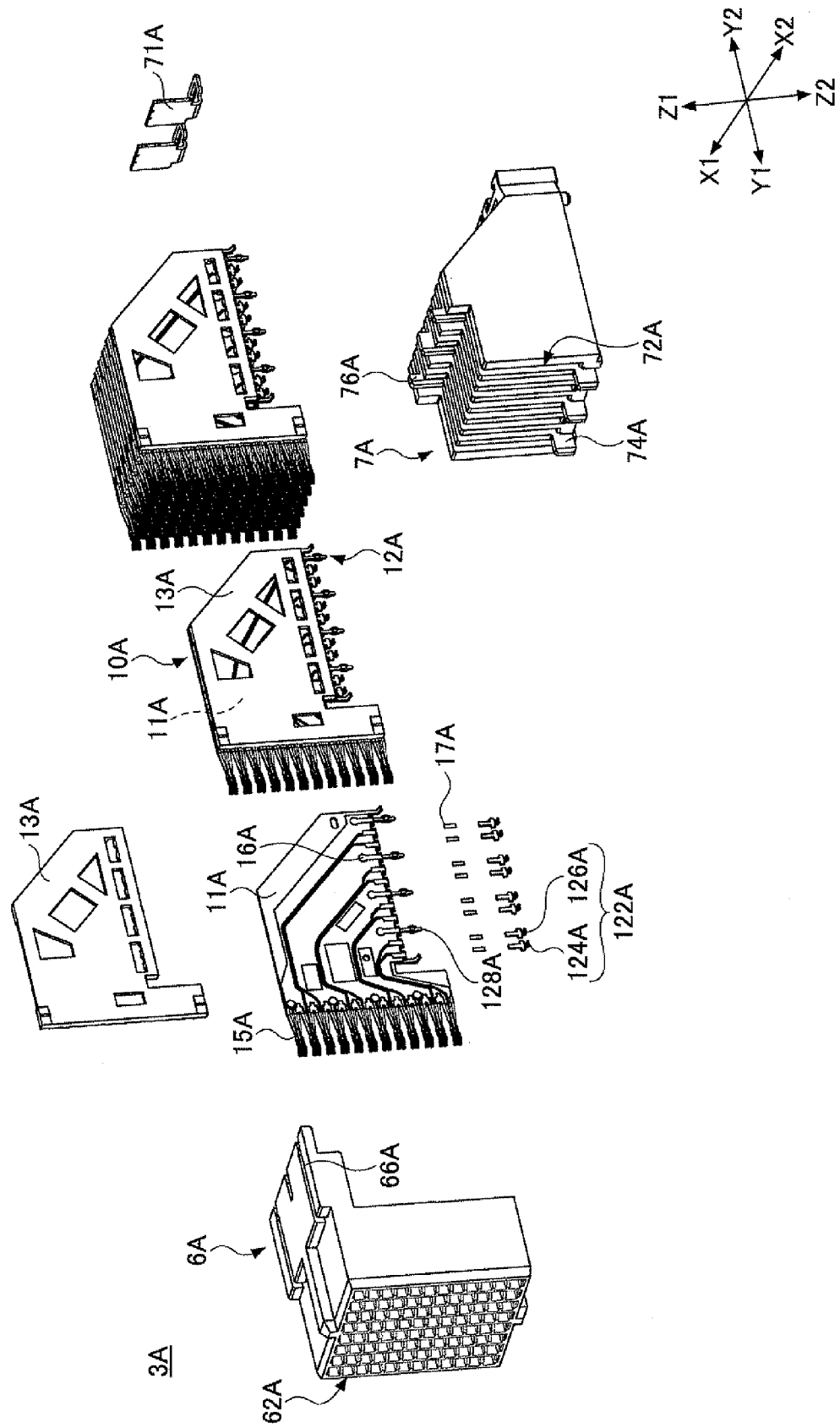
FIG. 9 is an exploded perspective view of a jack connector of the differential transmission connector unit according to the first embodiment of the present invention.

FIG. 9 is an exploded perspective view of the jack connector 3A.

The jack connector 3A includes a first insulative housing 6A, a second insulative housing 7A, and the multiple modules 10A.

The first insulative housing 6A is configured to be fit to an insulative housing 8A of the plug connector 2A (FIG. 8). Although not graphically illustrated, multiple plug-side contacts are arranged in rows (X1-X2 directions) and columns (Z1-Z2 directions) inside the insulative housing 8A of the plug connector 2A.

As illustrated in FIG. 9, multiple openings 62A corresponding to the plug-side contacts are formed in the first insulative housing 6A. The first insulative housing 6A is fit into the insulative housing 8A so that the plug-side contacts are inserted into the first insulative housing 6A through the corresponding openings 62A to be connected to corresponding jack-side contacts 15A, thereby establishing an electrical connection between the jack connector 3A and the plug connector 2A.

The second insulative housing 7A is configured to support the multiple modules 10A (that is, multiple wiring boards 11A) parallel to each other. For example, the second insulative housing 7A has a comb shape with multiple slits 72A as illustrated in FIG. 9. The multiple slits 72A are arranged in the X1-X2 directions. The modules 10A are incorporated in the corresponding slits 72A on a one-to-one basis.

Figure 10:
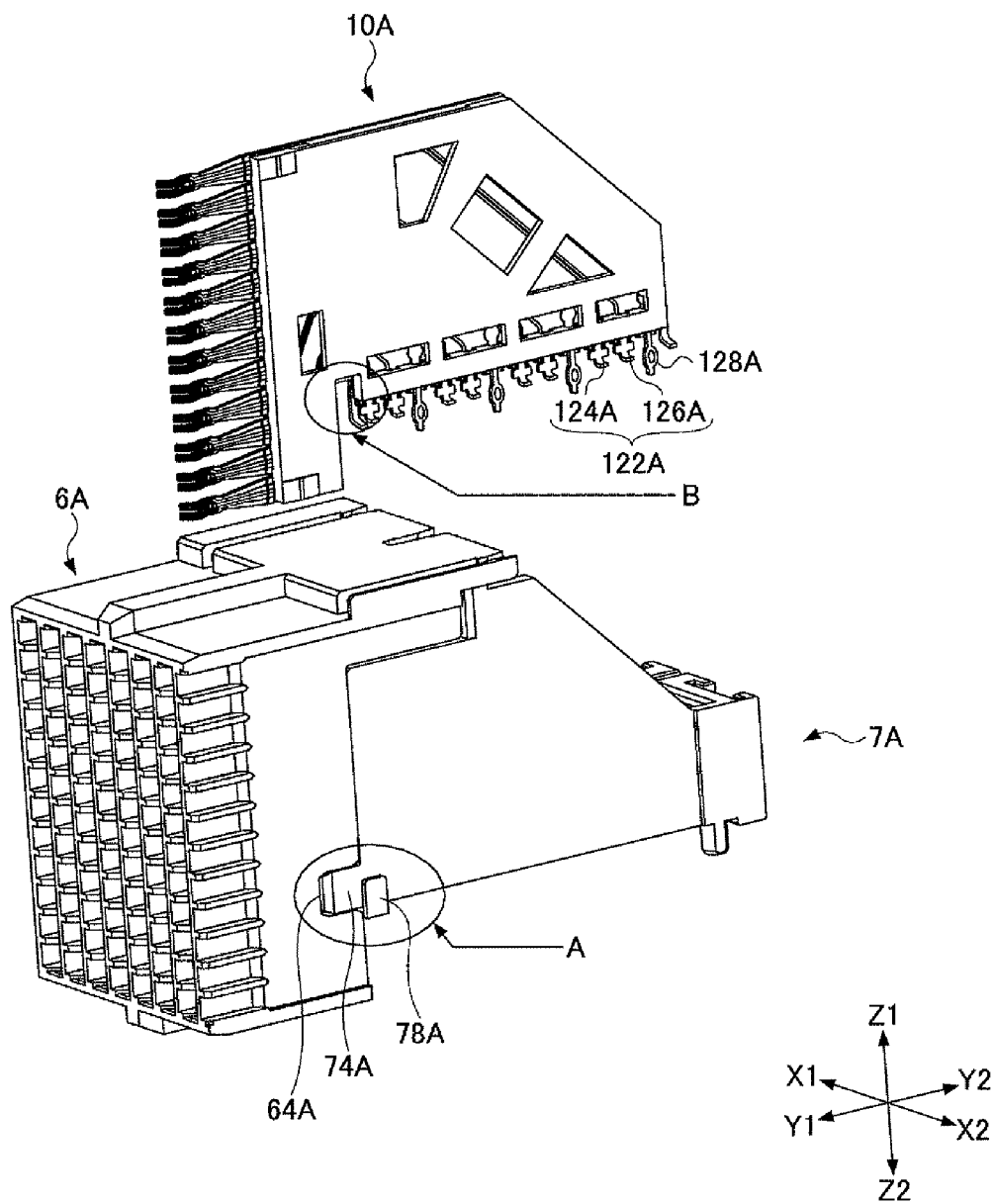
FIG. 10 is a cut-away view of the jack connector for illustrating the engagement relationship among a first insulative housing, a second insulative housing, and modules thereof according to the first embodiment of the present invention.
Figure 11:
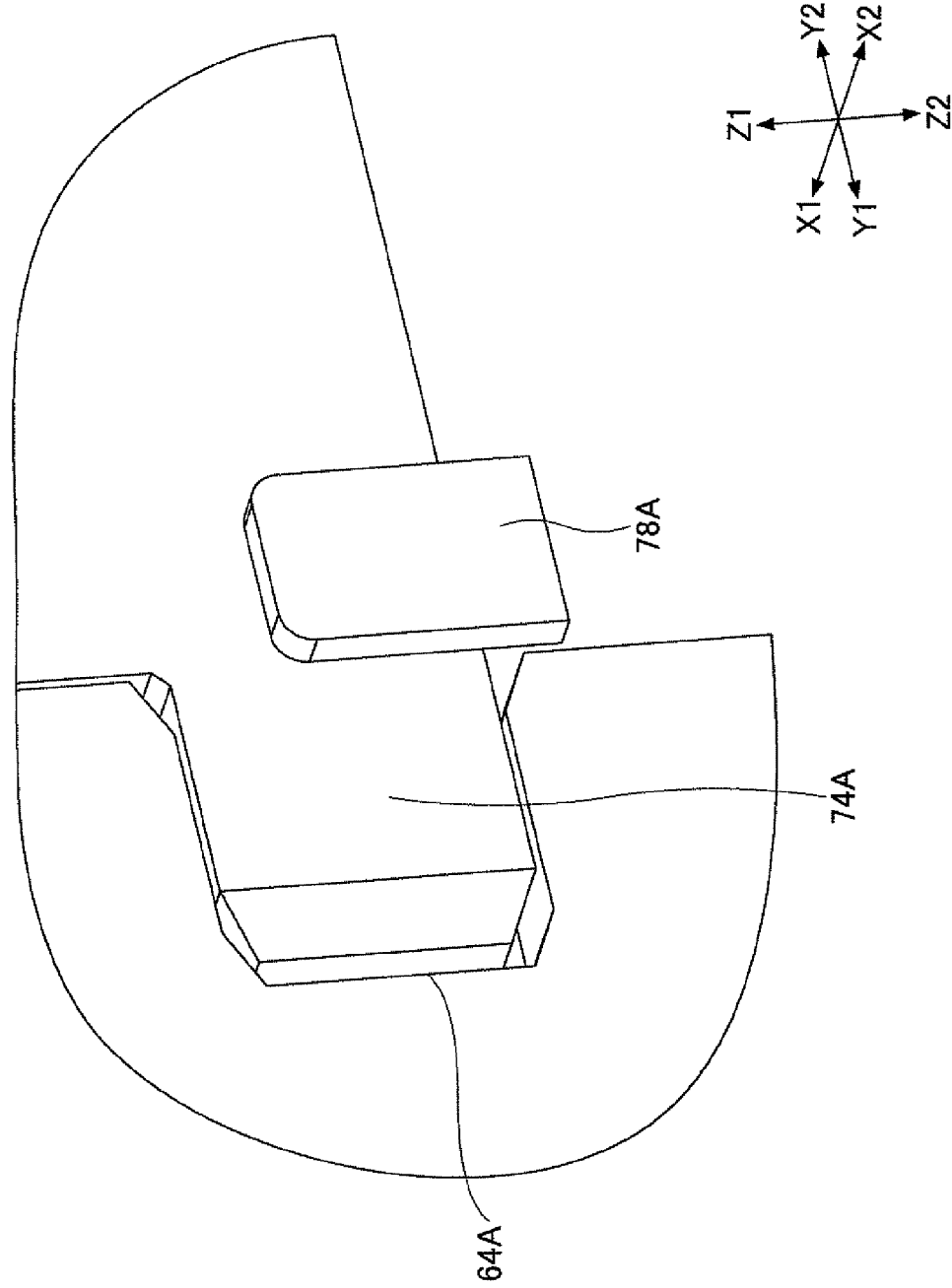
FIG. 11 is an enlarged view of the encircled region indicated by arrow A in FIG. 10 according to the first embodiment of the present invention.
Figure 12:
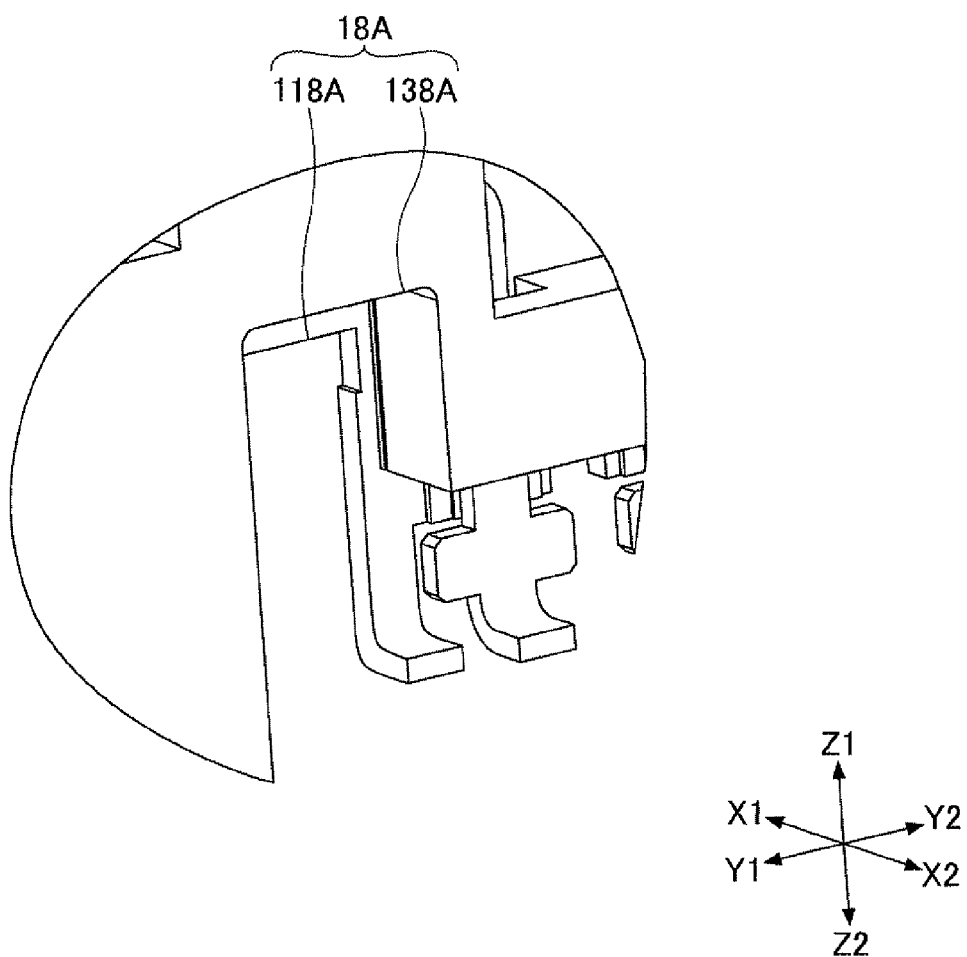
FIG. 12 is an enlarged view of the encircled region indicated by arrow B in FIG. 10 according to the first embodiment of the present invention.

FIG. 10 is a cut-away view of the jack connector 3A for illustrating the engagement relationship among the first insulative housing 6A, the second insulative housing 7A, and the modules 10A. FIG. 11 is an enlarged view of the encircled region indicated by arrow A in FIG. 10. FIG. 12 is an enlarged view of the encircled region indicated by arrow B in FIG. 10.

As illustrated in FIG. 9 through FIG. 11, the second insulative housing 7A includes three first tongue piece parts 74A. On the other hand, the first insulative housing 6A includes three cutout parts 64A corresponding to the three first tongue piece parts 74A. The first insulative housing 6A and the second insulative housing 7A are connected with the first tongue piece parts 74A inserted into and attached to the cutout parts 64A.

The second insulative housing 7A further includes three second tongue piece parts 76A (FIG. 9). On the other hand, the first insulative housing 6A includes three slit parts 66A (FIG. 9) corresponding to the three second tongue piece parts 76A. The first insulative housing 6A and the second insulative housing 7A are connected with the second tongue piece parts 76A inserted into and attached to the slit parts 66A.

The second insulative housing 7A further includes a step-shaped projecting part 78A in each slit 72A as illustrated in FIG. 10 and FIG. 11. On the other hand, each module 10A (including the wiring board 11A and a spacer 13A [FIG. 9]) includes a recess part 18A (FIG. 12) corresponding to the projecting part 78A. Referring to FIG. 12, the recess part 18A includes a recess part 118A of the wiring board 11A and a recess part 138A of the spacer 13. The second insulative housing 7A and the modules 10A are connected with the projecting parts 78A fit into the corresponding recess parts 18A.

The second insulative housing 7A further includes fixation metal parts 71A (FIG. 9). For example, the fixation metal parts 71A are formed by bending a metal plate into an L-letter shape. The fixation metal parts 71A have their respective first ends press-fit into and fixed to the second insulative housing 7A. The fixation metal parts 71A have their respective second ends mounted on the surface of the daughterboard (external board) 5A when the leads 12A (FIG. 9) of the modules 10A are connected to the daughterboard 5A. Thus, the second insulative housing 7A is attached to the daughterboard 5A through the fixation metal parts 71A.

Accordingly, the mechanical connection of the wiring boards 11A and the daughterboard 5A is reinforced by the second insulative housing 7A and a connection mechanism formed of the projecting parts 78A and the recess parts 18A. Therefore, even when an external stress such as vibration or impact is applied to the jack connector 3A or the daughterboard 5A, the movements of the wiring boards 11A and the daughterboard 5A relative to each other are limited or prevented, so that the deformation of the leads 12A connecting the wiring boards 11A and the daughterboard 5A is controlled. As a result, transmission of the external stress to the connections of the leads 12A and the daughterboard 5A is controlled, so that the degradation of the connections, such as occurrence of peeling or a crack in a soldering part (for example, an adhesive agent 19A in FIG. 25A), is controlled, thus resulting in increased durability against the external stress.

Referring to FIG. 9, each of the modules 10A includes the wiring board 11A with multiple pad electrodes 16A; the multiple leads 12A for electrically connecting the wiring board 11A and the daughterboard 5A (FIG. 8); multiple conductive layers 17A; and the insulative spacer (guide part) 13A.

Figure 13:
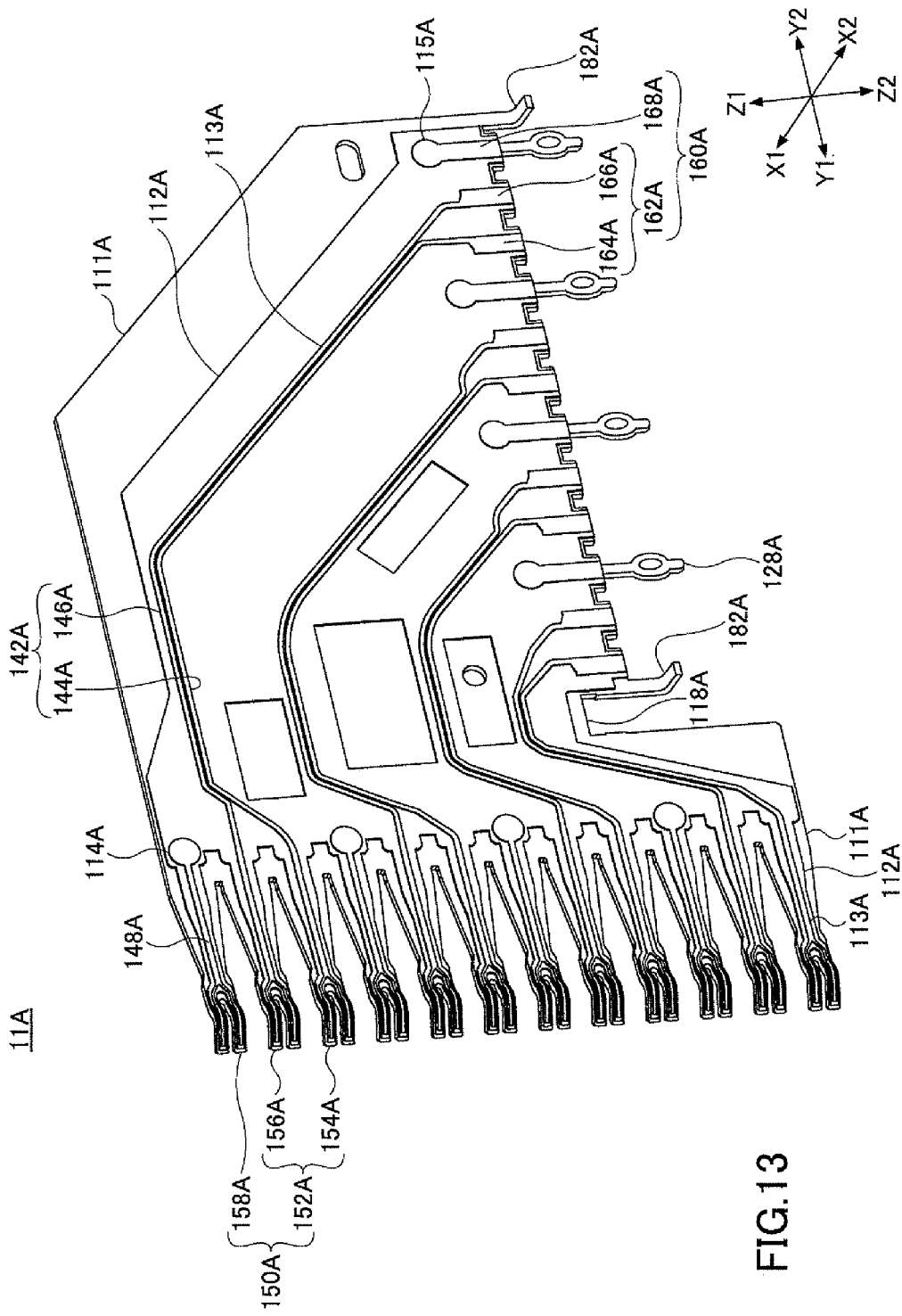
FIG. 13 is a perspective view of a wiring board of the module according to the first embodiment of the present invention.

FIG. 13 is a perspective view of the wiring board 11A, which may be, for example, a printed wiring board (PWB). The wiring board 11A may have, for example, a three-layer structure of an insulating layer 112A of polyimide or the like and interconnection patterns (wiring patterns) 113A of Cu, Al, or the like successively stacked on a metal plate 111A of phosphor bronze or the like as illustrated in FIG. 13.

The wiring board 11A may be manufactured by a common method such as one using photolithography and etching.

FIGS. 14A through 14G are diagrams illustrating a method (process) for manufacturing the wiring board 11A.

Figure 14A:
FIGS. 14A through 14G are diagrams illustrating a method (process) for manufacturing the wiring board according to the first embodiment of the present invention.

In the illustrated case, first, as illustrated in FIG. 14A, photosensitive polyimide ink is applied and dried on the phosphor bronze metal plate 111A, thereby forming the insulating layer 112A on the metal plate 111A.

Figure 14B:
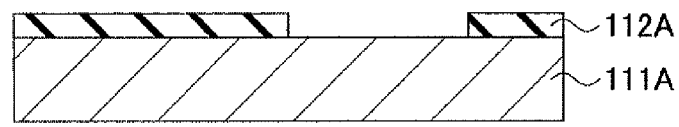

Next, as illustrated in FIG. 14B, the insulating layer 112A is exposed and developed using a photomask (not graphically illustrated).

Figure 14C:
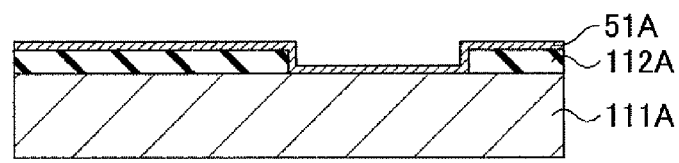

Next, as illustrated in FIG. 14C, a Ni—W film 51A is deposited (stacked) on the structure of FIG. 14B by sputtering.

Figure 14D:
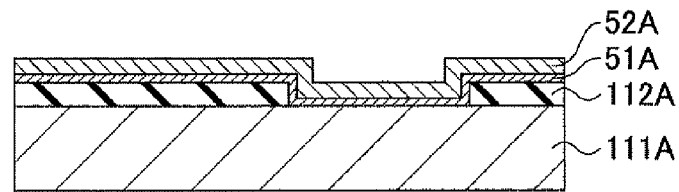

Next, as illustrated in FIG. 14D, a Cu film 52A is deposited (stacked) on the Ni—W film 51A by electroplating.

Figure 14E:
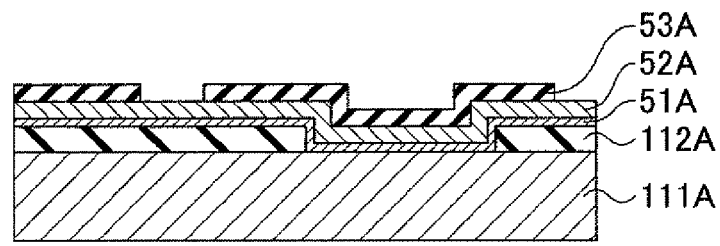

Next, as illustrated in FIG. 14E, a photoresist pattern 53A is formed on the Cu film 52A.

Figure 14F:
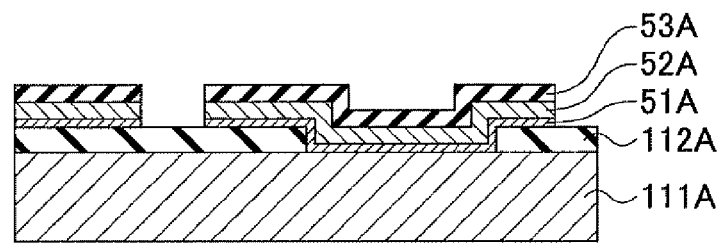

Next, as illustrated in FIG. 14F, the Cu film 52A and the Ni—W film 51A are etched using the photoresist pattern 53A.

Figure 14G:
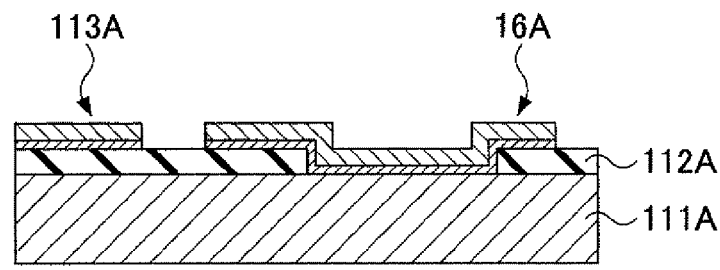

Next, as illustrated in FIG. 14G, the photoresist pattern 53A is removed, so that the interconnection patterns 113A and pad electrodes 16A are formed of the Cu film 52A.

As described above, the wiring board 11A of this embodiment has a three-layer structure of the insulating layer 112A and the interconnection patterns 113A successively stacked on the metal plate 111A. Alternatively, the wiring board 11A may have a two-layer structure of the interconnection patterns 113A of Cu or the like stacked on the insulating layer 112A of an insulating film of polyimide or the like. In the case of the two-layer structure, a ground plate may be provided between adjacent wiring boards 11A to reduce crosstalk. Further, the wiring board 11A may be either rigid or flexible.

As illustrated in FIG. 13, the wiring board 11A includes four contact groups 150A, four pad electrode groups 160A, and the four interconnection patterns 113A each formed of a signal interconnect pair 142A. The four contact groups 150A are aligned in the Z1-Z2 directions. The four pad electrode groups 160A are aligned in the Y1-Y2 directions. The wiring board 11A further includes ground interconnects 148A.

Each signal interconnect pair 142A includes a first signal interconnect 144A and a second signal interconnect 146A for transmitting positive and negative signals, respectively, having complementary waveforms in axial symmetry. Although not graphically illustrated, a ground interconnect may be provided between adjacent signal interconnect pairs 142A in order to reduce crosstalk.

Each contact group 150A includes a signal contact pair 152A and a ground contact 158A. The signal contact pair 152A includes a first signal contact 154A and a second signal interconnect 156A for transmitting positive and negative signals, respectively, having complementary waveforms in axial symmetry. In the description of this embodiment, the first and second signal contacts 154A and 156A and the ground contacts 158A may be collectively referred to as "contacts 15A" (FIG. 9) in the case of not distinguishing them in particular.

The contacts 15A have a bifurcated fork shape and are integrated with the wiring board 11A into a unitary structure. Alternatively, the contacts 15A may also be formed as components separate from the wiring board 11A. In this case, the contacts 15A may be fixed to the wiring board 11A by insert molding or soldering.

The ends of the contacts 15A are bent into a V-letter shape so as to project in a direction (the X2 direction) perpendicular to the directions (Y1-Y2 directions) in which the contacts 15A extend, so that the ends of the contacts 15A deform elastically when pressed in the X1 direction. The restoration force to restore their original shapes before this elastic deformation ensures the connection of the jack-side contacts 15A and the plug-side contacts of the plug connector 2A. This ensures the electrical connection of the jack connector 3A and the plug connector 2A.

The first and second signal interconnects 144A and 146A of each signal interconnect pair 142A have their respective first (Y1) ends bifurcating to extend to the X2-side surfaces of the first and second signal contacts 154A and 156A, respectively, of the corresponding signal contact pair 152A.

As illustrated in FIG. 13, the ground contacts 158A alternate with the signal contact pairs 152A so as to reduce crosstalk between adjacent signal contact pairs 152A. The ground interconnects 148A have their respective first (Y1) ends bifurcating to extend to the X2-side surfaces of the corresponding ground contacts 158A. The ground interconnects 148A have their respective second (Y2) ends electrically connected to the metal plate 111A via corresponding through holes 114A formed through the insulating layer 112A.

Each pad electrode group 160A includes a signal pad electrode pair 162A and a ground pad electrode 168A. The signal pad electrode pair 162A includes a first signal pad electrode 164A and a second signal pad electrode 166A for transmitting positive and negative signals, respectively, having complementary waveforms in axial symmetry. In the description of this embodiment, the first and second signal pad electrodes 164A and 166A and the ground pad electrodes 168A may be collectively referred to as "pad electrodes 16A" (FIG. 9) in the case of not distinguishing them in particular.

The first and second signal pad electrodes 164A and 166A are connected to second (Z2) ends of the corresponding first and second signal interconnects 144A and 146A, respectively. Thus, the first and second signal interconnects 144A and 146A connect the corresponding first and second signal contacts 154A and 156A and the corresponding first and second signal pad electrodes 164A and 166A.

Figure 15:
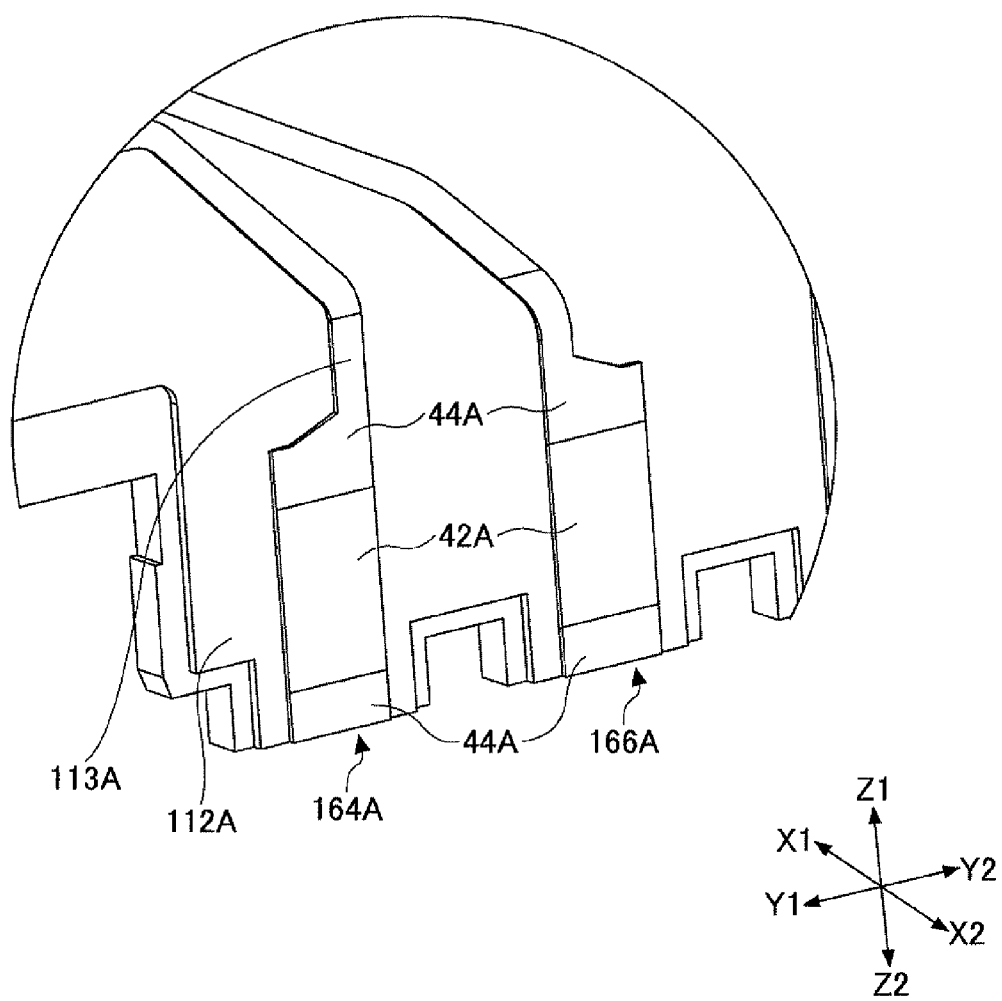
FIG. 15 is an enlarged perspective view of part of the wiring board, illustrating a configuration of each of first and second signal pad electrodes according to the first embodiment of the present invention.

FIG. 15 is an enlarged perspective view of part of the wiring board 11A, illustrating a configuration of each of the first and second signal pad electrodes 164A and 166A.

For example, the first and second signal pad electrodes 164A and 166A have a rectangular shape as illustrated in FIG. 15. Each of the first and second signal pad electrodes 164A and 166A includes a first region 42A to come into contact with the corresponding conductive layer 17A; and a pair of second regions 44A, one on each side of the first region 42A in the directions (Z1-Z2 directions) in which the leads 12A extend so that the first region 42A is sandwiched between the second regions 44A. The second regions 44A are lower in wettability with respect to the liquid melt of the conductive layer 17A than the first region 42A. That is, each of the first and second signal pad electrodes 164A and 166A includes a low wettability region (the second region 44A), a high wettability region (the first region 42A), and a low wettability region (the second region 44A) in this order in the Z2 direction from the Z1 side.

The wiring board 11A has the insulating layer 112A on both lateral sides (Y1 and Y2 sides) of the pad electrodes 16A. The insulating layer 112A serves as a third region having low wettability with respect to the liquid melt (molten solder) of the conductive layers 17A compared with the pad electrodes 16A.

The conductive layers 17A may be formed of, for example, solder such as lead-free solder. In this case, the first regions 42A may be formed of a metal having high solder wettability, while the second regions 44A may be formed of a metal having low solder wettability, resin, or an oxide coating. Any appropriate method may be employed to form such regions different in wettability. Such a method uses, for example, photolithography and etching. FIGS. 16A through 16D, FIGS. 17A through 17C, FIGS. 18A and 18B, and FIGS. 19A through 19D are diagrams illustrating first through fourth methods, respectively, of forming regions different in wettability according to this embodiment.

[First Method]

Figure 16A:
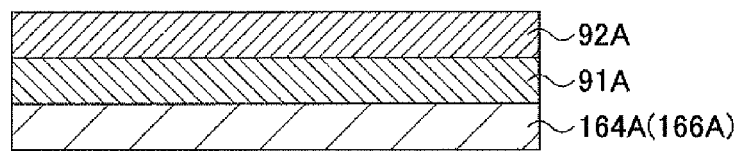
FIGS. 16A through 16D are diagrams illustrating a first method of forming regions different in wettability according to the first embodiment of the present invention.

In the case illustrated in FIGS. 16A through 16D, first, as illustrated in FIG. 16A, a Ni layer 91A and a Au layer 92A are successively deposited on the first and second Cu signal pad electrodes 164A and 166A (16A) formed in FIG. 14G by electroplating.

Figure 16B:
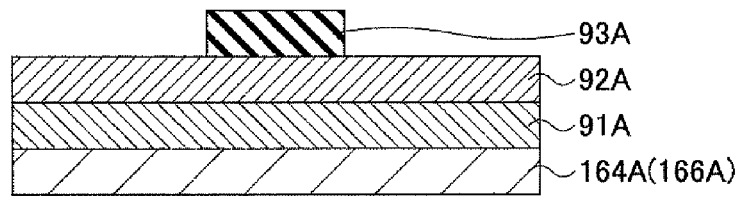

Next, as illustrated in FIG. 16B, a photoresist pattern 93A is formed on the Au layer 92A.

Figure 16C:
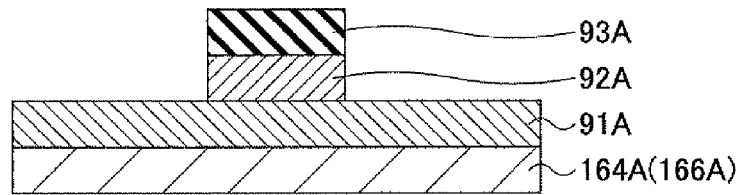

Next, as illustrated in FIG. 16C, the Au layer 92A is etched using the photoresist pattern 93A.

Figure 16D:
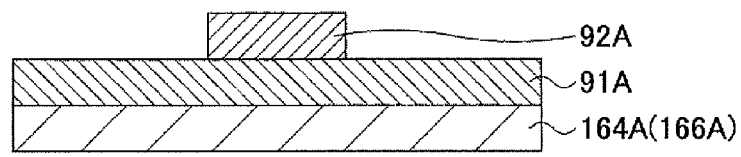

Next, as illustrated in FIG. 16D, the photoresist pattern 93A is removed.

As a result, the Au layer 92A is deposited (stacked) on part of the Ni layer 91A. The Ni layer 91A is lower in solder wettability than the Au layer 92A. Accordingly, it is possible to form regions different in solder wettability.

[Second Method]

Figure 17A:
FIGS. 17A through 17C are diagrams illustrating a second method of forming regions different in wettability according to the first embodiment of the present invention.
Figure 17B:
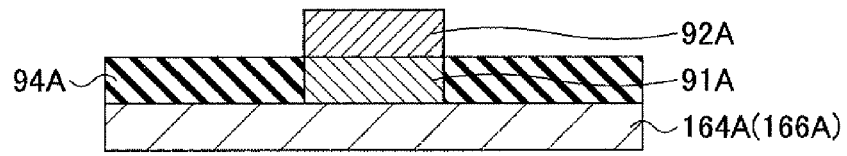
Figure 17C:
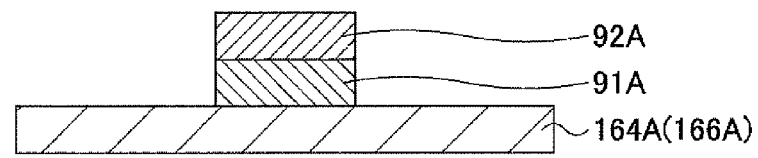

In the case illustrated in FIGS. 17A through 17C, first, as illustrated in FIG. 17A, a photoresist pattern 94A is formed on the first and second Cu signal pad electrodes 164A and 166A (16A) formed in FIG. 14G.

Next, as illustrated in FIG. 17B, a Ni layer 91A and a Au layer 92A are successively deposited on the parts of the first and second signal pad electrodes 164A and 166A exposed outside by electroplating.

Next, as illustrated in FIG. 17C, the photoresist pattern 94A is removed.

As a result, the Au layer 92A is deposited (stacked) on parts of the first and second Cu signal pad electrodes 164A and 166A. The first and second Cu signal pad electrodes 164A and 166A are lower in solder wettability than the Au layer 92A. Accordingly, it is possible to form regions different in solder wettability.

[Third Method]

Figure 18A:
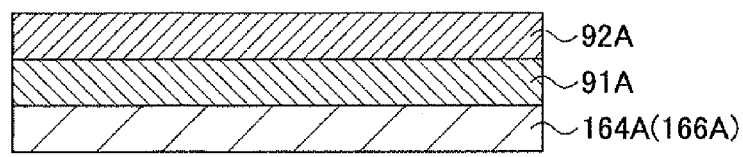
FIGS. 18A and 18B are diagrams illustrating a third method of forming regions different in wettability according to the first embodiment of the present invention.
Figure 18B:
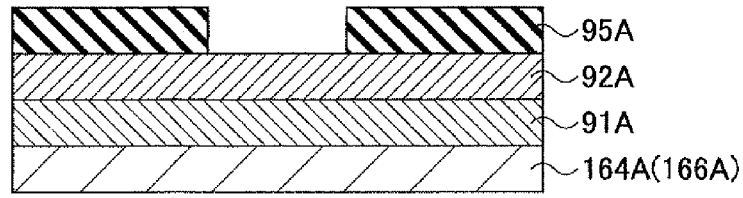

In the case illustrated in FIGS. 18A and 18B, first, as illustrated in FIG. 18A, a Ni layer 91A and a Au layer 92A are successively deposited on the first and second Cu signal pad electrodes 164A and 166A (16A) formed in FIG. 14G by electroplating.

Next, as illustrated in FIG. 18B, solder resist is applied and dried on part of the Au layer 92A, so that an epoxy resin layer 95A is formed.

As a result, the epoxy resin layer 95A is stacked on part of the Au layer 92A. The epoxy resin layer 95A is lower in solder wettability than the Au layer 92A. Accordingly, it is possible to form regions different in solder wettability. Instead of forming the epoxy resin layer 95A using solder resist, a polyimide resin layer may be formed using polyimide ink.

[Fourth Method]

Figure 19A:
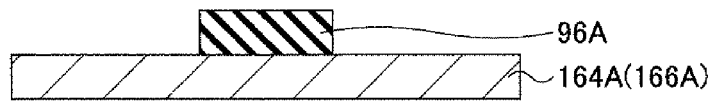
FIGS. 19A through 19D are diagrams illustrating a fourth method of forming regions different in wettability according to the first embodiment of the present invention.

In the case illustrated in FIGS. 19A through 19D, first, as illustrated in FIG. 19A, a photoresist pattern 96A is formed on the first and second Cu signal pad electrodes 164A and 166A (16A) formed in FIG. 14G.

Figure 19B:
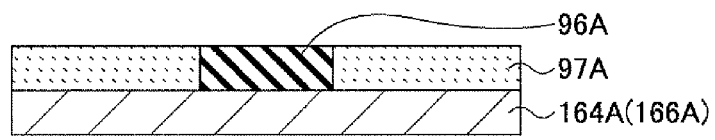

Next, as illustrated in FIG. 19B, a Cu oxide coating 97A is formed on the parts of the first and second Cu signal pad electrodes 164A and 166A exposed outside by heat treatment.

Figure 19C:
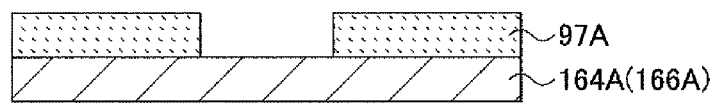

Next, as illustrated in FIG. 19C, the photoresist pattern 96A is removed.

Figure 19D:
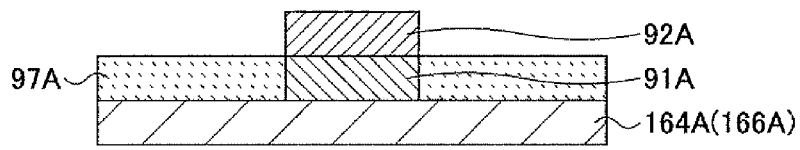

Next, as illustrated in FIG. 19D, a Ni layer 91A and a Au layer 92A are successively deposited on the parts of the first and second signal pad electrodes 164A and 166A exposed outside by electroplating.

As a result, both of the Cu oxide coating 97A and the Au layer 92A are exposed outside. The Cu oxide coating 97A is lower in solder wettability than the Au layer 92A. Accordingly, it is possible to form regions different in solder wettability.

As illustrated in FIGS. 16A through 16D, FIGS. 17A through 17C, FIGS. 18A and 18B, and FIGS. 19A through 19D, the methods of forming regions different in wettability may stack an upper layer on the entire region of a lower layer different in wettability from the upper layer and expose the lower layer by etching part of the stacked upper layer; or stack an upper layer on part of a lower layer different in wettability from the upper layer. The lower layer/upper layer relationship may be either a high wettability layer/low wettability layer or a low wettability layer/high wettability layer. Further, regions different in wettability may also be formed by forming two layers different in wettability on different regions on a substrate.

The ground pad electrodes 168A are electrically connected to the backside metal plate 111A via corresponding through holes 115A (FIG. 13) formed through the insulating layer 112A. The ground pad electrodes 168A alternate with the signal pad electrode pairs 162A so as to reduce crosstalk between adjacent signal pad electrode pairs 162A.

Referring to FIG. 13, the wiring board 11A may further include a pair of projecting parts 182A. The projecting parts 182A are provided separately from the leads 12A so as to project toward the daughterboard 5A from the wiring board 11A to be attached to the daughterboard 5A. For example, the projecting parts 182A are provided so as to have the leads 12 interposed between them as illustrated in FIG. 13.

The projecting parts 182A have, for example, an L-letter shape, and are formed integrally with the wiring board 11A by processing the metal plate 111A. Alternatively, the projecting parts 182A may be formed as components separate from the wiring board 11A. In this case, the projecting parts 182A may be connected to the wiring board 11A by insert molding or press-fitting.

For example, the projecting parts 182A are mounted on the surface of the daughterboard 5A by soldering at the time of connecting the leads 12A to the daughterboard 5A, so as to reinforce the mechanical connection of the wiring board 11A and the daughterboard 5A. Therefore, even when an external stress such as vibration or impact is applied to the jack connector 3A or the daughterboard 5A, the movements of the wiring boards 11A and the daughterboard 5A relative to each other are limited or prevented, so that the deformation of the leads 12A connecting the wiring boards 11A and the daughterboard 5A is controlled. As a result, transmission of the external stress to the connections of the leads 12A and the daughterboard 5A is controlled, so that the degradation of the connections, such as occurrence of peeling or a crack in a soldering part (for example, an adhesive agent 19A in FIG. 25A), is controlled, thus resulting in increased durability against the external stress.

The projecting parts 182A may be larger in cross section than the leads 12A. This makes it possible to reinforce the mechanical connection of the wiring boards 11A and the daughterboard 5A and thus increase durability against the external stress more effectively.

Referring to FIG. 9 and FIG. 10 as well as FIG. 13, each module 10A includes multiple signal lead pairs 122A each including a first signal lead 124A and a second signal lead 126A. Further, each module 10A (wiring board 11A) includes multiple ground leads 128A. The first and second signal leads 124A and 126A and the ground leads 128A are configured to connect the wiring boards 11A electrically to the daughterboard 5A, and extend in the Z1-Z2 directions. The first and second signal leads 124A and 126A are configured to transmit positive and negative signals, respectively, having complementary waveforms in axial symmetry. On the other hand, the ground leads 128A alternate with the signal lead pairs 122A so as to reduce crosstalk between adjacent signal lead pairs 122A. In the description of this embodiment, the first and second signal leads 124A and 126A and the ground leads 128A may be collectively referred to as "leads 12A" (FIG. 9) in the case of not distinguishing them in particular.

The ground leads 128A are directly connected to the wiring boards 11A without intervention of the conductive layers 17A. For example, as illustrated in FIG. 13, the ground leads 128A have a linear shape, and are formed integrally with the wiring board 11A by processing the metal plate 111A. The ground leads 128A may be formed as components separate from the wiring board 11A. In this case, the ground leads 128A may have, for example, an L-letter shape, and have their first (base) ends press-fit into corresponding through holes of the wiring board 11A and have their second (free) ends projecting toward the daughterboard 5 from the wiring board 11A.

Figure 24A:
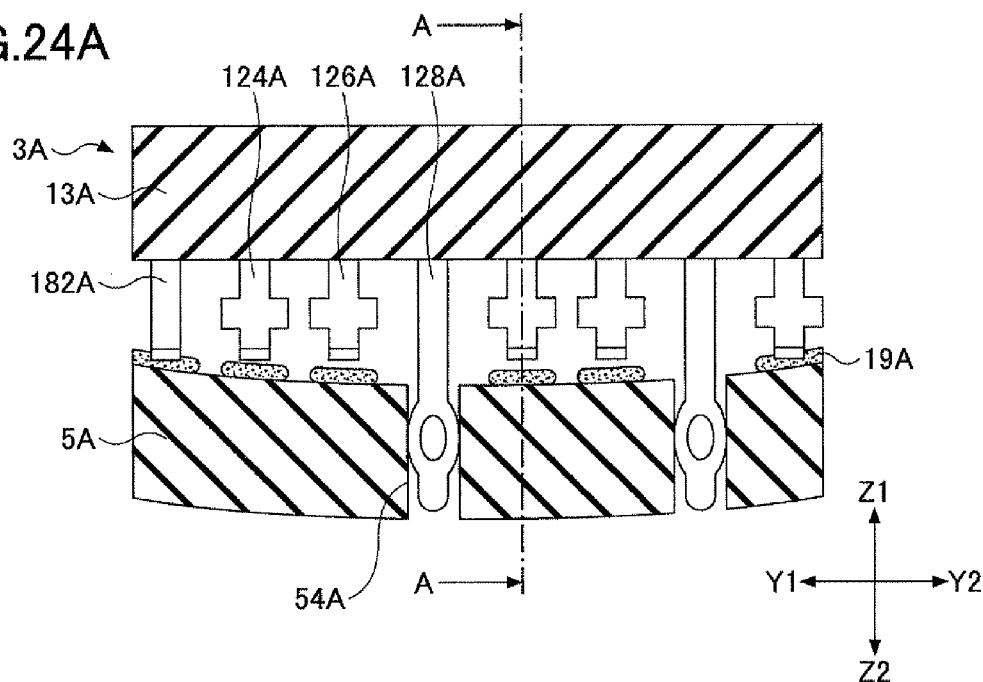
FIGS. 24A and 24B are cross-sectional views illustrating placement of the jack connector on a daughterboard according to the first embodiment of the present invention.
Figure 25A:
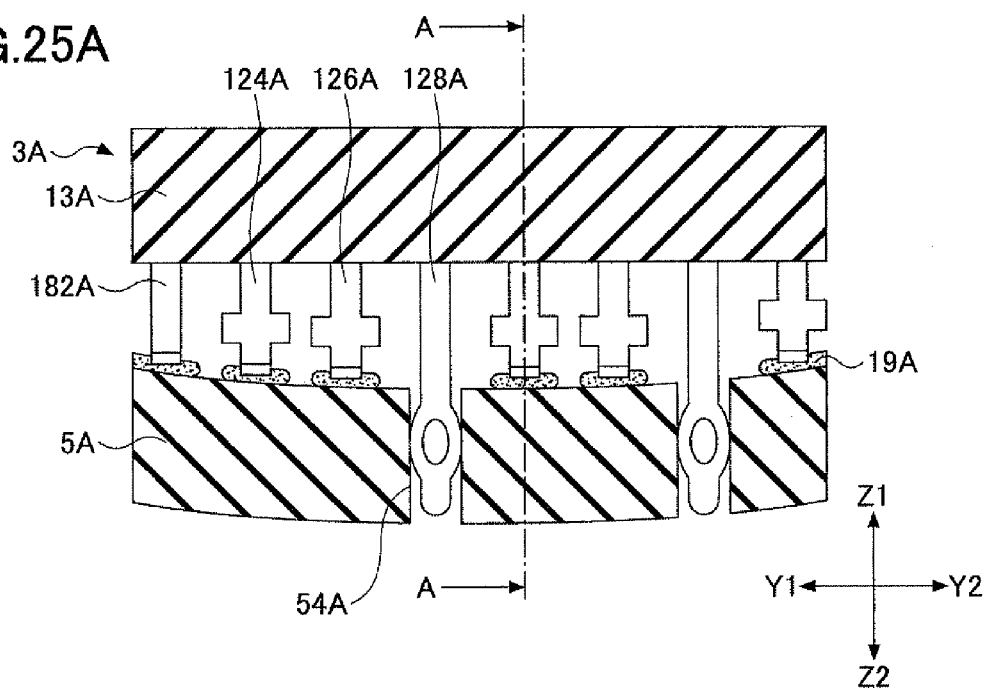
FIGS. 25A and 25B are cross-sectional views after heating the structure of FIGS. 24A and 24B, illustrating a mounting structure of the jack connector according to the first embodiment of the present invention.

Further, the ground leads 128A are configured to be press-fit into corresponding through holes 54A (FIG. 24A and FIG. 25A) of the daughterboard 5A, and have a so-called "press-fit pin" shape. The ground leads 128A are press-fit into the corresponding through holes 54A of the daughterboard 5A to reinforce the mechanical connection of the wiring boards 11A and the daughterboard 5A (FIG. 24A and FIG. 25A).

If the ground leads 128A had a conventional L-letter shape and were mounted on the surface of the daughterboard 5A, an external force would be applied to the connections of the ground leads 128A and the daughterboard 5A on application of an external force to the jack connector 3A or the daughterboard 5A, so that the connections would be likely to degrade.

On the other hand, the ground leads 128A are press-fit into the through holes 54A of the daughterboard 5A. Therefore, when an external force is applied to the jack connector 3A or the daughterboard 5A, a restoration force to restore the original shapes of the press-fit parts of the ground leads 128A and the through holes 54A before elastic deformation is generated. Accordingly, compared with the conventional case, it is possible to reinforce the mechanical connection of the wiring boards 11A and the daughterboard 5A. Therefore, even when an external stress such as vibration or impact is applied to the jack connector 3A or the daughterboard 5A, the movements of the wiring boards 11A and the daughterboard 5A relative to each other are limited or prevented, so that the deformation of the leads 12A connecting the wiring boards 11A and the daughterboard 5A is controlled. As a result, transmission of the external stress to the connections of the leads 12A and the daughterboard 5A is controlled, so that the degradation of the connections, such as occurrence of peeling or a crack in a soldering part (for example, the adhesive agent 19A in FIG. 25A), is controlled, thus resulting in increased durability against the external stress.

The ground leads 128A according to this embodiment are press-fit into the through holes 54A of the daughterboard 5A. Accordingly, compared with the case of surface-mounting, it is possible to perform positioning with respect to the daughterboard 5A.

The ground leads 128A may be larger in cross section than the first and second signal leads 124A and 126A. This makes it possible to reinforce the mechanical connection of the wiring boards 11A and the daughterboard 5A and thus increase durability against the external stress.

On the other hand, the first and second signal leads 124A and 126A are connected to the first and second signal pad electrodes 164A and 166A (FIG. 13 and FIG. 15), respectively, through the corresponding conductive layers 17A (FIG. 9) provided between them.

Figure 20A:
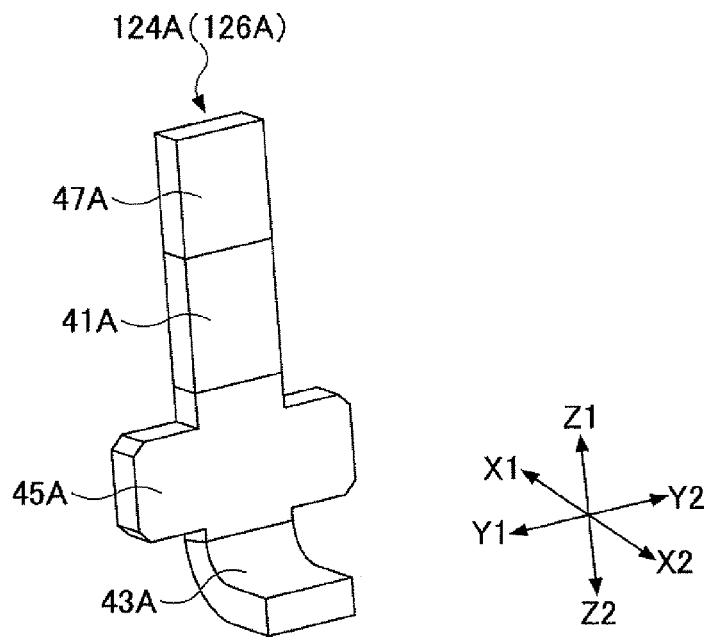
FIGS. 20A and 20B are perspective views of a first signal lead (a second signal lead) according to the first embodiment of the present invention.
Figure 20B:
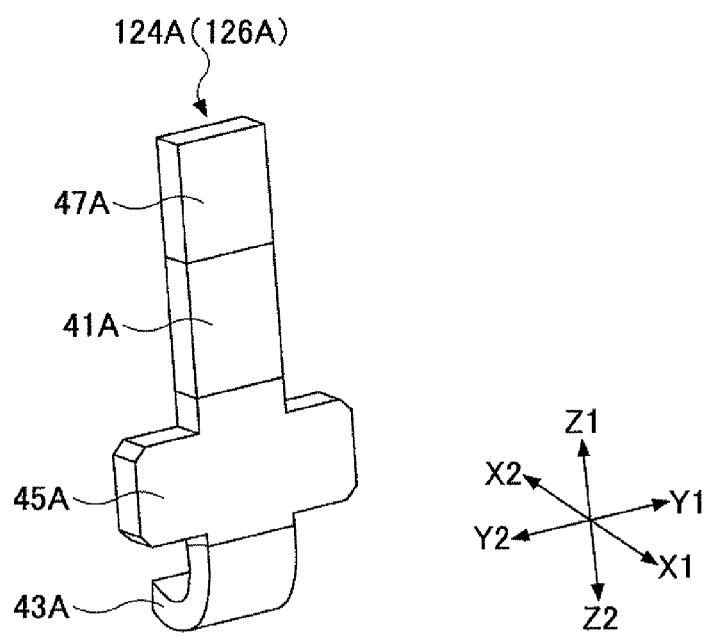

FIGS. 20A and 20B are perspective views of the first signal lead 124A (the second signal lead 126A). FIG. 20A illustrates the X2-side face of the first signal lead 124A (the second signal lead 126A) and FIG. 20B illustrates the X1-side face of the first signal lead 124A (the second signal lead 126A). The first and second signal leads 124A and 126A are formed by bending a metal plate of phosphor bronze or a Fe-42Ni alloy into an L-letter shape and processing it.

Each of the first and second signal leads 124A and 126A includes a first region 41A to come into contact with the corresponding conductive layer 17A; and a second region 45A on the daughterboard 5A side (Z2 side) of the first region 41A. The second region 45A is lower in wettability with respect to the liquid melt of the conductive layer 17A than the first region 41A.

Each of the first and second signal leads 124A and 126A may further include a third region 47A across the first region 41A from the second region 45A. The third region 47A is lower in wettability with respect to the liquid melt of the conductive layer 17A than the first region 41A.

Each of the first and second signal leads 124A and 126A may further include a fourth region 43A to come into contact with the adhesive agent 19A (FIG. 24A and FIG. 25A) on the daughterboard 5A side (Z2 side) of the second region 45A. The adhesive agent 19A adheres (bonds) the first and second signal leads 124A and 126A to the daughterboard 5A. The fourth region 43A is higher in wettability with respect to the liquid melt of the adhesive agent 19A than the second region 45A. In other words, the second region 45A is lower in wettability with respect to the liquid melt of the adhesive agent 19A than the fourth region 43A.

Accordingly, in the case illustrated in FIGS. 20A and 20B, each of the first and second signal leads 124A and 126A includes a low wettability region (the third region 47A), a high wettability region (the first region 41A), a low wettability region (the second region 45A), and a high wettability region (the fourth region 43A) in this order in the Z2 direction from the Z1 side.

As illustrated in FIGS. 20A and 20B, each of the first, second, third, and fourth regions 41A, 45A, 47A, and 43A may be provided on each of the X1, X2, Y1, and Y2 sides of the first and second signal leads 124A and 126A so as to define their peripheral surfaces.

The conductive layers 17A (FIG. 9) may be formed of, for example, solder. In this case, referring to FIGS. 20A and 20B, the first region 41A and the fourth region 43A are formed of a metal having high solder wettability, while the second region 45A and the third region 47A are formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A. For example, the method illustrated in FIGS. 16A through 16D, FIGS. 17A through 17C, FIGS. 18A and 18B, or FIGS. 19A through 19D may be employed.

Figure 21:
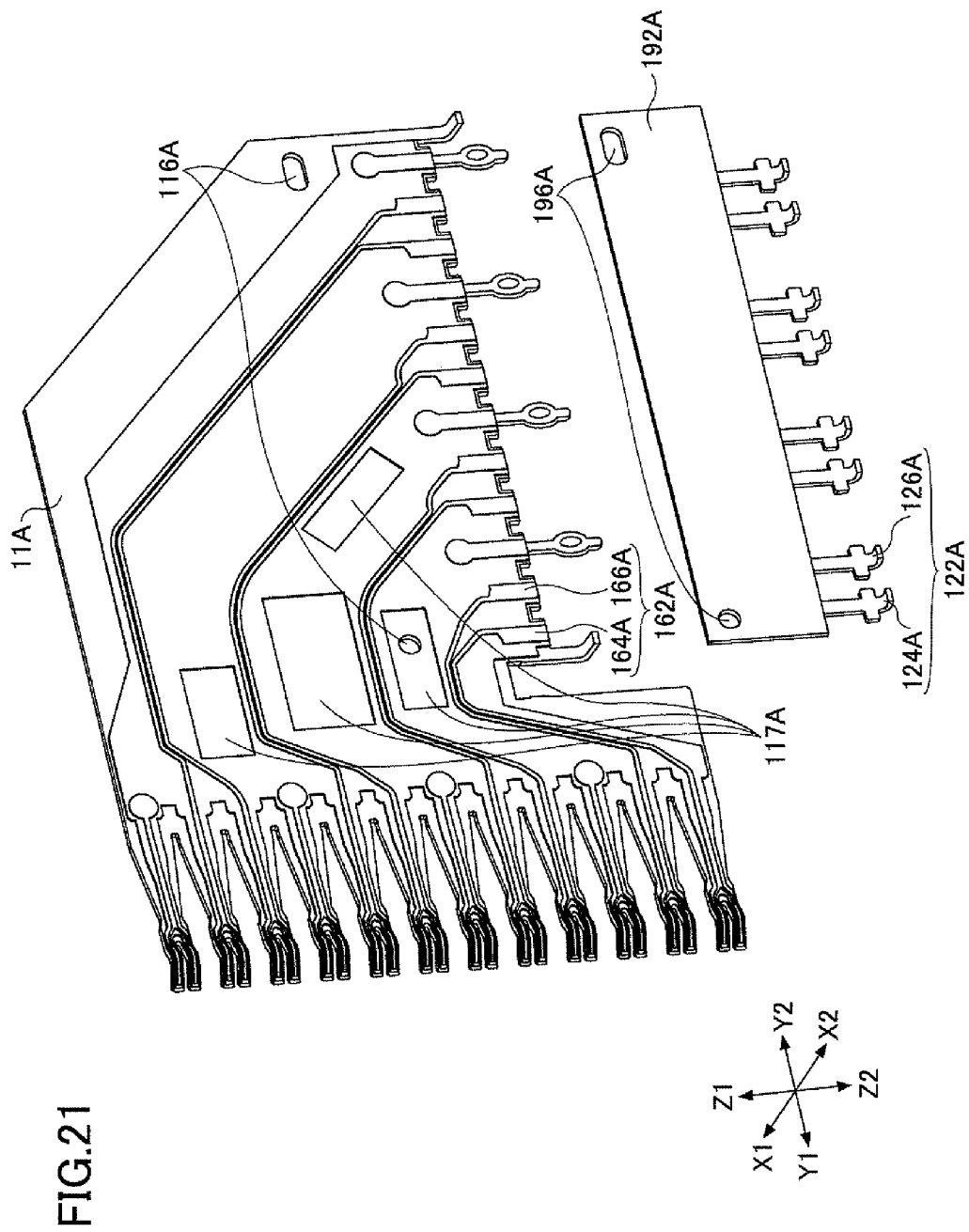
FIG. 21 is a perspective view of the wiring board, illustrating a method of joining (connecting) signal lead pairs and signal pad electrode pairs according to the first embodiment of the present invention.

FIG. 21 is a perspective view of the wiring board 11A, illustrating a method of joining (connecting) the signal lead pairs 122A and the signal pad electrode pairs 162A.

Referring to FIG. 21, the signal lead pairs 122A are held at predetermined intervals by an end plate 192A. The signal lead pairs 122A and the end plate 192A are formed as a unitary structure by processing a metal plate of phosphor bronze or a Fe-42Ni alloy into a comb shape by blanking. The end plate 192A includes a pair of through holes 196A corresponding to a pair of through holes 116A provided in the wiring board 11A.

According to the joining method illustrated in FIG. 21, first, a solder paste (not graphically illustrated) such as a Sn—Bi alloy having a melting point of approximately 140° C. is applied on the first and second signal pad electrodes 164A and 166A. The area of application of the solder paste may correspond to the first regions 42A (FIG. 15) of the first and second signal pad electrodes 164A and 166A and the first regions 41A (FIGS. 20A and 20B) of the corresponding first and second signal leads 124A and 126A. In this case, it is ensured that the solder paste melted by below-described heat treatment spreads over and wets both of the first regions 42A and the first regions 41A while contracting in volume to crush air gaps inside the solder paste. Further, in this case, the molten solder paste moves from the second regions 44A and 45A of lower solder wettability to the first regions 42A and 41A, respectively, of higher solder wettability.

After application of the solder paste, pins (not graphically illustrated) are inserted through the through holes 116A and the through holes 196A after aligning the through holes 116A and the through holes 196A. Thereby, the signal pad electrode pairs 162A and the corresponding signal lead pairs 122A are aligned.

Next, the solder paste is melted by heat treatment and then solidified to form the conductive layers (solder layers) 17A. As a result, the first and second signal leads 124A and 126A are connected to the corresponding first and second signal pad electrodes 164A and 166A through the conductive layers 17A. Then, the pins are removed and the end plate 192A is broken off.

Figure 22:
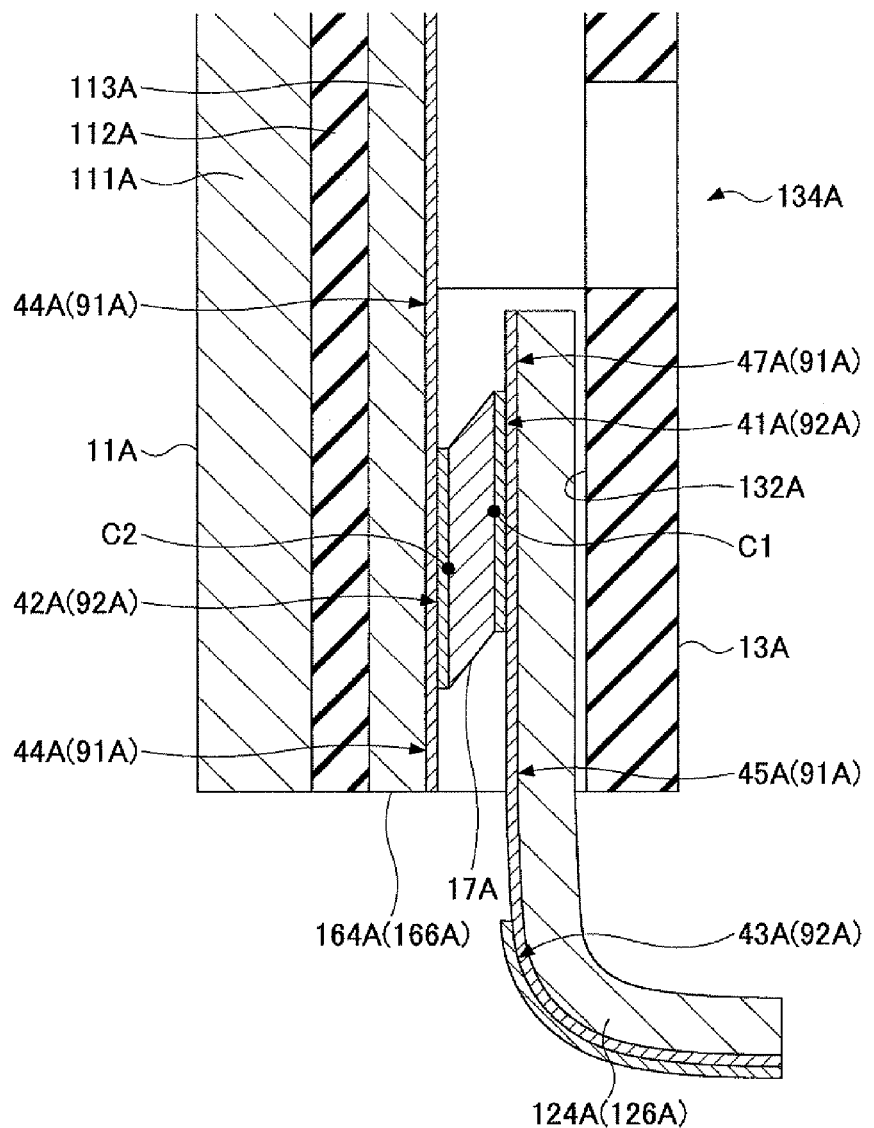
FIG. 22 is a cross-sectional view of part of the module, illustrating the positional relationship between the first signal lead (the second signal lead) and the first signal pad electrode (the second signal pad electrode) according to the first embodiment of the present invention.

FIG. 22 is a cross-sectional view of part of the module 10A, illustrating the positional relationship between the first signal lead 124A (the second signal lead 126A) and the first signal pad electrode 164A (the second signal pad electrode 166A).

The spacer 13A is fixed to the wiring board 11A. The spacer 13A has multiple guide grooves 132A on its surface (X1-side surface) facing the wiring board 11A. The first and second signal leads 124A and 126A are movable inside the corresponding guide grooves 132A when the conductive layers (solder layers) 17A melt.

FIGS. 23A and 23B are X2-side and X1-side perspective views, respectively, of the spacer 13A.

The spacer (guide part) 13A is configured to guide the first and second signal leads 124A and 126A in the directions (Z1-Z2 directions) in which the leads 124A and 126A extend when the conductive layers (solder layers) 17A melt. The spacer 13A includes the multiple guide grooves 132A, multiple window parts 134A, and multiple projecting parts 136A.

The guide grooves 132A are provided along the directions (the Z1-Z2 directions) in which the corresponding first and second signal leads 124A and 126A extend. The first and second signal leads 124A and 126A are movable inside the corresponding guide grooves 132A when the conductive layers (solder layers) 17A melt.

The window parts 134A are formed near the guide grooves 132A. This allows the conductive layers (solder layers) 17A to be heated from both ends (Z1 and Z2 ends) of the guide grooves 132A. This ensures that the conductive layers (solder layers) 17A are melted by heat treatment.

The projecting parts 136A correspond to multiple recess parts 117A (FIG. 21) provided on the wiring board 11A. The projecting parts 136A are fit into the corresponding recess parts 117A, so that the spacer 13A and the wiring board 11A are connected. This allows the guide grooves 132A and the first and second signal pad electrodes 164A and 166A to be aligned with accuracy.

Referring back to FIG. 22, the center C1 of the first region 41A of the first signal lead 124A (the second signal lead 126A) is offset in a direction away from the daughterboard 5A (in the Z1 direction) relative to the center C2 of the first region 42A of the corresponding first signal pad electrode 164A (the corresponding second signal pad electrode 166A). That is, the conductive layer (solder layer) 17A is formed to have its contact surface with the first signal lead 124A (the second signal lead 126A) offset in a direction away from the daughterboard 5A (in the Z1 direction) relative to its contact surface with the wiring board 11A (the signal pad electrode 164A or 166A). Accordingly, the conductive layer (solder layer) 17 has a substantially parallelogram-shaped cross section along the X-Z plane as illustrated in FIG. 22, for example.

Reheating the conductive layer (solder layer) 17A in this state causes the conductive layer 17A to melt to take a shape reduced in surface area (that is, a shape having a rectangular cross section) because of its surface tension.

If the second region 45A and the third region 47A of lower solder wettability were not present or formed to have the first region 41A to come into surface contact with the conductive layer 17A interposed between them, the molten conductive layer 17A would move on the first signal lead 124A (the second signal lead 126A) in the Z1-Z2 directions to reduce its surface area. Further, if the second regions 44A of lower solder wettability were not present or formed to have the first region 42A to come into surface contact with the conductive layer 17A interposed between them, the molten conductive layer 17A would move on the wiring board 11A (the first signal pad electrode 164A or second signal pad electrode 166A) in the Z1-Z2 directions to reduce its surface area.

According to this embodiment, the second region 45A and the third region 47A are provided to have the first region 41A to come into surface contact with the conductive layer 17A sandwiched between them, and the second regions 44A are provided to have the first region 42A to come into surface contact with the conductive layer 17A sandwiched between them. This prevents the molten conductive layer (solder layer) 17A from moving on the first signal lead 124A (the second signal lead 126A) or the wiring board 11A (the first signal pad electrode 164A or second signal pad electrode 166A) in the Z1-Z2 directions. Accordingly, the molten conductive layer (solder layer) 17A causes the first signal lead 124A (the second signal lead 126A) to move in a direction to approach the daughterboard 5A relative to the wiring board 11A in order to reduce the surface area of the conductive layer 17A. This makes it possible to urge the first signal lead 124A (the second signal lead 126A) toward the daughterboard 5A and ensure the connection of the first signal lead 124A (the second signal lead 126A) to the daughterboard 5A when the conductive layer 17A melts.

Further, according to this embodiment, the second region 45A of lower solder wettability is between the first region 41A to come into surface contact with the conductive layer (solder layer) 17A and the fourth region 43A to come into surface contact with the daughterboard 5A. Accordingly, the molten conductive layer 17A is prevented from moving on the first signal lead 124A (the second signal lead 126A) in the Z2 direction and coming into contact with the daughterboard 5A. This makes it possible to prevent the molten conductive layer 17A from adversely affecting the joining of the first signal lead 124A (the second signal lead 126A) and the daughterboard 5A.

Further, according to this embodiment, as illustrated in FIG. 15, the insulating layer 112A (third region) of low solder wettability is present on both lateral sides (Y1 and Y2 sides) of the first region 42A to come into surface contact with the conductive layer (solder layer) 17A. This prevents the molten conductive layer 17A from moving on the wiring board 11A in the Y1-Y2 directions. As a result, it is possible to prevent adjacent pad electrodes 16A from being electrically connected.

Figure 24B:
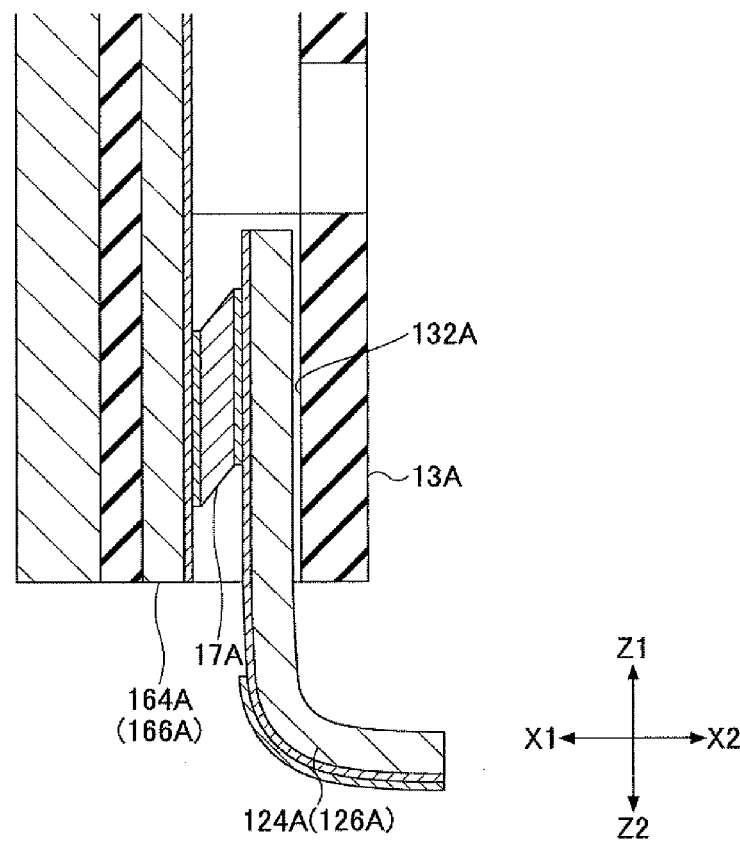

FIGS. 24A and 24B are a front-side cross-sectional view and a cross-sectional view taken along one-dot chain line A-A of FIG. 24A, respectively, of part of the jack connector 3A and the daughterboard 5A, illustrating placement of the jack connector 3A on the daughterboard 5A. In FIG. 24B, the adhesive agent 19A and the daughterboard 5A are omitted for convenience of graphical representation.

The adhesive agent 19A for adhering (bonding) the first and second signal leads 124A and 126A to the daughterboard 5A is provided on the daughterboard 5A. The adhesive agent 19A may be a solder paste higher in melting point than the conductive layers (solder layer) 17A. Examples of the adhesive agent 19A include a Sn—Ag—Cu alloy having a melting point of 220° C. In the case illustrated in FIGS. 24A and 24B, there is a gap between some of the first and second signal leads 124A and 126A and the adhesive agent (solder paste) 19A due to the (surface) warpage of the daughterboard 5A.

Figure 25B:
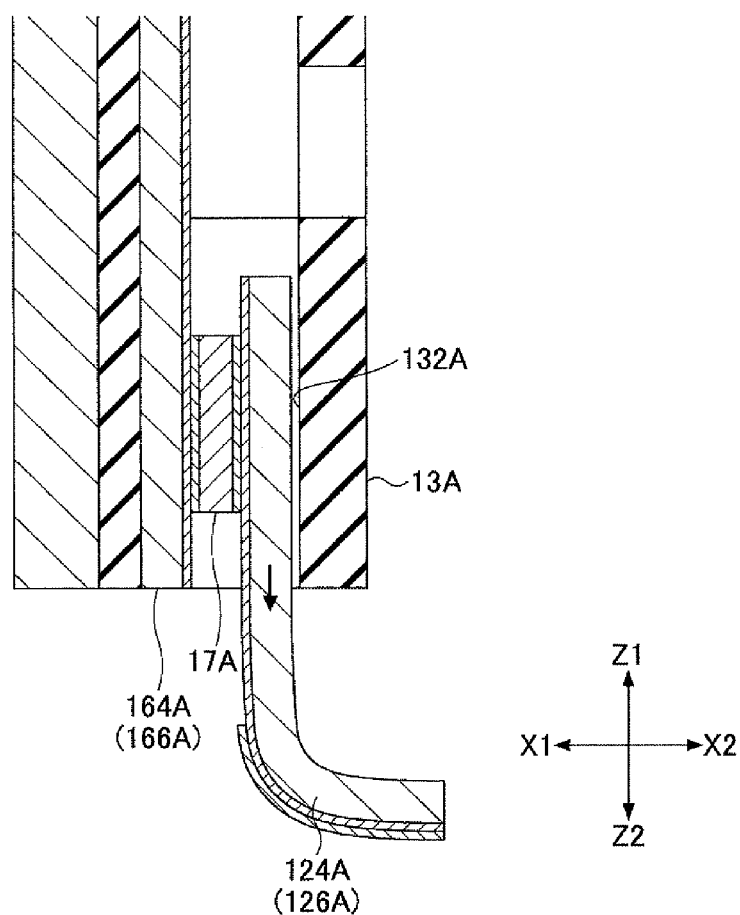

FIGS. 25A and 25B are a front-side cross-sectional view and a cross-sectional view taken along one-dot chain line A-A of FIG. 25A, respectively, of part of the jack connector 3A and the daughterboard 5A after heating the structure of FIGS. 24A and 24B, illustrating a mounting structure of the jack connector 3A. In FIG. 25B, the adhesive agent 19A and the daughterboard 5A are omitted for convenience of graphical representation.

When the adhesive agent (solder paste) 19A is caused to melt by application of heat, the conductive layers (solder layers) 17A melt to allow the first and second signal leads 124A and 126A to move inside the corresponding guide grooves 132A. In this state, the surface tension of the molten conductive layers 17A causes the first and second signal leads 124A and 126A to be pushed out of the corresponding guide grooves 132A in the Z2 direction so as to absorb the (surface) warpage of the daughterboard 5A. As a result, even in the case where the positional relationship between the wiring boards 11A and the daughterboard 5A is maintained by reinforcement by such members as the ground leads 128A, it is possible to ensure the connection of the first and second signal leads 124A and 126A to the daughterboard 5A after the heat treatment, so that it is possible to increase the reliability of the electrical and mechanical connections of the first and second signal leads 124A and 126A to the daughterboard 5A.

Further, according to the above-described configuration, the second region 45A of lower solder wettability is formed between the first region 41A to come into contact with the conductive layer 17A and the fourth region 43A to come into contact with the adhesive agent (solder paste) 19A. Accordingly, it is possible to prevent the interdiffusion of the liquid melt of the conductive layer 17A and the liquid melt of the adhesive agent 19A by separating the liquid melts from each other. This makes it possible to maintain the compositions of the conductive layer 17A and the adhesive agent 19A and thus to obtain a target or desired joining strength and durability after heat treatment, so that it is possible to increase the reliability of the mechanical connection of the first and second signal leads 124A and 126A and the daughterboard 5A.

Next, a description is given of a configuration of the plug connector 2A.

Figure 26:
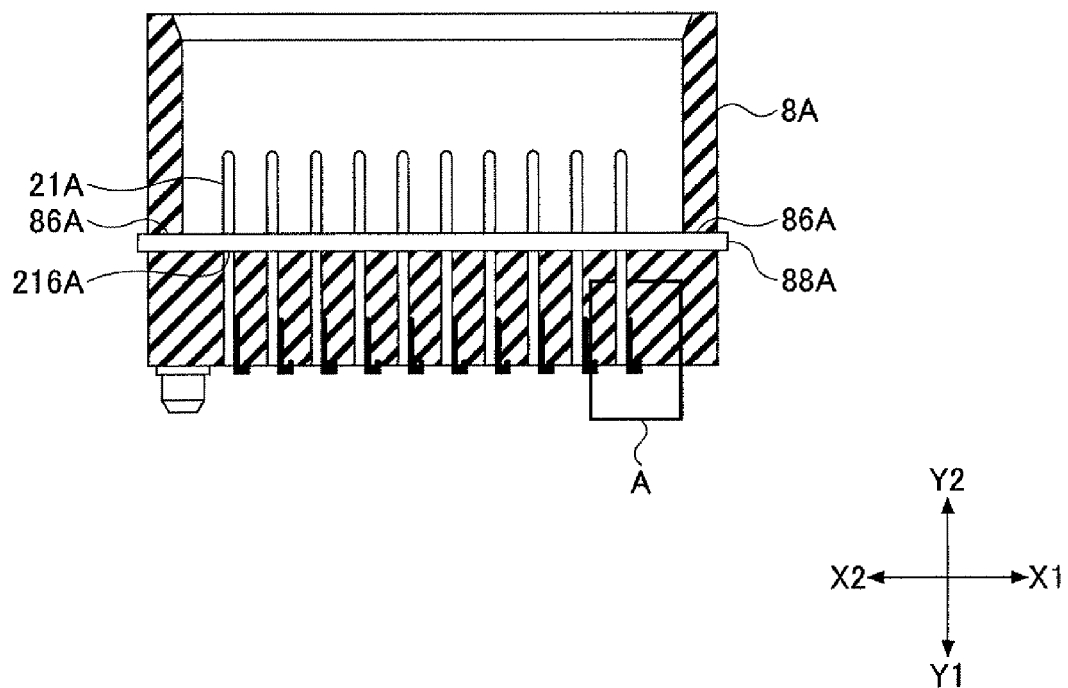
FIG. 26 is a schematic cross-sectional view of a plug connector of the differential transmission connector unit according to the first embodiment of the present invention.
Figure 27:
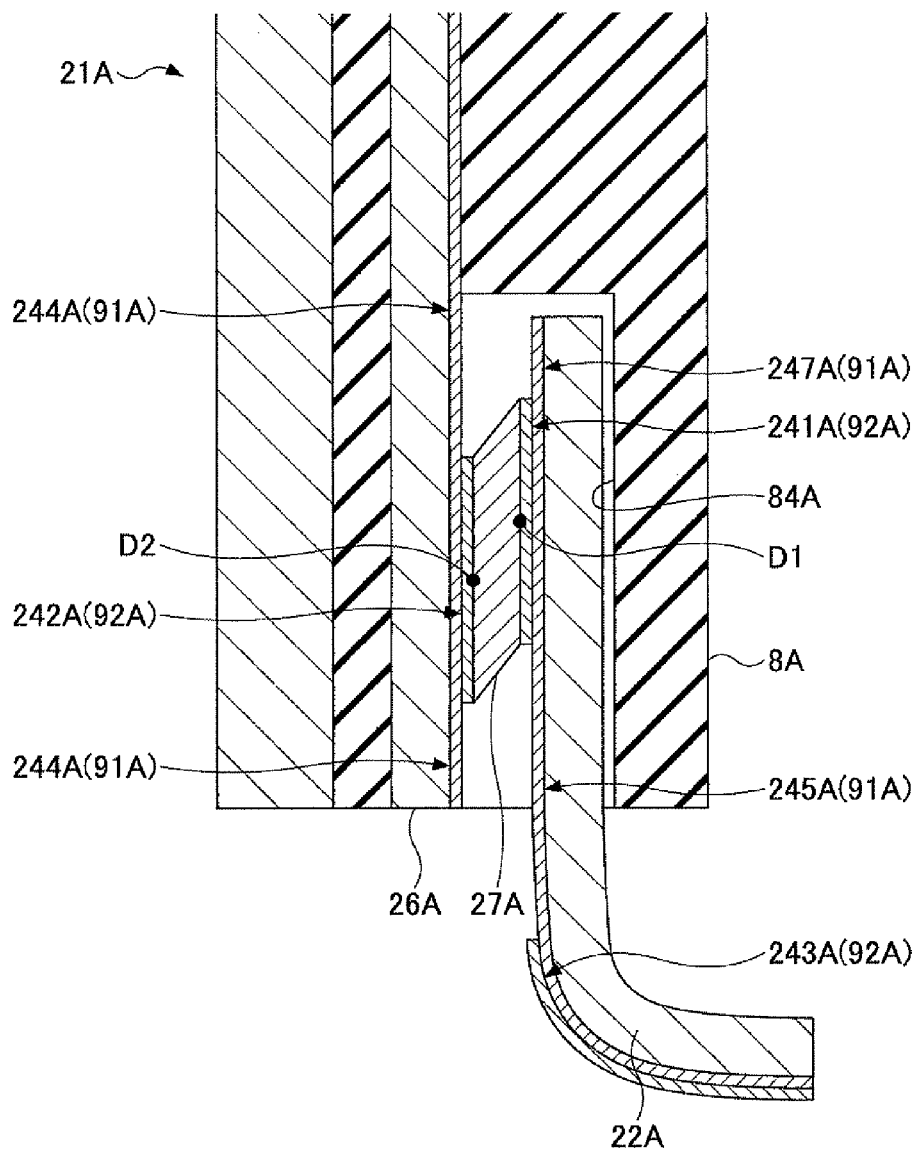
FIG. 27 is an enlarged view of a region indicated by box A in FIG. 26 according to the first embodiment of the present invention.
Figure 28:
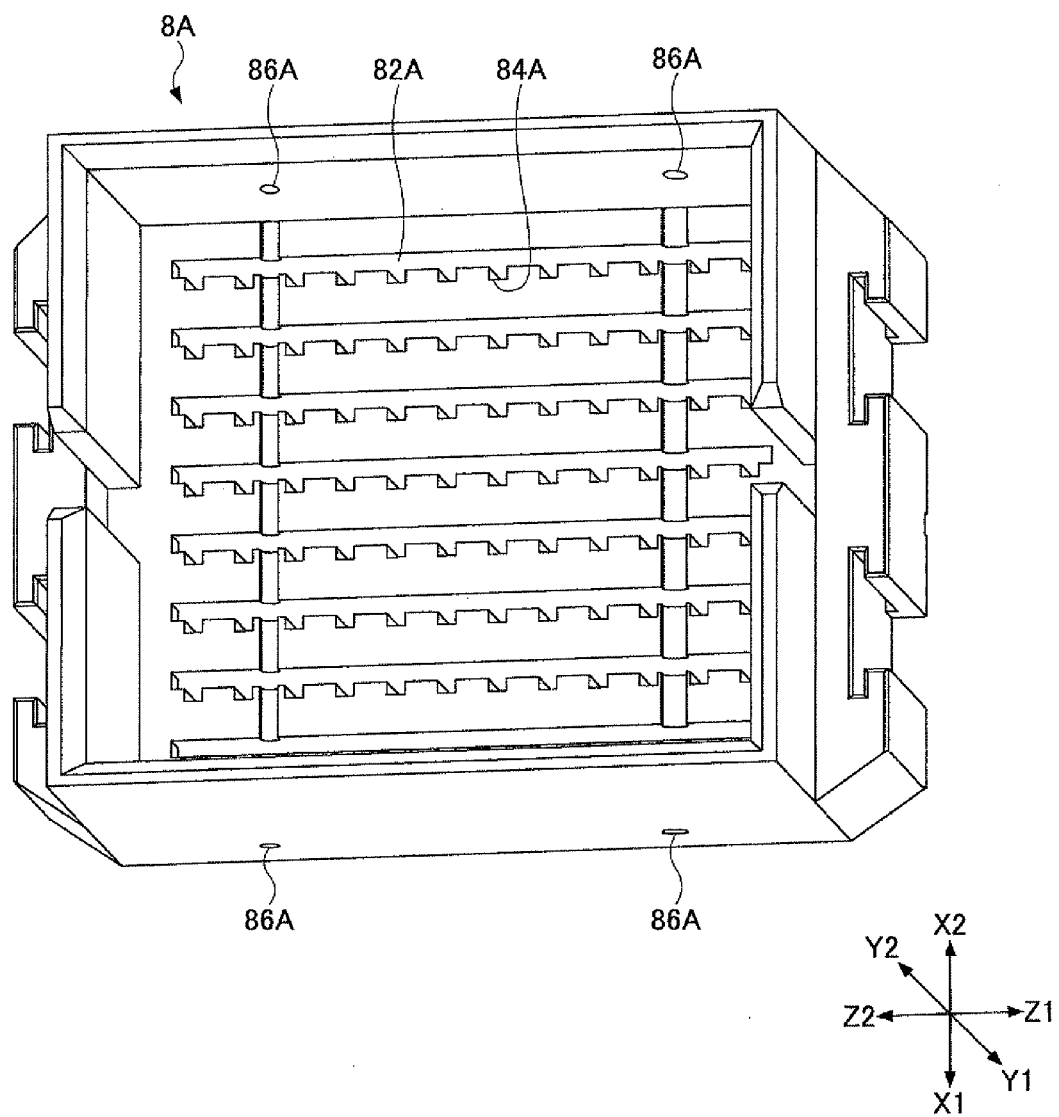
FIG. 28 is a perspective view of an insulative housing of the plug connector according to the first embodiment of the present invention.

FIG. 26 is a schematic cross-sectional view of the plug connector 2A. FIG. 27 is an enlarged view of a region indicated by box A in FIG. 26. FIG. 28 is a perspective view of the insulative housing 8A of the plug connector 2A.

The plug connector 2A includes the insulative housing 8A, wiring boards 21A having multiple pad electrodes 26A, multiple leads 22A, and conductive layers 27A provided between the pad electrodes 26A and the leads 22A.

The insulative housing 8A is configured to be fit to the first insulative housing 6A of the jack connector 3A. Multiple plug-side contacts (not graphically illustrated) are arranged in rows (the X1-X2 directions) and columns (the Z1-Z2 directions) inside the insulative housing 8A. The first insulative housing 6A is fit into the insulative housing 8A so that the plug-side contacts are inserted into the first insulative housing 6A through the corresponding openings 62A to be connected to the corresponding jack-side contacts 15A, thereby establishing an electrical connection between the jack connector 3A and the plug connector 2A (FIG. 8 and FIG. 9).

Further, as illustrated in FIG. 26, the insulative housing 8A supports the wiring boards 21A parallel to each other. For example, the insulative housing 8A includes multiple slits 82A as illustrated in FIG. 28. The slits 82A are aligned in the X1-X2 directions. The wiring boards 21A are incorporated into the corresponding slits 82A on a one-to-one basis. Thus, the insulative housing 8A has the function of the second insulative housing 7A in the jack connector 3A.

Further, as illustrated in FIG. 27 and FIG. 28, the insulative housing 8A includes multiple guide grooves 84A extending in the directions (Y1-Y2 directions) in which the leads 22A extend. The leads 22A are fixed to the corresponding pad electrodes 26A through the corresponding conductive layers 27A, and are movable inside the corresponding guide grooves 84A when the conductive layers 27A melt. Thus, the insulative housing 8A also has the function of the spacer (guide part) 13A in the jack connector 3A.

The insulative housing 8A further includes through holes 86A. As illustrated in FIG. 28, the through holes 86A formed through the X1 side of the insulative housing 8A and the through holes 86A formed through the X2 side of the insulative housing 8A are aligned in the X1-X2 directions. On the other hand, each wiring board 21A includes a pair of through holes 216A (FIG. 26) corresponding to the through holes 86A. When the wiring boards 21A are incorporated into the insulative housing 8A and rod members 88A are inserted through the through holes 86A and the through holes 216A and attached to the wiring boards 21A at the through holes 86A and the through holes 216A, the wiring boards 21A are connected to the insulative housing 8A.

The insulative housing 8A further includes fixation metal parts 81A (FIG. 8). For example, the fixation metal parts 81A are formed by bending a metal plate into an L-letter shape. The fixation metal parts 81A have their respective first ends press-fit into and fixed to the insulative housing 8A. The fixation metal parts 81A have their respective second ends mounted on the surface of the backplane (external board) 4A by, for example, soldering when the leads 22A are connected to the backplane 4A. Thus, the insulative housing 8A is attached to the backplane 4A through the fixation metal parts 81A.

Accordingly, the mechanical connection of the wiring boards 21A and the backplane 4A is reinforced by the insulative housing 8A and a connection mechanism formed of the through holes 86A, the through holes 216A, and the rod members 88A. Therefore, even when an external stress such as vibration or impact is applied to the plug connector 2A or the backplane 4A, the movements of the wiring boards 21A and the backplane 4A relative to each other are limited or prevented, so that the deformation of the leads 22A connecting the wiring boards 21A and the backplane 4A is controlled. As a result, transmission of the external stress to the connections of the leads 22A and the backplane 4A is controlled, so that the degradation of the connections, such as occurrence of peeling or a crack in a soldering part, is controlled, thus resulting in increased durability against the external stress.

As illustrated in FIG. 27, each of the pad electrodes 26A (including first and second signal pad electrodes and ground pad electrodes) includes a first region 242A to come into contact with the corresponding conductive layer 27A; and two second regions 244A one on each side of the first region 242A in the directions in which the leads 22A extend (the Y1-Y2 directions) so that the first region 242A is sandwiched between the second regions 244A. The second regions 244A are lower in wettability with respect to the liquid melt of the conductive layer 27A than the first region 242A. That is, each of the pad electrodes 26A includes a low wettability region (the second region 244A), a high wettability region (the first region 242A), and a low wettability region (the second region 244A) in this order in the Y1 direction from the Y2 side.

Each wiring board 21A has an insulating layer (not graphically illustrated) on both lateral sides (Z1 and Z2 sides) of the pad electrodes 26A. The insulating layer serves as a third region having low wettability with respect to the liquid melt (molten solder) of the conductive layers 27A compared with the pad electrodes 26A.

The conductive layers 27A may be formed of, for example, solder such as a Sn—Bi alloy having a melting point of approximately 140° C. In this case, the first regions 242A may be formed of a metal having high solder wettability, while the second regions 244A may be formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A. For example, the method illustrated in FIGS. 16A through 16D, FIGS. 17A through 17C, FIGS. 18A and 18B, or FIGS. 19A through 19D may be employed.

The leads 22A, which are for electrically connecting the wiring boards 21A to the backplane 4A, extend in the Y1-Y2 directions. The leads 22A are formed by bending a metal plate of phosphor bronze or a Fe-42Ni alloy into an L-letter shape and processing it.

Each of the leads 22 (including first and second signal leads and ground leads) has a first region 241A to come into contact with the corresponding conductive layer 27A; and a second region 245A on the backplane 4A side (Y1 side) of the first region 241A. The second region 245A is lower in wettability with respect to the liquid melt of the conductive layer 27A than the first region 241A.

Each of the leads 22A may further include a third region 247A across the first region 241A from the second region 245A. The third region 247A is lower in wettability with respect to the liquid melt of the conductive layer 27A than the first region 241A.

Each of the leads 22A may further include a fourth region 243A to come into contact with an adhesive agent (not graphically illustrated) for bonding the leads 22A to the backplane 4A on the backplane 4A side (Y1 side) of the second region 245A. The fourth region 243A is higher in wettability with respect to the liquid melt of the adhesive agent than the second region 245A. In other words, the second region 245A is lower in wettability with respect to the liquid melt of the adhesive agent than the fourth region 243A.

Accordingly, in the case illustrated in FIG. 27, the lead 22A includes a low wettability region (the third region 247A), a high wettability region (the first region 241A), a low wettability region (the second region 245A), and a high wettability region (the fourth region 243A) in this order in the Y1 direction from the Y2 side.

Each of the first, second, third, and fourth regions 241A, 245A, 247A, and 243A may be provided on each of the X1, X2, Z1, and Z2 sides of the leads 22A so as to define their peripheral surfaces.

Referring to FIG. 27, the conductive layer 27A may be formed of, for example, solder. In this case, the first region 241A and the fourth region 243A are formed of a metal having high solder wettability, while the second region 245A and the third region 247A are formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A. For example, the method illustrated in FIGS. 16A through 16D, FIGS. 17A through 17C, FIGS. 18A and 18B, or FIGS. 19A through 19D may be employed.

Referring to FIG. 27, the center D1 of the first region 241A of the lead 22A is offset in a direction away from the backplane 4A (in the Y2 direction) relative to the center D2 of the first region 242A of the corresponding signal pad electrode 26A. That is, the conductive layer (solder layer) 27A is formed to have its contact surface with the lead 22A offset in a direction away from the backplane 4A (in the Y2 direction) relative to its contact surface with the wiring board 21A (the pad electrode 26A). Accordingly, the conductive layer (solder layer) 27 has a substantially parallelogram-shaped cross section along the X-Y plane as illustrated in FIG. 27, for example.

Reheating the conductive layer (solder layer) 27A in this state causes the conductive layer 27A to melt to take a shape reduced in surface area (that is, a shape having a rectangular cross section) because of its surface tension.

If the second region 245A and the third region 247A of lower solder wettability were not present or formed to have the first region 241A to come into surface contact with the conductive layer 27A interposed therebetween, the molten conductive layer 27A would move on the lead 22A in the Y1-Y2 directions to reduce its surface area. Further, if the second regions 244A of lower solder wettability were not present or formed to have the first region 242A to come into surface contact with the conductive layer 27A interposed between them, the molten conductive layer 27A would move on the wiring board 21A (the pad electrode 26A) in the Y1-Y2 directions to reduce its surface area.

According to this embodiment, the second region 245A and the third region 247A are provided to have the first region 241A to come into surface contact with the conductive layer 27A sandwiched between them, and the second regions 244A are provided to have the first region 242A to come into surface contact with the conductive layer 27A sandwiched between them. This prevents the molten conductive layer (solder layer) 27A from moving on the lead 22A or the wiring board 21A (the pad electrode 26A) in the Y1-Y2 directions. Accordingly, the molten conductive layer (solder layer) 27A causes the lead 22A to move in a direction to approach the backplane 4A relative to the wiring board 21A in order to reduce the surface area of the conductive layer 27A. This makes it possible to urge the lead 22A toward the backplane 4A and ensure the connection of the lead 22A to the backplane 4A when the conductive layer 27A melts.

Further, according to this embodiment, the second region 245A of lower solder wettability is between the first region 241A to come into surface contact with the conductive layer (solder layer) 27A and the fourth region 243A to come into surface contact with the backplane 4A. Accordingly, the molten conductive layer 27A is prevented from moving on the lead 22A in the Y1 direction and coming into contact with the backplane 4A. This makes it possible to prevent the molten conductive layer 27A from adversely affecting the joining of the lead 22A and the backplane 4A.

Further, according to this embodiment, as described above, an insulating layer of low solder wettability (third region) (not graphically illustrated) is present on both lateral sides (Z1 and Z2 sides) of the first region 242A to come into surface contact with the conductive layer (solder layer) 27A. This prevents the molten conductive layer 27A from moving on the wiring board 21A in the Z1-Z2 directions. As a result, it is possible to prevent the molten conductive layer 27A from electrically connecting adjacent pad electrodes 26A.

The present invention is not limited to this embodiment, and variations and modifications may be made without departing from the scope of the present application.

For example, in this embodiment, the fixation metal parts 71A and 81A have L-letter shapes and are configured to be surface-mounted on the daughterboard 5A and the backplane 4A, respectively, as illustrated in FIG. 9 and FIG. 8, but the present invention is not limited to this configuration. For example, the fixation metal parts 71A may have a rod shape and be configured to be press-fit into corresponding through holes of the daughterboard 5A or to be inserted into corresponding through holes of the daughterboard 5A and soldered to the daughterboard 5A at the through holes.

Further, in this embodiment, the projecting parts 182A have an L-letter shape and are configured to be surface-mounted on the daughterboard 5A by soldering as illustrated in FIG. 13, but the present invention is not limited to this configuration. For example, the projecting parts 182A may have a rod shape and be configured to be press-fit into corresponding through holes of the daughterboard 5A or to be inserted into corresponding through holes of the daughterboard 5A and soldered to the daughterboard 5A at the through holes.

Further, according to this embodiment, the second insulative housing 7A has the projecting parts 78A and the wiring boards 11A has the recess parts 118A so that the second insulative housing 7A and the wiring boards 11A are connected with the projecting parts 78A fit into the corresponding recess parts 118A as illustrated in FIG. 10 through FIG. 12, but the present invention is not limited to this configuration. That is, the second insulative housing 7A may have recess parts and the wiring boards 11A have projecting parts so that the second insulative housing 7A and the wiring boards 11A are connected with the projecting parts fit into the corresponding recess parts.

Further, according to this embodiment, as illustrated in FIG. 10 through FIG. 13, the mechanical connection of the wiring boards 11A and the daughterboard 5A in the jack connector 3A may be reinforced with configurations or reinforcement members such as the second insulative housing and a connection mechanism formed of the projecting parts 78A and the recess parts 118A; the projecting parts 182A; and the ground leads 128A. However, the jack connector 3A is not limited to this configuration, and does not have to have all of such reinforcement members and may be provided with one of the above-described reinforcement members.

Further, according to this embodiment, the ground leads 128A are configured to be press-fit into the corresponding through holes 54A of the daughterboard 5A as illustrated in FIG. 24A and FIG. 25A, but the present invention is not limited to this configuration.

Figure 29A:
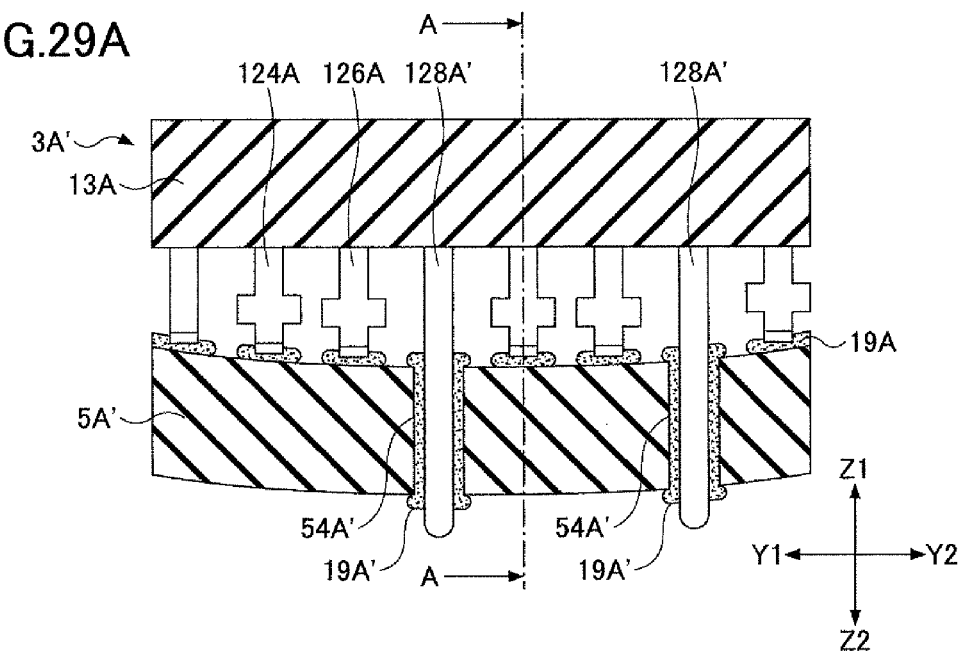
FIGS. 29A and 29B are cross-sectional views illustrating a first variation according to the first embodiment of the present invention.
Figure 29B:
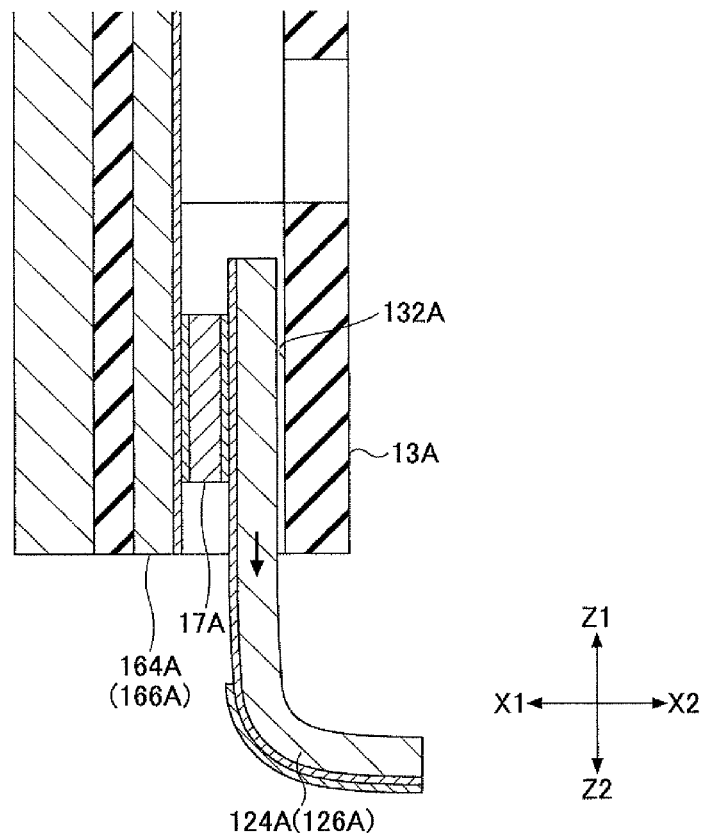

FIGS. 29A and 29B are a front-side cross-sectional view and a cross-sectional view taken along one-dot chain line A-A of FIG. 29A, respectively, of part of a jack connector 3A' and a daughterboard (external board) 5A' according to a first variation of this embodiment. In FIG. 29B, the adhesive agent 19A and the daughterboard 5A' are omitted for convenience of graphical representation.

By way of example, as illustrated in FIG. 29A, ground leads 128A' have a rod shape and are inserted into and soldered to corresponding through holes 54A' of the daughterboard 5A'. In this case, soldering parts 19A' form fillets on both sides (Z1 side and Z2 side) of the daughterboard 5A'. Therefore, compared with the case of surface mounting where the soldering parts 19A' would form fillets only on one side (Z1 side) of the daughterboard 5A', the mechanical connection of the wiring boards of the jack connector 3A' and the daughterboard 5A' is further reinforced. As a result, even when an external stress such as vibration or impact is applied to the jack connector 3A' or the daughterboard 5A', the movements of the wiring boards of the jack connector 3A' and the daughterboard 5A' relative to each other are limited or prevented, so that the deformation of the leads 12A connecting the wiring boards 11A and the daughterboard 5A' is controlled. As a result, transmission of the external stress to the connections of the leads 124A and 126A and the daughterboard 5A' is controlled, so that the degradation of the connections, such as occurrence of peeling or a crack in the soldering parts 19A', is controlled, thus resulting in further increased durability against the external stress.

Further, according to this embodiment, the plug connector 2A may be reinforced with configurations or reinforcement members such as the insulative housing 8A and a connection mechanism formed of the through holes 86A, the through holes 216A, and the rod members 88A. Alternatively, the plug connector 2A may replace the above-described reinforcement member with another configuration or reinforcement member or include another configuration or reinforcement member in addition to the above-described reinforcement member.

Further, according to this embodiment, the conductive layers 17A may be formed of solder. The conductive layers 17A are not limited to particular types of materials and may be formed of any material as long as the conductive layers 17A are meltable at the time of bonding the leads 12A to the daughterboard 5A. For example, the conductive layers 17A may be formed of a metal other than solder, such as In having a melting point of approximately 160° C. Further, the starting material of the conductive layers 17A may be in the form of either paste or foil.

Further, according to this embodiment, the conductive layers 17A have a lower melting point than the adhesive agent 19A for bonding the leads 12A to the daughterboard 5A. However, the conductive layers 17A have a higher melting point than the adhesive agent 19A as long as the conductive layers 17A are meltable at the time of bonding the leads 12A to the daughterboard 5A.

Further, according to this embodiment, solder is used for the adhesive agent 19A. However, the adhesive agent 19A is not limited to particular types. For example, an anisotropic conductive film (ACF) formed of a mixture of thermosetting resin and metal particulates, or a metal other than solder may be used for the adhesive agent 19A. The adhesive agent 19A may be in the form of either paste or foil.

Next, a description is given of a second variation according to this embodiment.

In this second variation, the same elements as those described above are referred to by the same reference numerals, and a description thereof is suitably omitted.

Figure 30:
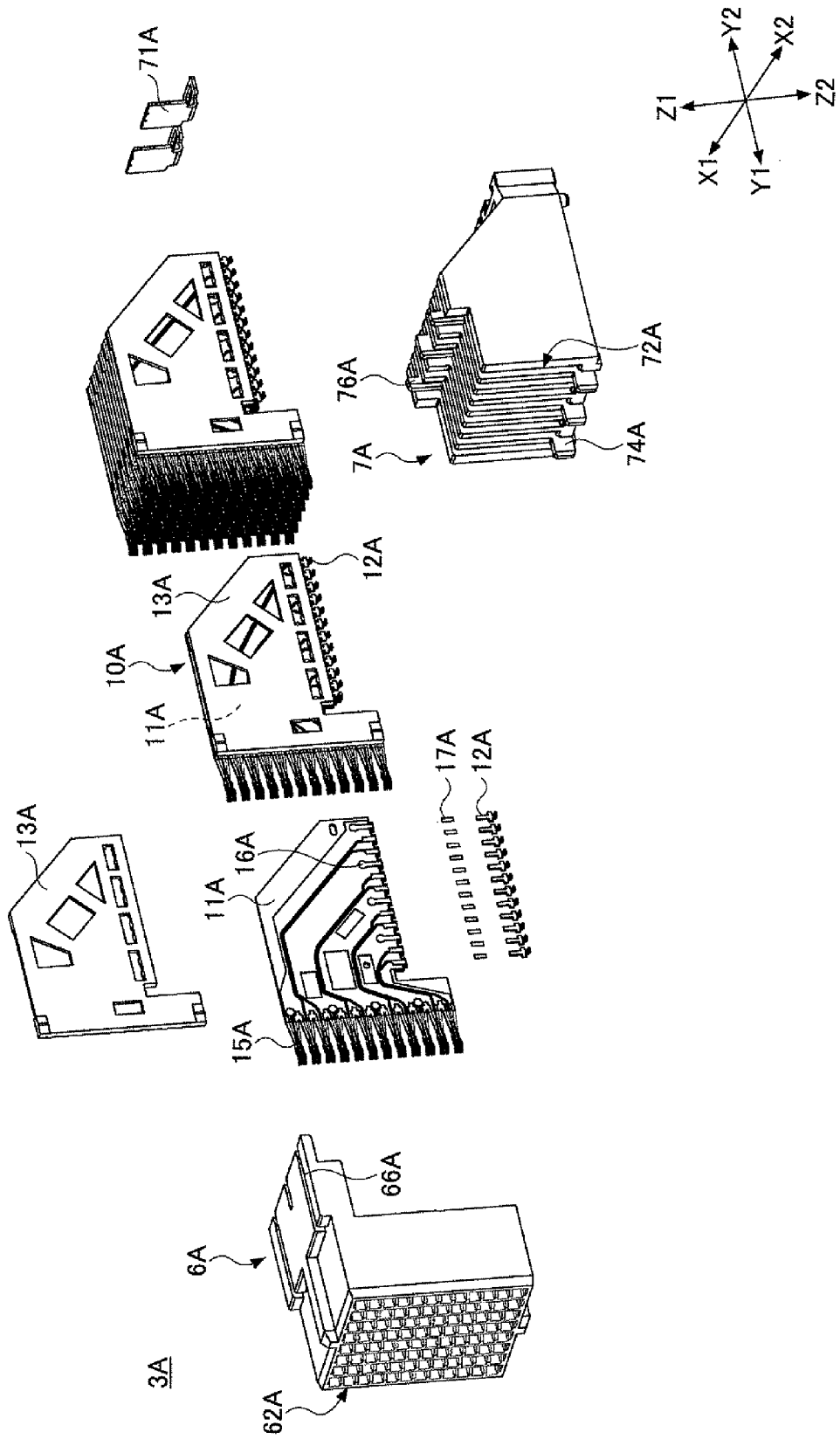
FIG. 30 is an exploded perspective view of the jack connector according to a second variation of the first embodiment of the present invention.

FIG. 30 is an exploded perspective view of the jack connector 3A according to the second variation.

Figure 31:
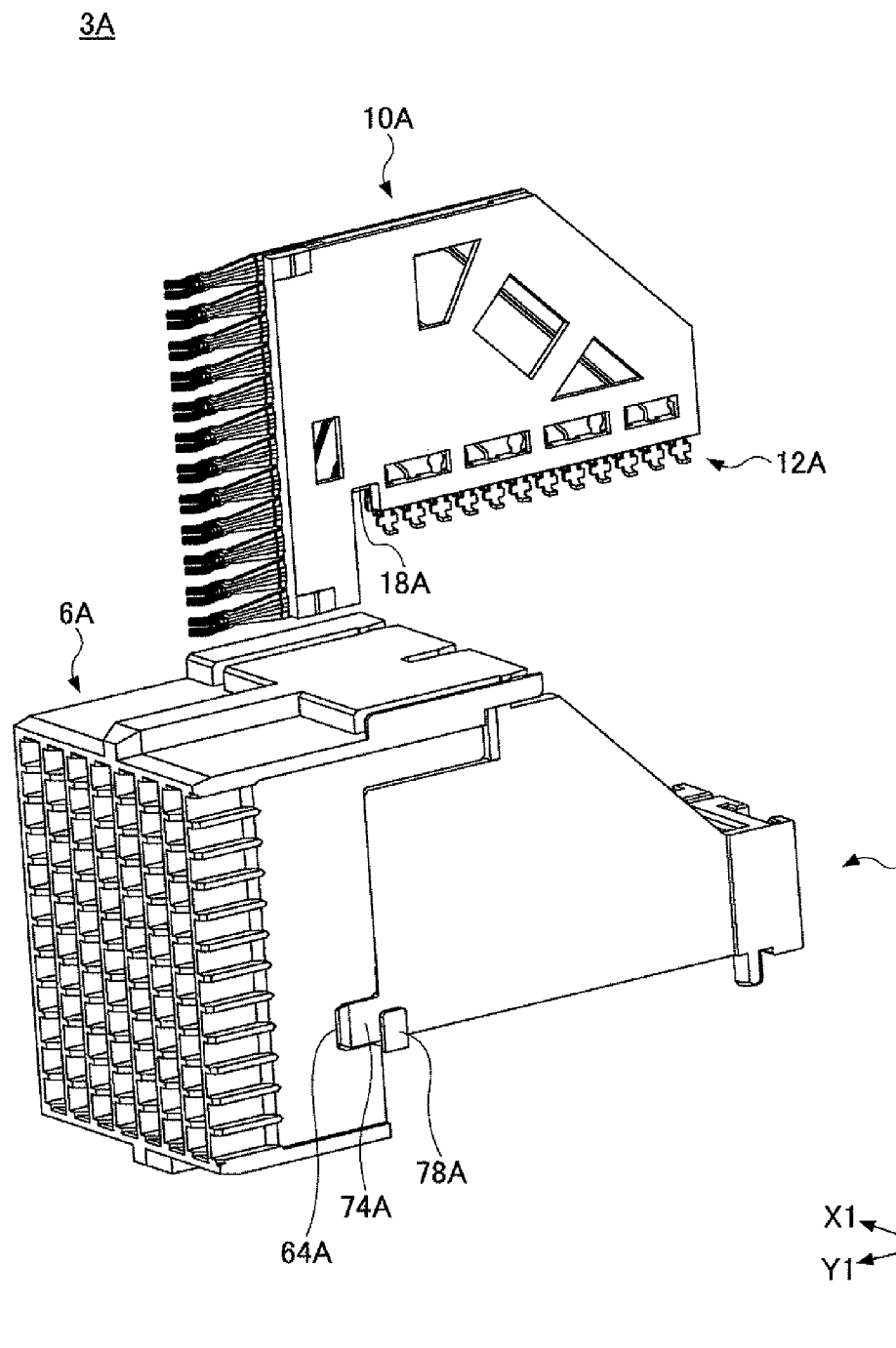
FIG. 31 is a cut-away view of the jack connector for illustrating the engagement relationship among the first insulative housing, the second insulative housing, and the modules thereof according to the second variation of the first embodiment of the present invention.

FIG. 31 is a cut-away view of the jack connector 3A for illustrating the engagement relationship among the first insulative housing 6A, the second insulative housing 7A, and the modules 10A thereof according to the second variation.

Figure 32:
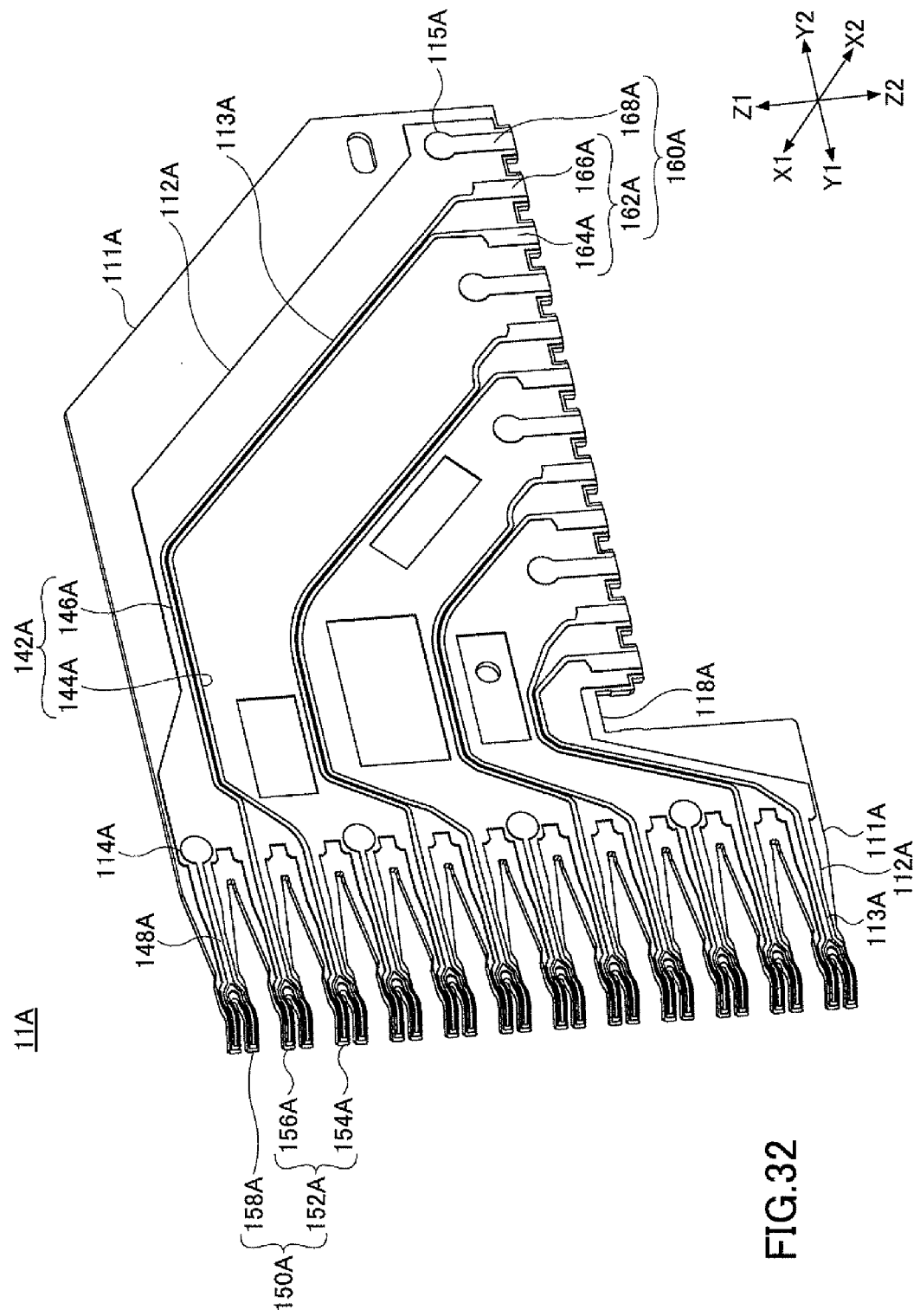
FIG. 32 is a perspective view of the wiring board, illustrating a configuration thereof according to the second variation of the first embodiment of the present invention.

FIG. 32 is a perspective view of the wiring board 11A, illustrating a configuration thereof according to the second variation.

Figure 33:
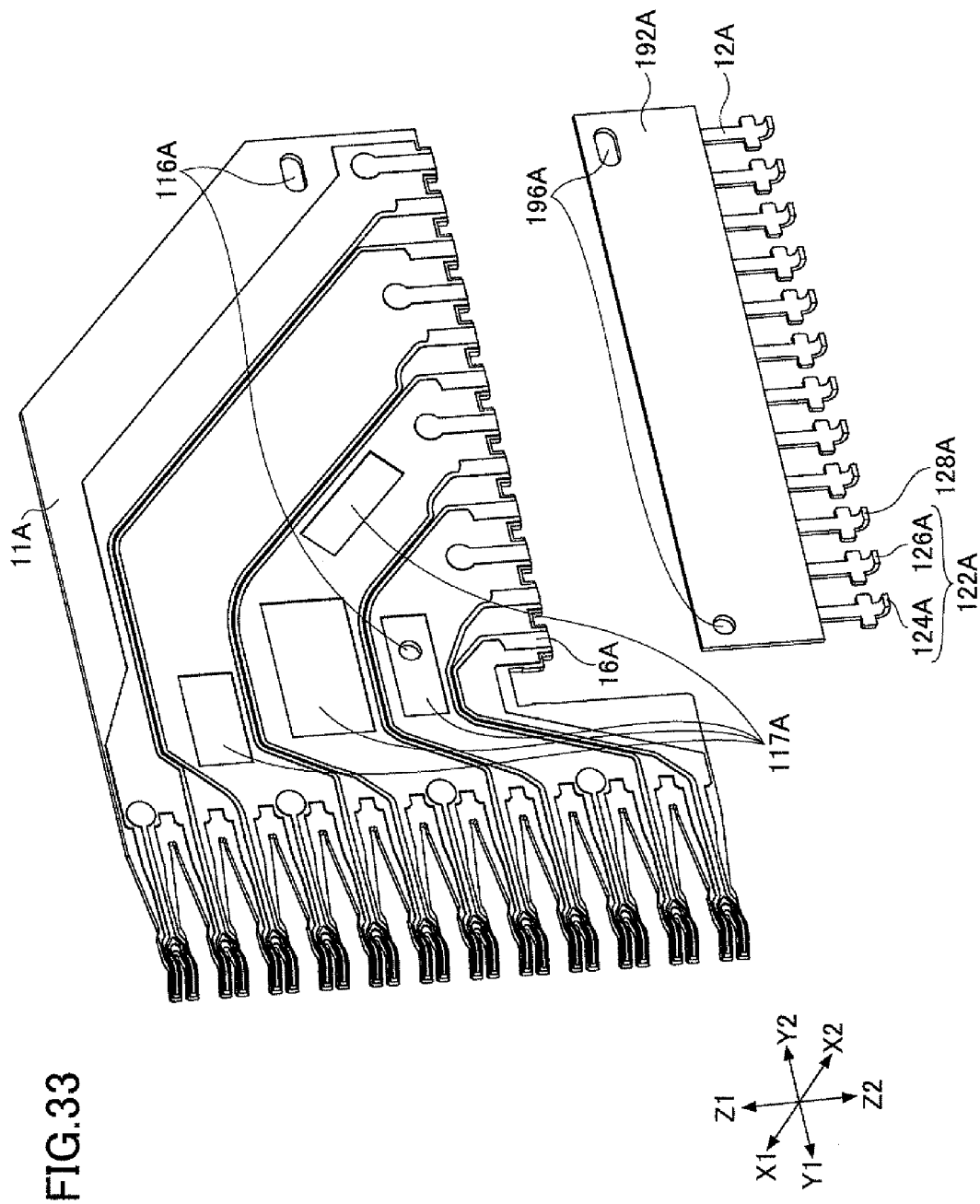
FIG. 33 is a perspective view of the wiring board, illustrating a method of joining (connecting) leads and pad electrodes according to the second variation of the first embodiment of the present invention.

FIG. 33 is a perspective view of the wiring board 11A, illustrating a method of joining (connecting) the leads 12A and the pad electrodes 16A according to the second variation.

The jack connector 3A according to the second variation basically has the same configuration as the jack connector 3A of the first embodiment, but may be different from the jack connector 3A of the first embodiment as follows.

Referring to FIG. 30 through FIG. 33, unlike in the first embodiment, the ground leads 128A have the same shape and configuration as the first and second signal leads 124A and 126A, and the conductive layers 17A are provided between the pad electrodes 16A and the corresponding leads 12A. Further, the wiring board 11A does not include the projecting parts 182A.

Referring to FIG. 32 as well as FIG. 15, the ground pad electrodes 168A are electrically connected to the backside metal plate 111A via the corresponding through holes 115A formed through the insulating layer 112A. The ground pad electrodes 168A alternate with the signal pad electrode pairs 162A so as to reduce crosstalk between adjacent signal pad electrode pairs 162A.

Further, the ground pad electrodes 168A have the same configuration as the first and second signal pad electrodes 164A and 166A as illustrated in FIG. 15. That is, the ground pad electrodes 168A may have a rectangular shape similar to those of the first and second signal pad electrodes 164A and 166A as illustrated in FIG. 15. Each of the ground pad electrodes 168A as well as the first and second signal pad electrodes 164A and 166A includes the first region 42A to come into contact with the corresponding conductive layer 17A; and the two second regions 44A one on each side of the first region 42A in the directions (Z1-Z2 directions) in which the leads 12A extend so that the first region 42A is sandwiched between the second regions 44A. The second regions 44A are lower in wettability with respect to the liquid melt of the conductive layer 17A than the first region 42A. That is, each of the ground pad electrodes 168A as well as the first and second signal pad electrodes 164A and 166A includes a low wettability region (the second region 44A), a high wettability region (the first region 42A), and a low wettability region (the second region 44A) in this order in the Z2 direction from the Z1 side.

The wiring board 11A has the insulating layer 112A on both lateral sides (Y1 and Y2 sides) of the pad electrodes 16A. The insulating layer 112A serves as a third region having low wettability with respect to the liquid melt (molten solder) of the conductive layers 17A compared with the pad electrodes 16A.

The conductive layers 17A may be formed of, for example, solder. In this case, the first regions 42A may be formed of a metal having high solder wettability, while the second regions 44A may be formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A in the first embodiment. For example, the method illustrated in FIGS. 16A through 16D, FIGS. 17A through 17C, FIGS. 18A and 18B, or FIGS. 19A through 19D may be employed to form regions different in wettability in the ground pad electrodes 168A as well as in the first and second signal pad electrodes 164A and 166A in this variation.

As described above, the ground leads 128A have the same shape and configuration as the first and second signal leads 124A and 126A as illustrated in FIGS. 20A and 20B.

The leads 12A including the ground leads 128A are formed by bending a metal plate of phosphor bronze or a Fe-42Ni alloy into an L-letter shape and processing it.

Each of the leads 12A including the ground leads 128A includes the first region 41A to come into contact with the corresponding conductive layer 17A; and the second region 45A on the daughterboard 5A side (Z2 side) of the first region 41A. The second region 45A is lower in wettability with respect to the liquid melt of the conductive layer 17A than the first region 41A.

Each of the leads 12A including the ground leads 128A may further include the third region 47A across the first region 41A from the second region 45A. The third region 47A is lower in wettability with respect to the liquid melt of the conductive layer 17A than the first region 41A.

Each of the leads 12A including the ground leads 128A may further include the fourth region 43A to come into contact with the adhesive agent 19A (FIG. 34A) on the daughterboard 5A side (Z2 side) of the second region 45A. The adhesive agent 19A adheres the leads 12A to the daughterboard 5A. The fourth region 43A is higher in wettability with respect to the liquid melt of the adhesive agent 19A than the second region 45A. In other words, the second region 45A is lower in wettability with respect to the liquid melt of the adhesive agent 19A than the fourth region 43A.

Accordingly, each of the leads 12A including the ground leads 128A includes a low wettability region (the third region 47A), a high wettability region (the first region 41A), a low wettability region (the second region 45A), and a high wettability region (the fourth region 43A) in this order in the Z2 direction from the Z1 side.

As illustrated in FIGS. 20A and 20B, each of the first, second, third, and fourth regions 41A, 45A, 47A, and 43A may be provided on each of the X1, X2, Y1, and Y2 sides of the leads 12A including the ground leads 128A so as to define their peripheral surfaces.

Referring to FIG. 33, which illustrates a method of joining (connecting) the leads 12A and the pad electrodes 16A according to the second variation, the leads 12A are held at predetermined intervals by the end plate 192A. The leads 12A and the end plate 192A are formed as a unitary structure by processing a metal plate of phosphor bronze or a Fe-42Ni alloy into a comb shape by blanking. The end plate 192A includes the through holes 196A corresponding to the through holes 116A provided in the wiring board 11A.

According to the joining method illustrated in FIG. 33, first, a solder paste (not graphically illustrated) such as a Sn—Bi alloy having a melting point of approximately 140° C. is applied on the pad electrodes 16A including the ground pad electrodes 168A. The area of application of the solder paste may correspond to the first regions 42A (FIG. 15) of the pad electrodes 16A and the first regions 41A (FIGS. 20A and 20B) of the corresponding leads 12A. In this case, it is ensured that the solder paste melted by below-described heat treatment spreads over and wets both of the first regions 42A and the first regions 41A while contracting in volume to crush air gaps inside the solder paste. Further, in this case, the molten solder paste moves from the second regions 44A and 45A of lower solder wettability to the first regions 42A and 41A, respectively, of higher solder wettability.

After application of the solder paste, pins (not graphically illustrated) are inserted through the through holes 116A and the through holes 196A after aligning the through holes 116A and the through holes 196A. Thereby, the pad electrodes 16A and the corresponding leads 12A are aligned.

Next, the solder paste is melted by heat treatment and then solidified to form the conductive layers (solder layers) 17A. As a result, the leads 12A are connected to the corresponding pad electrodes 16A through the conductive layers 17A. Then, the pins are removed and the end plate 192A is broken off.

The positional relationship between the leads 12A and the corresponding pad electrodes 16A is the same as that of the first signal lead 124A (the second signal lead 126A) and the first signal pad electrode 164A (the second signal pad electrode 166A) as illustrated in FIG. 22.

The spacer 13A (FIGS. 23A and 23B) is fixed to the wiring board 11A. The spacer 13A has the guide grooves 132A on its surface (X1-side surface) facing the wiring board 11A. The leads 12A including the ground leads 128A are movable inside the corresponding guide grooves 132A when the conductive layers (solder layers) 17A melt.

As described above, the projecting parts 136A of the spacer 13A are fit into the corresponding recess parts 117A of the wiring board 11A, so that the spacer 13A and the wiring board 11A are connected. This allows the guide grooves 132A and the pad electrodes 16A to be aligned with accuracy.

According to this variation, the same as illustrated in FIG. 22, the center C1 of the first region 41A of the lead 12A is offset in a direction away from the daughterboard 5A (in the Z1 direction) relative to the center C2 of the first region 42A of the corresponding pad electrode 16A. That is, the conductive layer (solder layer) 17A is formed to have its contact surface with the lead 12A offset in a direction away from the daughterboard 5A (in the Z1 direction) relative to its contact surface with the wiring board 11A (the pad electrode 16A). Accordingly, the conductive layer (solder layer) 17A has a substantially parallelogram-shaped cross section along the X-Z plane as illustrated in FIG. 22, for example.

Reheating the conductive layer (solder layer) 17A in this state causes the conductive layer 17A to melt to take a shape reduced in surface area (that is, a shape having a rectangular cross section) because of its surface tension.

If the second region 45A and the third region 47A of lower solder wettability were not present or formed to have the first region 41A to come into surface contact with the conductive layer 17A interposed between them, the molten conductive layer 17A would move on the lead 12A in the Z1-Z2 directions to reduce its surface area. Further, if the second regions 44A of lower solder wettability were not present or formed to have the first region 42A to come into surface contact with the conductive layer 17A interposed between them, the molten conductive layer 17A would move on the wiring board 11A (the pad electrode 16A) in the Z1-Z2 directions to reduce its surface area.

According to this variation, the second region 45A and the third region 47A are provided to have the first region 41A to come into surface contact with the conductive layer 17A sandwiched between them, and the second regions 44A are provided to have the first region 42A to come into surface contact with the conductive layer 17A sandwiched between them. This prevents the molten conductive layer (solder layer) 17A from moving on the lead 12A or the wiring board 11A (the pad electrode 16A) in the Z1-Z2 directions. Accordingly, the molten conductive layer (solder layer) 17A causes the lead 12A to move in a direction to approach the daughterboard 5A relative to the wiring board 11A in order to reduce the surface area of the conductive layer 17A. This makes it possible to urge the lead 12A toward the daughterboard 5A and ensure the connection of the lead 12A to the daughterboard 5A when the conductive layer 17A melts.

Further, according to this variation, the second region 45A of lower solder wettability is between the first region 41A to come into surface contact with the conductive layer (solder layer) 17A and the fourth region 43A to come into surface contact with the daughterboard 5A. Accordingly, the molten conductive layer 17A is prevented from moving on the lead 12A in the Z2 direction and coming into contact with the daughterboard 5A. This makes it possible to prevent the molten conductive layer 17A from adversely affecting the joining of the lead 12A and the daughterboard 5A.

Further, according to this variation, the same as illustrated in FIG. 15, the insulating layer 112A (third region) of low solder wettability is present on both lateral sides (Y1 and Y2 sides) of the first region 42A to come into surface contact with the conductive layer (solder layer) 17A. This prevents the molten conductive layer 17A from moving on the wiring board 11A in the Y1-Y2 directions. As a result, it is possible to prevent the molten conductive layer 17A from electrically connecting adjacent pad electrodes 16A.

Figure 34A:
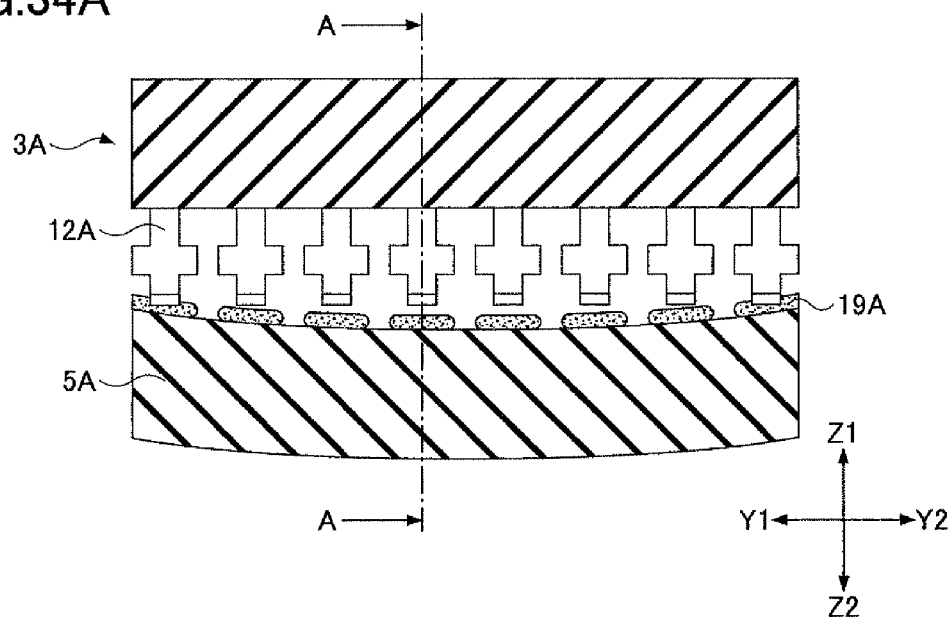
FIGS. 34A and 34B are a front-side cross-sectional view and a cross-sectional view taken along one-dot chain line A-A of FIG. 34A, respectively, of part of the jack connector and the daughterboard, illustrating placement of the jack connector on the daughterboard according to the second variation of the first embodiment of the present invention.
Figure 34B:
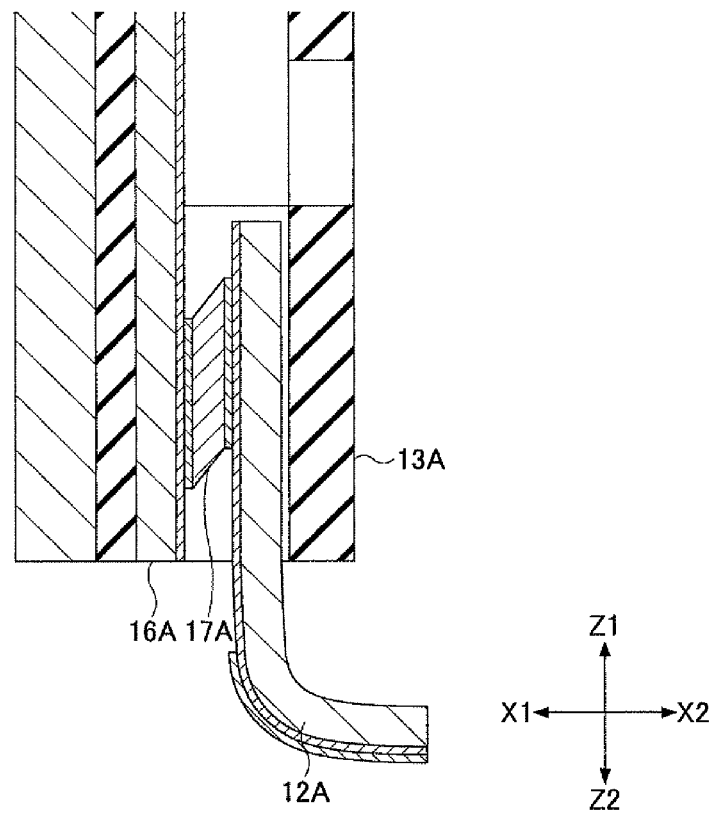

FIGS. 34A and 34B are a front-side cross-sectional view and a cross-sectional view taken along one-dot chain line A-A of FIG. 34A, respectively, of part of the jack connector 3A and the daughterboard 5A, illustrating placement of the jack connector 3A on the daughterboard 5A according to this variation. In FIG. 34B, the adhesive agent 19A and the daughterboard 5A are omitted for convenience of graphical representation.

The adhesive agent 19A for adhering (bonding) the leads 12A to the daughterboard 5A is provided on the daughterboard 5A. The adhesive agent 19A may be a solder paste higher in melting point than the conductive layers (solder layer) 17A. Examples of the adhesive agent 19A include a Sn—Ag—Cu alloy having a melting point of 220° C. In the case illustrated in FIGS. 34A and 34B, there is a gap between some of the leads 12A and the adhesive agent (solder paste) 19A due to the (surface) warpage of the daughterboard 5A.

Figure 35A:
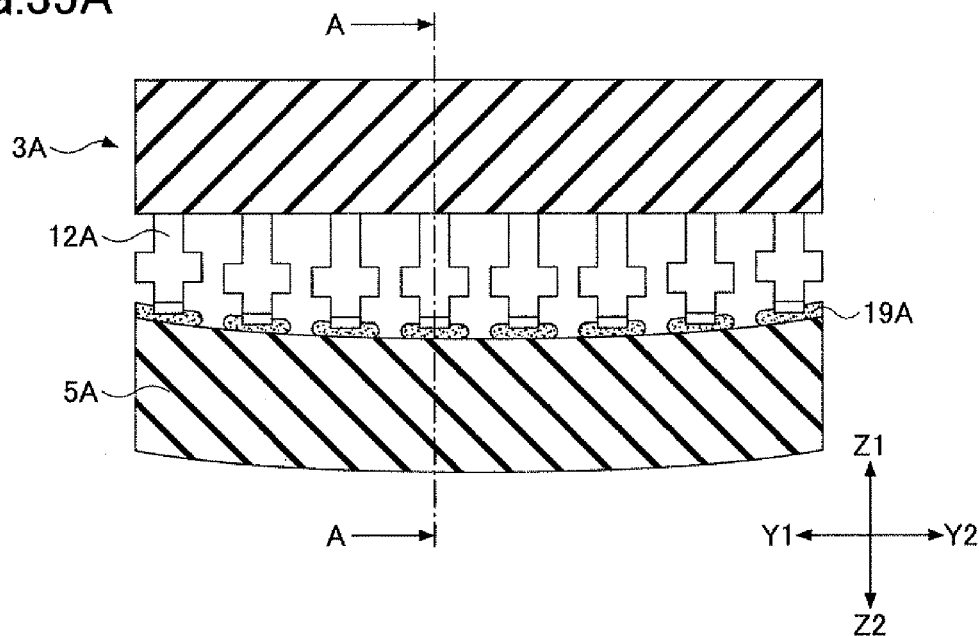
FIGS. 35A and 35B are a front-side cross-sectional view and a cross-sectional view taken along one-dot chain line A-A of FIG. 35A, respectively, of part of the jack connector and the daughterboard after heating the structure of FIGS. 34A and 34B, illustrating a mounting structure of the jack connector according to the second variation of the first embodiment of the present invention.
Figure 35B:
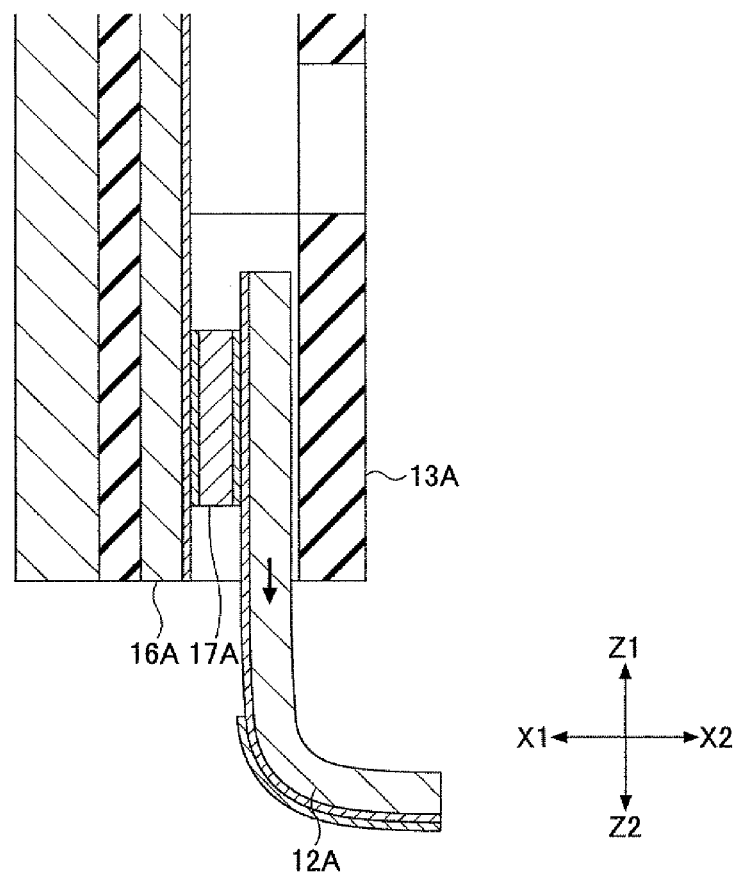

FIGS. 35A and 35B are a front-side cross-sectional view and a cross-sectional view taken along one-dot chain line A-A of FIG. 35A, respectively, of part of the jack connector 3A and the daughterboard 5A after heating the structure of FIGS. 34A and 34B, illustrating a mounting structure of the jack connector 3A. In FIG. 35B, the adhesive agent 19A and the daughterboard 5A are omitted for convenience of graphical representation.

When the adhesive agent (solder paste) 19A is caused to melt by application of heat, the conductive layers (solder layers) 17A melt to allow the leads 12A to move inside the corresponding guide grooves 132A. In this state, the surface tension of the molten conductive layers 17A causes the leads 12A to be pushed out of the corresponding guide grooves 132A in the Z2 direction so as to absorb the (surface) warpage of the daughterboard 5A. As a result, it is possible to ensure the connection of the leads 12A to the daughterboard 5A after the heat treatment, so that it is possible to increase the reliability of the electrical and mechanical connections of the leads 12A to the daughterboard 5A.

Further, according to the above-described configuration, the second region 45A of lower solder wettability is formed between the first region 41A to come into contact with the conductive layer 17A and the fourth region 43A to come into contact with the adhesive agent (solder paste) 19A. Accordingly, it is possible to prevent the interdiffusion of the liquid melt of the conductive layer 17A and the liquid melt of the adhesive agent 19A by separating the liquid melts from each other. This makes it possible to maintain the compositions of the conductive layer 17A and the adhesive agent 19A and thus to obtain a target or desired joining strength and durability after heat treatment, so that it is possible to increase the reliability of the mechanical connection of the leads 12A and the daughterboard 5A.

Next, a description is given of a configuration of the plug connector 2A according to the second variation.

Figure 36:
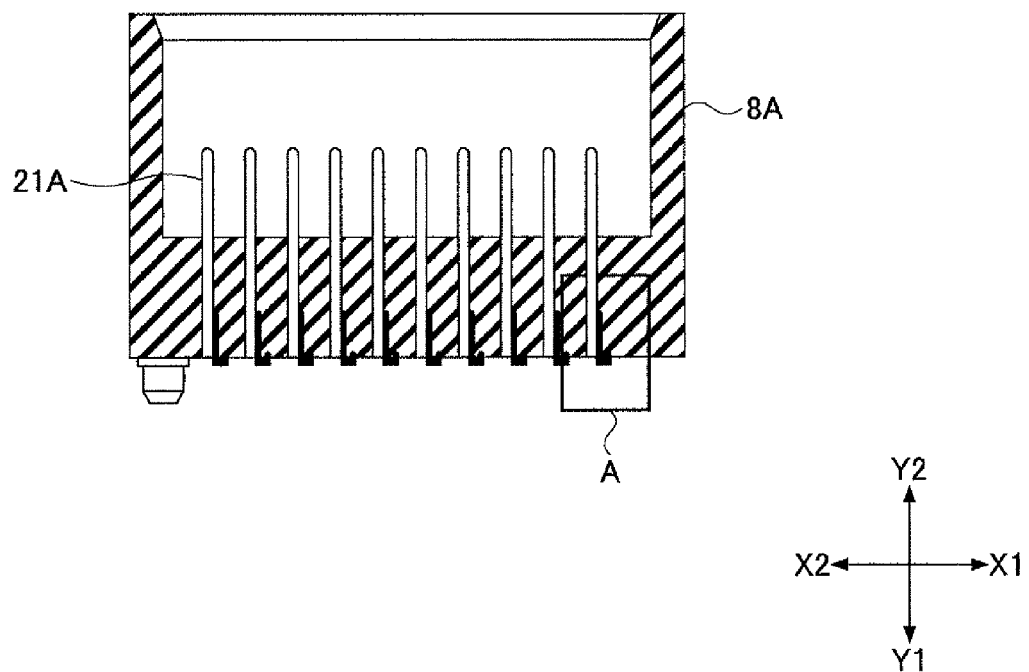
FIG. 36 is a schematic cross-sectional view of the plug connector, illustrating a configuration thereof according to the second variation of the first embodiment of the present invention.

The plug connector 2A according to the second variation may have the same configuration as that of the plug connector 2A according to the first embodiment. Alternatively, however, the plug connector 2A according to the second variation may also have a configuration as illustrated in FIG. 36. The plug connector 2A illustrated in FIG. 36 has the same configuration as the plug connector 2A of FIG. 26 except that the plug connector 2A of FIG. 36 does not include the through holes 86A, the through holes 216A, and the rod members 88A.

Figure 37:
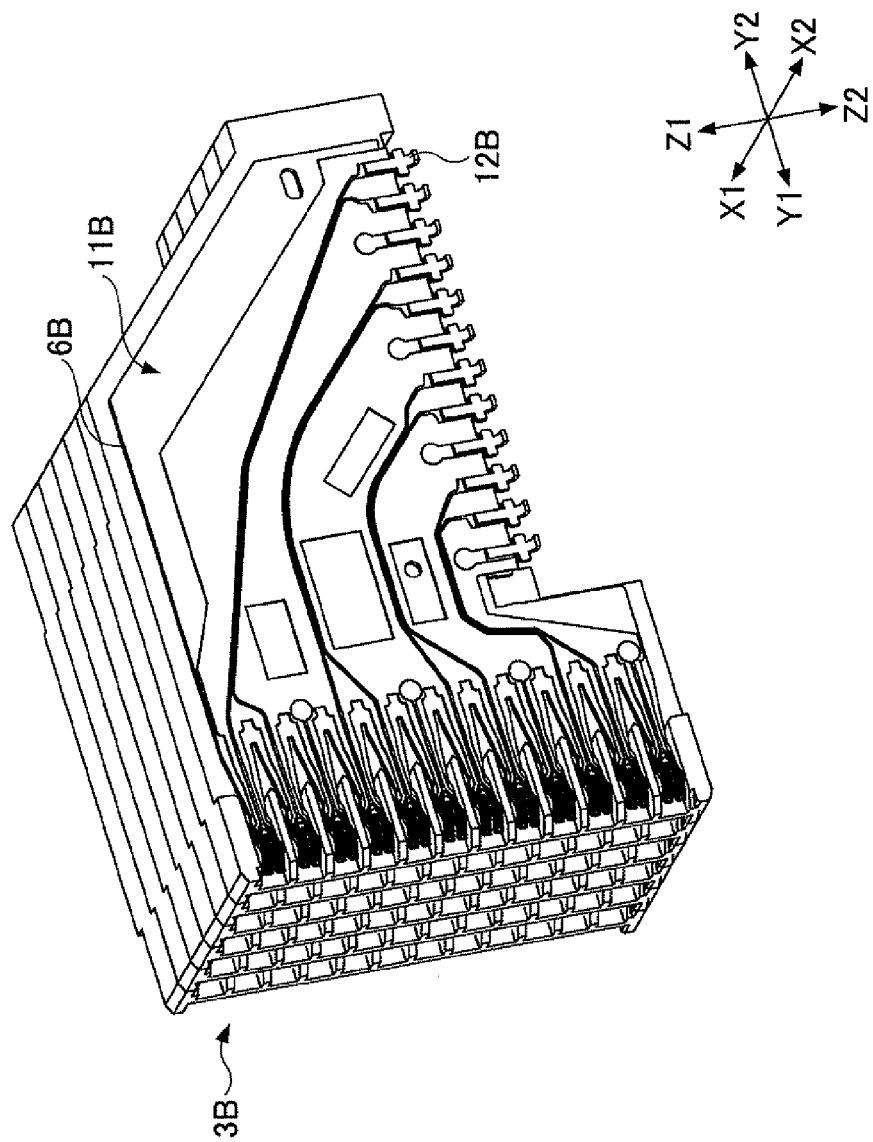
FIG. 37 is a cut-away view of another jack connector according to the second variation of the first embodiment of the present invention.

FIG. 37 is a cut-away view of another jack connector 3B according to the second variation of the first embodiment.

FIG. 38 is a cross-sectional view of part of the jack connector 3B, illustrating the positional relationship between a lead 12B and a corresponding pad electrode 16B.

Unlike the jack connector 3A, the jack connector 3B includes a stack of multiple insulative plates 6B and a lid (not graphically illustrated) covering the X2 side of the stack. As illustrated in FIG. 37 and FIG. 38, each insulative plate 6B includes a wiring board 11B having multiple pad electrodes 16B (FIG. 38); and multiple leads 12B. Conductive layers 17B (FIG. 38) are provided between the pad electrodes 16B and the corresponding leads 12B.

The insulative plates 6B and the lid include multiple guide grooves 132E (FIG. 38) on their respective rear faces (the X1-side faces). The guide grooves 132B extend in the direction (the Z1-Z2 directions) in which the leads 12B extend on the rear side (X2 side) of the insulative plates 6B or the lid. The leads 12B are fixed to the pad electrodes 16B through the conductive layers 17B, and are movable inside the corresponding guide grooves 132B when the conductive layers 17B melt.

Referring to FIG. 38, each of the pad electrodes 16B includes a first region 42B to come into contact with the corresponding conductive layer 17B; and two second regions 44B one on each side of the first region 42B in the directions (Z1-Z2 directions) in which the leads 12B extend so that the first region 42B is sandwiched between the second regions 44B. The second regions 44B are lower in wettability with respect to the liquid melt of the conductive layer 17B than the first region 42B. That is, each of the pad electrodes 16B includes a low wettability region (the second region 44B), a high wettability region (the first region 42B), and a low wettability region (the second region 44B) in this order in the Z2 direction from the Z1 side.

The wiring board 11B has an insulating layer (not graphically illustrated) on both lateral sides (Y1 and Y2 sides) of the pad electrodes 16B. The insulating layer serves as a third region having low wettability with respect to the liquid melt (molten solder) of the conductive layers 17B compared with the pad electrodes 16B.

The conductive layers 17B may be formed of, for example, solder such as a Sn—Bi alloy having a melting point of approximately 140° C. In this case, the first regions 42B may be formed of a metal having high solder wettability, while the second regions 44B may be formed of a metal having low solder wettability, resin, or an oxide coating. Any appropriate method may be employed to form such regions different in wettability. Such a method uses, for example, photolithography and etching the same as in the case of the pad electrode 16A in the second variation. For example, the method illustrated in FIGS. 16A through 16D, FIGS. 17A through 17C, FIGS. 18A and 18B, or FIGS. 19A through 19D may be employed.

Each of the leads 12B includes a first region 41B to come into contact with the corresponding conductive layer 17B; and a second region 45B on an external board side (Z2 side) of the first region 41B. The second region 45B is lower in wettability with respect to the liquid melt of the conductive layer 17B than the first region 41B.

Each of the leads 12B may further include a third region 47B across the first region 41B from the second region 45B. The third region 47B is lower in wettability with respect to the liquid melt of the conductive layer 17B than the first region 41B.

Each of the leads 12B may further include a fourth region 43B to come into contact with an adhesive agent for adhering (bonding) the leads 12B to the external board on the external board side (Z2 side) of the second region 45B. The fourth region 43B is higher in wettability with respect to the liquid melt of the adhesive agent than the second region 45B. In other words, the second region 45B is lower in wettability with respect to the liquid melt of the adhesive agent than the fourth region 43B.

Accordingly, in the case illustrated in FIG. 38, each lead 12B includes a low wettability region (the third region 47B), a high wettability region (the first region 41B), a low wettability region (the second region 45B), and a high wettability region (the fourth region 43B) in this order in the Z2 direction from the Z1 side.

Each of the first, second, third, and fourth regions 41B, 45B, 47B, and 43B may be provided on each of the X1, X2, Y1, and Y2 sides of the leads 12B so as to define their peripheral surfaces.

The conductive layers 17B may be formed of, for example, solder. In this case, the first region 41B and the fourth region 43B are formed of a metal having high solder wettability, while the second region 45B and the third region 47B are formed of a metal having low solder wettability, resin, or an oxide coating. Any appropriate method may be employed to form such regions different in wettability. Such a method uses, for example, photolithography and etching the same as in the case of the pad electrodes 16A. For example, the method illustrated in FIGS. 16A through 16D, FIGS. 17A through 17C, FIGS. 18A and 18B, or FIGS. 19A through 19D may be employed.

Referring to FIG. 38, the center E1 of the first region 41B of the lead 12B is offset in a direction away from the external board (in the Z1 direction) relative to the center E2 of the first region 42B of the corresponding pad electrode 16B. That is, the conductive layer (solder layer) 17B is formed to have its contact surface with the lead 12B offset in a direction away from the external board (in the Z1 direction) relative to its contact surface with the wiring board 11A (the pad electrode 16B). Accordingly, the conductive layer (solder layer) 17B has a substantially parallelogram-shaped cross section along the X-Z plane as illustrated in FIG. 38, for example.

Reheating the conductive layer (solder layer) 17B in this state causes the conductive layer 17B to melt to take a shape reduced in surface area (that is, a shape having a rectangular cross section) because of its surface tension.

If the second region 45B and the third region 47B of lower solder wettability were not present or formed to have the first region 41B to come into surface contact with the conductive layer 17B interposed between them, the molten conductive layer 17B would move on the lead 12B in the Z1-Z2 directions to reduce its surface area. Further, if the second regions 44B of lower solder wettability were not present or formed to have the first region 42B to come into surface contact with the conductive layer 17B interposed between them, the molten conductive layer 17B would move on the wiring board 11B (the pad electrode 16B) in the Z1-Z2 directions to reduce its surface area.

According to the configuration illustrated in FIG. 37 and FIG. 38, the second region 45B and the third region 47B are provided to have the first region 41B to come into surface contact with the conductive layer 17B sandwiched between them, and the second regions 44B are provided to have the first region 42B to come into surface contact with the conductive layer 17B sandwiched between them. This prevents the molten conductive layer (solder layer) 17B from moving on the lead 12B or the wiring board 11B (the pad electrode 16B) in the Z1-Z2 directions. Accordingly, the molten conductive layer (solder layer) 17B causes the lead 12B to move in a direction to approach the external board relative to the wiring board 11B in order to reduce the surface area of the conductive layer 17B. This makes it possible to urge the lead 12B toward the external board and ensure the connection of the lead 12B to the external board when the conductive layer 17B melts.

Further, according to the configuration illustrated in FIG. 37 and FIG. 38, the second region 45B of lower solder wettability is between the first region 41B to come into surface contact with the conductive layer (solder layer) 17B and the fourth region 43B to come into surface contact with the external board. Accordingly, the molten conductive layer 17B is prevented from moving on the lead 12B in the Z2 direction and coming into contact with the external board. This makes it possible to prevent the molten conductive layer 17B from adversely affecting the joining of the lead 12B and the external board.

Further, according to the configuration illustrated in FIG. 37 and FIG. 38, an insulating layer (third region) of low solder wettability is present on both lateral sides (Y1 and Y2 sides) of the first region 42B to come into surface contact with the conductive layer (solder layer) 17B. This prevents the molten conductive layer 17B from moving on the wiring board 11B in the Y1-Y2 directions. As a result, it is possible to prevent the molten conductive layer 17B from electrically connecting adjacent pad electrodes 16B.

According to the second variation of the first embodiment, as illustrated in FIG. 31, the wiring board 11A may be connected to the second insulative housing 7A through the corresponding projecting part 78A and the recess part 18A. Alternatively, the wiring board 11A may not be connected to the second insulative housing 7A. In either case, it is possible to urge the leads 12A toward the daughterboard 5A when the conductive layers 17A melt, so that it is possible to increase the reliability of the connection of the leads 12A and the daughterboard 5A.

Figure 39:
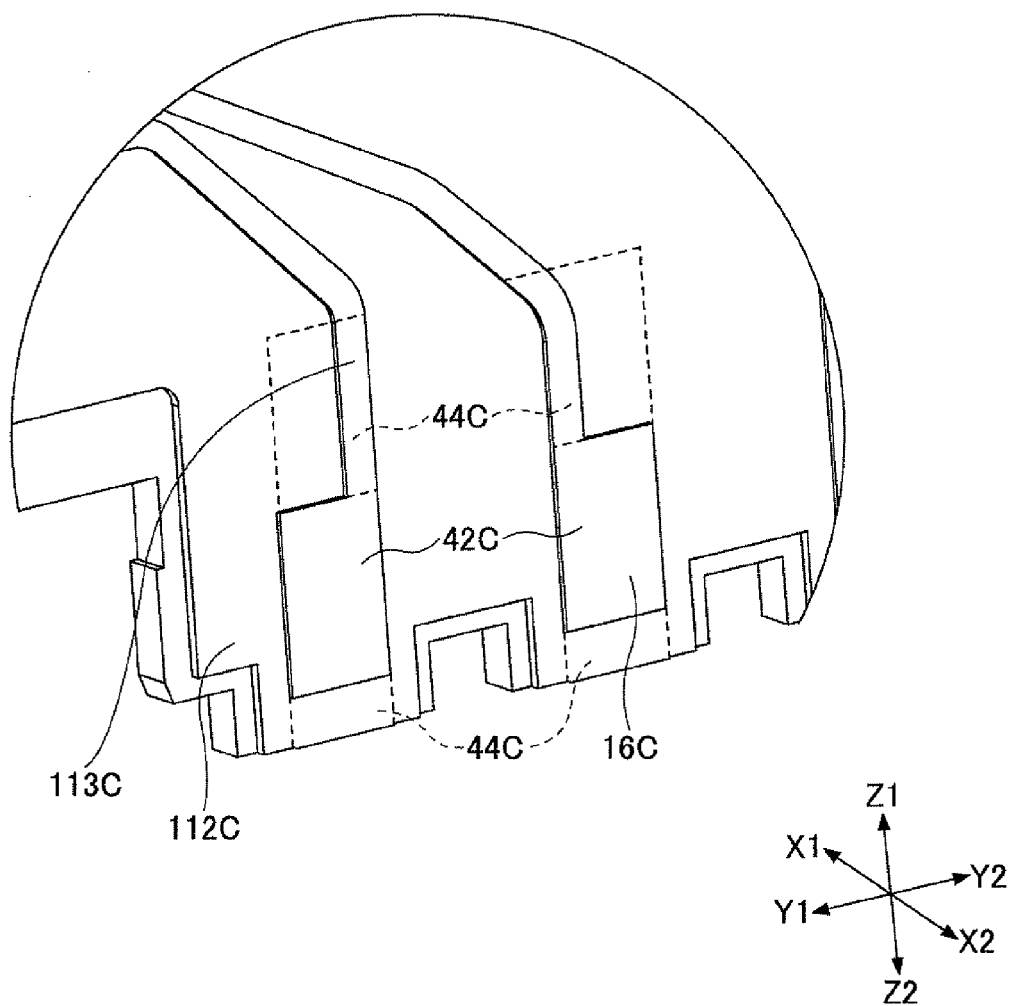
FIG. 39 is an enlarged perspective view of part of the wiring board, illustrating a configuration of each pad electrode according to the second variation of the first embodiment of the present invention.

Further, as described above with reference to FIG. 15, each of the first and second signal electrodes 164A and 166A (first embodiment) or each pad electrode 16A (second variation) includes the first region 42A and the second regions 44A, but the present invention is not limited to this configuration. For example, as illustrated in FIG. 39, a pad electrode 16C may include a first region 42C (to come into contact with the corresponding conductive layer 17A), and an insulating layer 112C (and an interconnection pattern 113C) may include second regions 44C on both sides (Z1 and Z2 sides) of the pad electrode 16C. In general, the resin or ceramics insulating layer 112C is lower in solder wettability than the metal pad electrode 16C.

Further, as described above with reference to FIG. 21 or FIG. 33, the solder paste provided between the first and second signal pad electrodes 164A and 166A and the corresponding first and second signal leads 124A and 126A (first embodiment) or between the pad electrodes 16A and the corresponding leads 12A (second variation) is melted by heat treatment and solidified to form the conductive layers (solder layers) 17A, but the present invention is not limited to this configuration. For example, a solder layer may be formed on one or both of the first regions 41A and 42A before providing the solder paste. Preforming such a solder layer further ensures that the solder melted by heat treatment spreads over and wets the first regions 41A and 42A.

Further, as described above with reference to FIG. 22, the conductive layers 17A have a substantially parallelogram-shaped cross section along the X-Z plane, but the present invention is not limited to this configuration. For example, the conductive layers 17A may have a substantially trapezoidal shape. In this case, the cross-sectional shape of the molten conductive layers 17A is caused to become an isosceles trapezoid because of their surface tension.

Further, as described above with reference to FIG. 22, one conductive layer 17A is provided between each of the first and second signal pad electrodes 164A and 166A and the corresponding first or second signal lead 124A or 126A (first embodiment) or between each pad electrode 16A and the corresponding lead 12A (second variation). However, the present invention is not limited to this configuration, and as illustrated in FIG. 40, multiple conductive layers 17D may be provided between one pad electrode (or signal pad electrode) 16D and a corresponding one lead (or signal lead) 12D. In this case, the pad electrode 16D includes first regions 42D and a fourth region 48D provided between the adjacent first regions 42D, and the lead 12D includes first regions 41D and a fifth region 49D provided between the adjacent first regions 41D. The fourth region 48D and the fifth region 49D are lower in wettability with respect to the liquid melt of the conductive layers 17D than the first regions 42D and the first regions 41D, respectively. The centers F1 and G1 of the first regions 41D of the lead 12D is offset in a direction away from an external board (in the Z1 direction) relative to the centers F2 and G2, respectively, of the first region 42D of the corresponding pad electrode 16D (a wiring board 11D).

Second Embodiment

A description is given of a second embodiment of the present invention.

Figure 41:
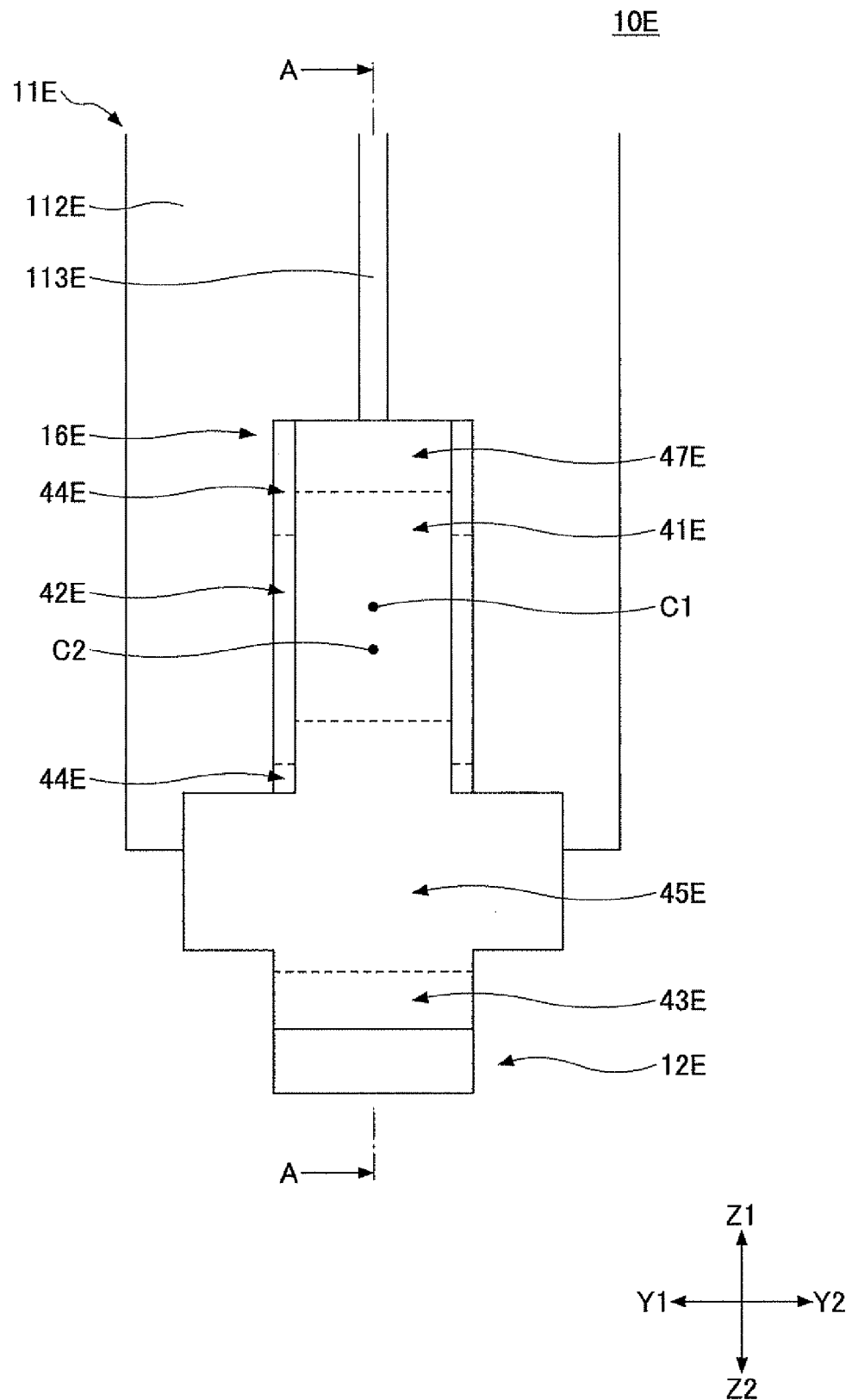
FIG. 41 is a schematic diagram illustrating part of a module for the jack connector according to a second embodiment of the present invention.

FIG. 41 is a schematic diagram illustrating part of a module 10E, which is a variation of the module 10A of the first embodiment. The module 10E may replace the module 10A in the jack connector 3A of the first embodiment.

Figure 42:
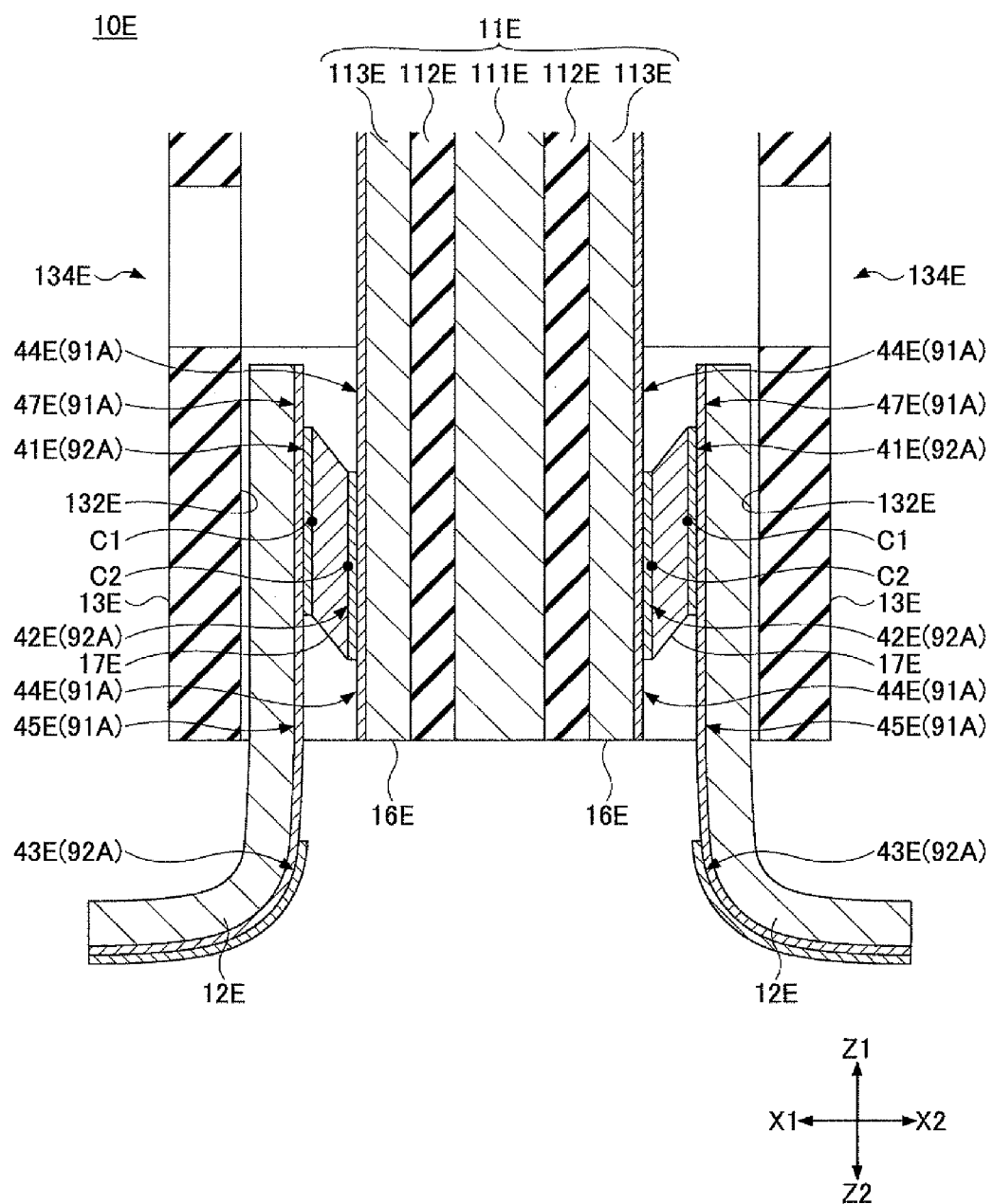
FIG. 42 is a cross-sectional view of the structure of FIG. 41 taken along one-dot chain line A-A according to the second embodiment of the present invention.

FIG. 42 is a cross-sectional view of the structure of FIG. 41 taken along one-dot chain line A-A.

Referring to FIG. 41 and FIG. 42, the module 10E includes a wiring board 11E having multiple pad electrodes 16E; multiple leads 12E; multiple conductive layers 17E; and an insulative guide part 13E.

The leads 12E are configured to connect the wiring board 11E electrically to the daughterboard 5A (FIG. 8). The leads 12E are connected to the corresponding pad electrodes 16E through the corresponding conductive layers 17E. The guide part 13E is fixed onto the wiring board 11E. The guide part 13E includes multiple guide grooves 132E on its surfaces facing toward the wiring board 11E. The guide grooves 132E extend in the directions (Z1-Z2 directions) in which the leads 12E extend. The leads 12E are movable inside the corresponding guide grooves 132E when the conductive layers 17E melt. That is, the guide part 13E guides the leads 12E in the directions (Z1-Z2 directions) in which the leads 12E extend when the conductive layers 17E melt. The guide part 13E further includes window parts 134E. The window parts 134E are formed near the guide grooves 132E. This allows the conductive layers (solder layers) 17E to be heated from both ends (Z1 and Z2 ends) of the guide grooves 132E. This ensures that the conductive layers (solder layers) 17E are melted by heat treatment.

The wiring board 11E has a five-layer structure where an insulating layer 112E of polyimide or the like and interconnection patterns (wiring patterns) 113E of Cu, Al, or the like are successively stacked on each of the front (X2-side) surface and the rear (X1-side) surface of a metal plate 111E of phosphor bronze or the like. The metal plate 111E, which is a ground plate for crosstalk prevention, prevents crosstalk between the interconnection patterns 113E provided on both sides (X1 and X2 sides) of the metal plate 111E.

The wiring board 11E may be manufactured by a common method such as one using photolithography and etching.

FIGS. 43A through 43H are diagrams illustrating a method (process) for manufacturing the wiring board 11E.

Figure 43A:
FIGS. 43A through 43H are diagrams illustrating a method (process) for manufacturing a wiring board according to the second embodiment of the present invention.

In the illustrated case, first, as illustrated in FIG. 43A, photosensitive polyimide ink is applied and dried on one of the front (X2-side) and rear (X1-side) surfaces (the front surface in the illustrated case) of the phosphor bronze metal plate 111E, thereby forming the insulating layer 112E on the metal plate 111E.

Figure 43B:
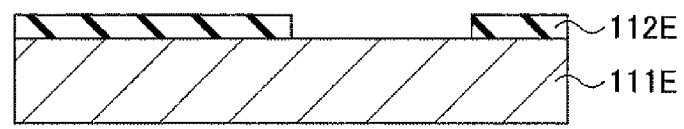

Next, as illustrated in FIG. 43B, the insulating layer 112E is exposed and developed using a photomask (not graphically illustrated).

Figure 43C:
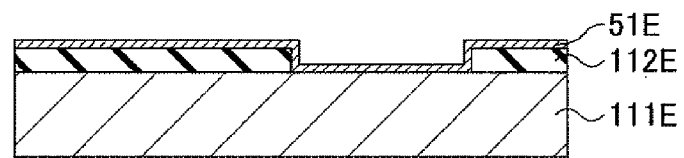

Next, as illustrated in FIG. 43C, a Ni—W film 51E is deposited (stacked) on the structure of FIG. 43B by sputtering.

Figure 43D:
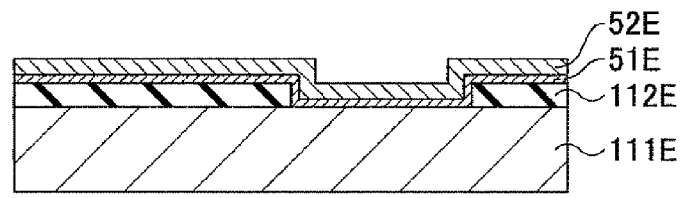

Next, as illustrated in FIG. 43D, a Cu film 52E is deposited (stacked) on the Ni—W film 51E by electroplating.

Figure 43E:
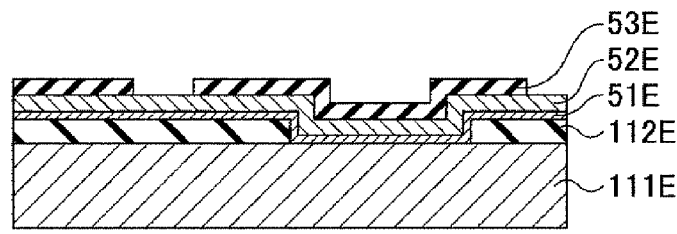

Next, as illustrated in FIG. 43E, a photoresist pattern 53E is formed on the Cu film 52E.

Figure 43F:
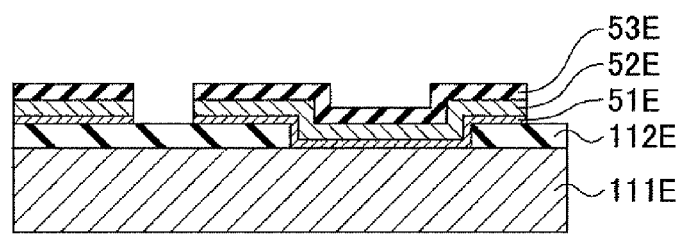

Next, as illustrated in FIG. 43F, the Cu film 52E and the Ni—W film 51E are etched using the photoresist pattern 53E.

Figure 43G:
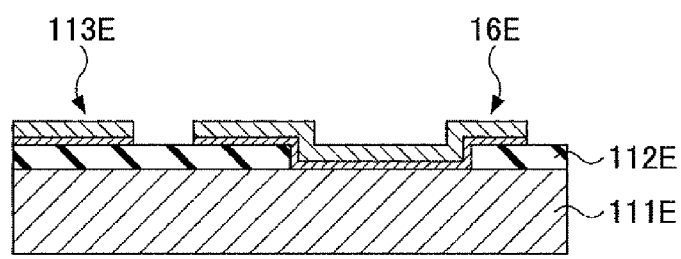

Next, as illustrated in FIG. 43G, the photoresist pattern 53E is removed, so that the interconnection patterns 113E and pad electrodes 16E are formed of the Cu film 52E.

Figure 43H:
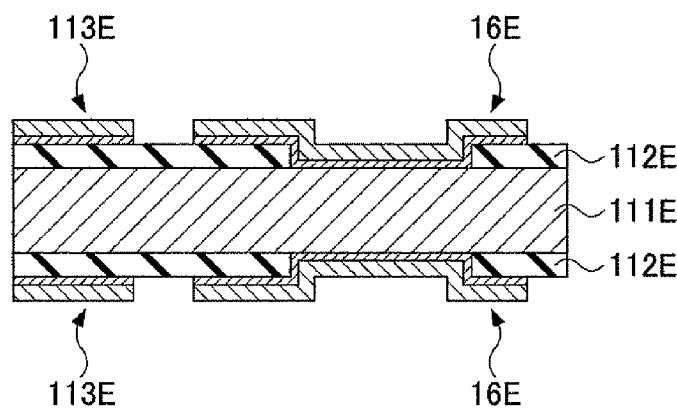

Next, as illustrated in FIG. 43H, the insulating layer 112E, the interconnection patterns 113E, and the pad electrodes 16E are formed on the other one of the front (X2-side) and rear (X1-side) surfaces (the rear surface in the illustrated case) of the phosphor bronze metal plate 111E by repeating the above-described processes illustrated in FIGS. 43A through 43G.

As described above, the wiring board 11E of this embodiment has a five-layer structure where the insulating layer 112E and the interconnection patterns 113E are successively stacked on each of the front (X2-side) and rear (X1-side) surfaces of the metal plate 111E. Alternatively, the wiring board 11E may have a three-layer structure where the interconnection patterns 113E of Cu or the like are stacked on each of the front (X2-side) and rear (X1-side) surfaces of the insulating layer 112E of an insulating film of polyimide or the like. Further, a ground plate may be provided between adjacent wiring boards 11E to reduce crosstalk. Further, the wiring board 11E may be either rigid or flexible.

Referring to FIG. 41, each pad electrode 16E is connected to one end of the corresponding interconnection pattern 113A. The multiple electrodes 16E are provided on each of the front (X2-side) and rear (X1-side) surfaces of the wiring board 11E. Each of the pad electrodes 16E includes a first region 42E to come into contact with the corresponding conductive layer 17E; and two second regions 44E one on each side of the first region 42E in the directions (Z1-Z2 directions) in which the leads 12E extend so that the first region 42E is sandwiched between the second regions 44E. The second regions 44E are lower in wettability with respect to the liquid melt of the conductive layer 17E than the first region 42E. That is, each pad electrode 16E includes a low wettability region (the second region 44E), a high wettability region (the first region 42E), and a low wettability region (the second region 44E) in this order in the Z2 direction from the Z1 side.

Referring to FIG. 41, the wiring board 11E has the insulating layer 112E on both lateral sides (Y1 and Y2 sides) of the pad electrode 16E. The insulating layer 112E serves as a third region having low wettability with respect to the liquid melt (molten solder) of the conductive layer 17E compared with the pad electrode 16E.

The conductive layers 17E may be formed of, for example, solder such as lead-free solder. In this case, the first regions 42E may be formed of a metal having high solder wettability, while the second regions 44E may be formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A (first embodiment). For example, the method illustrated in FIGS. 16A through 16D, FIGS. 17A through 17C, FIGS. 18A and 18B, or FIGS. 19A through 19D may be employed. In this embodiment, such a method may be performed on the Cu pad electrodes 16E formed in the process of FIG. 43G or 43H.

The leads 12E are configured to connect the wiring board 11E electrically to the daughterboard 5A, and extend in the Z1-Z2 directions. The leads 12E are formed by bending a metal plate of phosphor bronze or a Fe-42Ni alloy into an L-letter shape and processing it. The multiple leads 12E are provided on each of the front (X2-side) and rear (X1-side) surfaces of the wiring board 11E.

Referring to FIG. 41 and FIG. 42, each lead 12E includes a first region 41E to come into contact with the corresponding conductive layer 17E; and a second region 45E on the daughterboard 5A side (Z2 side) of the first region 41E. The second region 45E is lower in wettability with respect to the liquid melt of the conductive layer 17E than the first region 41E.

Each lead 12E may further include a third region 47E across the first region 41E from the second region 45E. The third region 47E is lower in wettability with respect to the liquid melt of the conductive layer 17E than the first region 41E.

Each lead 12E may further include a fourth region 43E to come into contact with the adhesive agent 19A (FIG. 45A and FIG. 46A) on the daughterboard 5A side (Z2 side) of the second region 45E. The adhesive agent 19 adheres the leads 12E to the daughterboard 5A. The fourth region 43E is higher in wettability with respect to the liquid melt of the adhesive agent 19A than the second region 45E. In other words, the second region 45E is lower in wettability with respect to the liquid melt of the adhesive agent 19A than the fourth region 43E.

Accordingly, each lead 12E includes a low wettability region (the third region 47E), a high wettability region (the first region 41E), a low wettability region (the second region 45E), and a high wettability region (the fourth region 43E) in this order in the Z2 direction from the Z1 side.

Each of the first, second, third, and fourth regions 41E, 45E, 47E, and 43E may be provided on each of the X1, X2, Y1, and Y2 sides of the leads 12E so as to define their peripheral surfaces.

The conductive layers 17E may be formed of, for example, solder. In this case, the first region 41E and the fourth region 43E are formed of a metal having high solder wettability, while the second region 45E and the third region 47E are formed of a metal having low solder wettability, resin, or an oxide coating. Any appropriate method may be employed to form such regions different in wettability. Such a method uses, for example, photolithography and etching the same as in the case of the first and second signal pad electrodes 164A and 166A (first embodiment). For example, the method illustrated in FIGS. 16A through 16D, FIGS. 17A through 17C, FIGS. 18A and 18B, or FIGS. 19A through 19D may be employed.

Figure 44A:
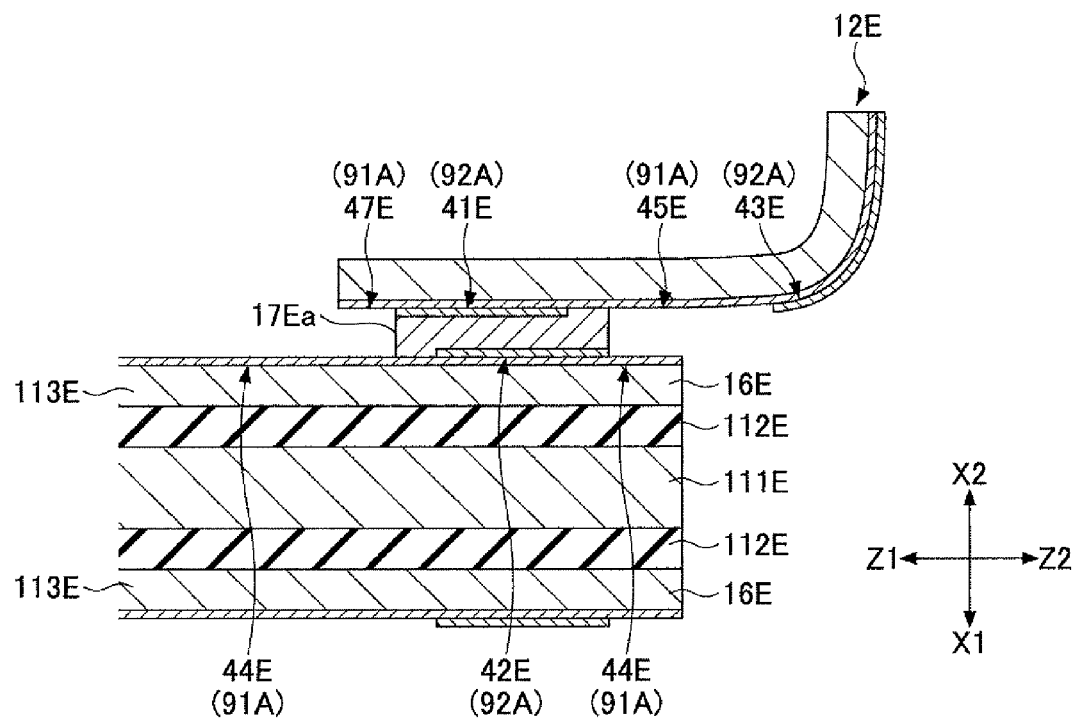
FIGS. 44A and 44B are diagrams illustrating a method of joining leads and corresponding pad electrodes, which is part of a method of manufacturing the jack connector according to the second embodiment of the present invention.
Figure 44B:
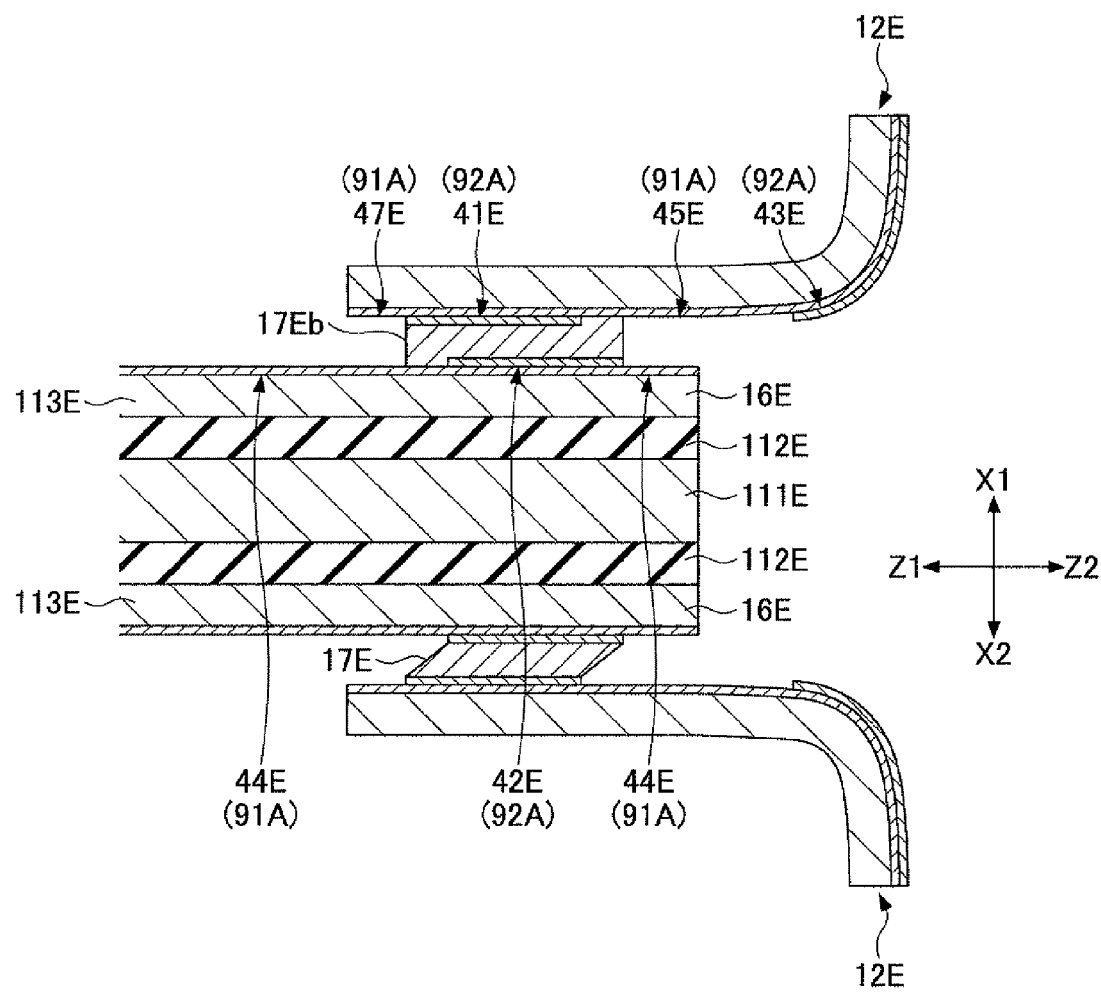

FIGS. 44A and 44B are diagrams illustrating a method of joining the leads 12E and the corresponding pad electrodes 16E, which is part of a method of manufacturing the jack connector 3A according to the second embodiment. FIG. 44A illustrates a first heat treatment process, and FIG. 44B illustrates a second heat treatment process.

In the process of FIG. 44A, first, a solder paste 17Ea having a high melting point, such as a Sn—In alloy having a melting point of approximately 190° C., is applied on each of the pad electrodes 16E provided on the front (X2-side) surface of the wiring board 11E. The area of application of the high-melting-point solder paste 17Ea may correspond to the first region 42E of each pad electrode 16E and the first region 41E of each lead 12E. In this case, it is ensured that the high-melting-point solder paste 17Ea melted by below-described heat treatment spreads over and wets both of the first region 42E and the first region 41E while contracting in volume to crush air gaps inside the high-melting-point solder paste 17Ea. Further, in this case, the molten high-melting-point solder paste 17Ea moves from the second regions 44E and 45E of lower solder wettability to the first regions 42E and 41E, respectively, of higher solder wettability.

After application of the high-melting-point solder paste 17Ea, the pad electrodes 16E and the corresponding leads 12E are aligned and fixed using a first fixation jig (not graphically illustrated).

Next, the high-melting-point solder paste 17Ea is melted by heat treatment and then solidified to form the conductive layers (solder layers) 17E of a high melting point. As a result, the leads 12E are connected to the corresponding pad electrodes 16E through the high-melting-point conductive layers 17E. Then, the first fixation jig is removed.

Next, in the process of FIG. 44B, a solder paste 17Eb having a low melting point, such as a Sn—Bi alloy having a melting point of approximately 140° C., is applied on each of the pad electrodes 16E provided on the rear (X1-side) surface of the wiring board 11E.

Next, the pad electrodes 16E and the corresponding leads 12E provided on the rear (X1-side) surface of the wiring board 11E (the remaining pad electrodes 16E and leads 12E) are aligned and fixed using a second fixation jig (not graphically illustrated).

Next, heat treatment is performed at a temperature lower than the melting point of the high-melting-point conductive layers 17E and higher than the melting point of the low-melting-point solder paste 17Eb. Thus, the low-melting-point solder paste 17Eb is melted, and then solidified to form the conductive layers (solder layers) 17E of a low melting point. As a result, the remaining leads 12E are connected to the corresponding remaining pad electrodes 16E through the low-melting-point conductive layers 17E. Then, the second fixation jig is removed.

According to the joining method illustrated in FIGS. 44A and 44B, the second heat treatment process is performed at a temperature lower than the melting point of the high-melting-point conductive layers 17E. Accordingly, it is possible to prevent the high-melting-point conductive layers 17E from melting during the second heat treatment process. As a result, it is possible to maintain the positional relationship between the leads 12E and the corresponding pad electrodes 16E (on the front [X1-side] surface of the wiring board 11E) positioned in the first heat treatment process.

Referring back to FIG. 42, the center C1 of the first region 41E of each lead 12E is offset in a direction away from the daughterboard 5A (in the Z1 direction) relative to the center C2 of the first region 42E of the corresponding pad electrode 16E. That is, each conductive layer (solder layer) 17E is formed to have its contact surface with the corresponding lead 12E offset in a direction away from the daughterboard 5A (in the Z1 direction) relative to its contact surface with the wiring board 11E (the corresponding pad electrode 16E). Accordingly, the conductive layer (solder layer) 17 has a substantially parallelogram-shaped cross section along the X-Z plane as illustrated in FIG. 42, for example.

Reheating the conductive layer (solder layer) 17E in this state causes the conductive layer 17E to melt to take a shape reduced in surface area (that is, a shape having a rectangular cross section) because of its surface tension.

If the second region 45E and the third region 47E of lower solder wettability were not present or formed to have the first region 41E to come into surface contact with the conductive layer 17E interposed between them, the molten conductive layer 17E would move on the lead 12E in the Z1-Z2 directions to reduce its surface area. Further, if the second regions 44E of lower solder wettability were not present or formed to have the first region 42E to come into surface contact with the conductive layer 17E interposed between them, the molten conductive layer 17E would move on the wiring board 11E (the pad electrode 16E) in the Z1-Z2 directions to reduce its surface area.

According to this embodiment, the second region 45E and the third region 47E are provided to have the first region 41E to come into surface contact with the conductive layer 17E sandwiched between them, and the second regions 44E are provided to have the first region 42E to come into surface contact with the conductive layer 17E sandwiched between them. This prevents the molten conductive layer (solder layer) 17E from moving on the lead 12E or the wiring board 11E (the pad electrode 16E) in the Z1-Z2 directions. Accordingly, the molten conductive layer (solder layer) 17E causes the lead 12E to move in a direction to approach the daughterboard 5A relative to the wiring board 11E in order to reduce the surface area of the conductive layer 17E. This makes it possible to urge the lead 12E toward the daughterboard 5A and ensure the connection of the lead 12E to the daughterboard 5A when the conductive layer 17E melts.

Further, according to this embodiment, the second region 45E of lower solder wettability is between the first region 41E to come into surface contact with the conductive layer (solder layer) 17E and the fourth region 43E to come into surface contact with the daughterboard 5A. Accordingly, the molten conductive layer 17E is prevented from moving on the lead 12E in the Z2 direction and coming into contact with the daughterboard 5A. This makes it possible to prevent the molten conductive layer 17E from adversely affecting the joining of the lead 12E and the daughterboard 5A.

Further, according to this embodiment, as illustrated in FIG. 41, the insulating layer 112E (third region) of low solder wettability is present on both lateral sides (Y1 and Y2 sides) of the first region 42E to come into surface contact with the conductive layer (solder layer) 17E. This prevents the molten conductive layer 17E from moving on the wiring board 11E in the Y1-Y2 directions. As a result, it is possible to prevent the molten conductive layer 17E from electrically connecting adjacent pad electrodes 16E.

Further, according to this embodiment, as illustrated in FIG. 42, the leads 12E are provided on both sides (X1 and X2 sides) of the wiring board 11E. Accordingly, the number of leads provided (per wiring board) can be increased compared with the case of providing leads on one side of a wiring board on the assumption that the leads are provided at the same intervals in both cases. Accordingly, the jack connector 3A of this embodiment can be reduced in size.

Figure 45A:
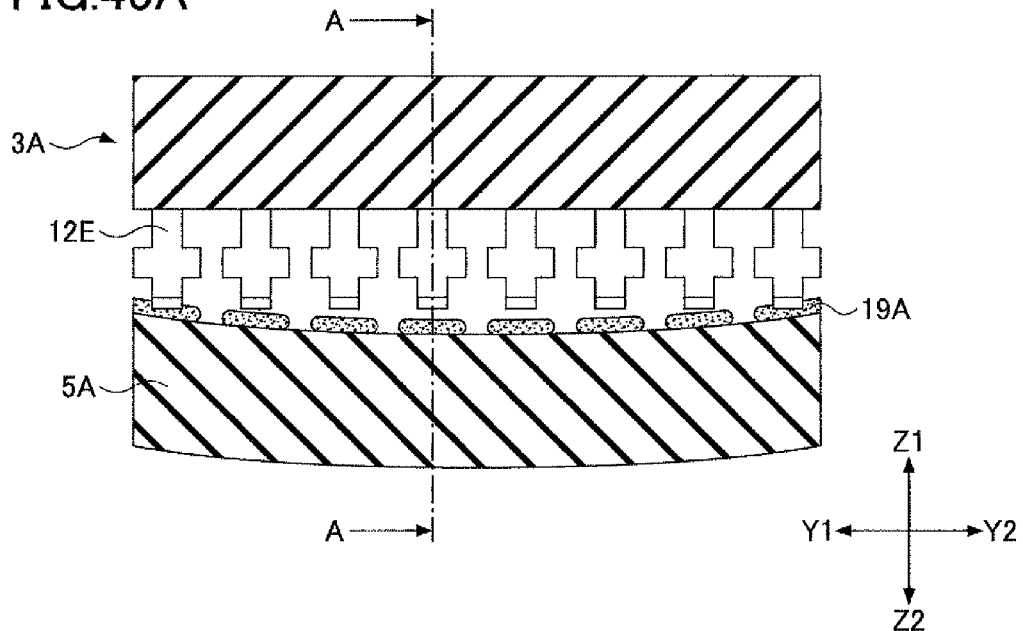
FIGS. 45A and 45B are a front-side cross-sectional view and a cross-sectional view taken along one-dot chain line A-A of FIG. 45A, respectively, of part of the jack connector and the daughterboard, illustrating placement of the jack connector on the daughterboard according to the second embodiment of the present invention.
Figure 45B:
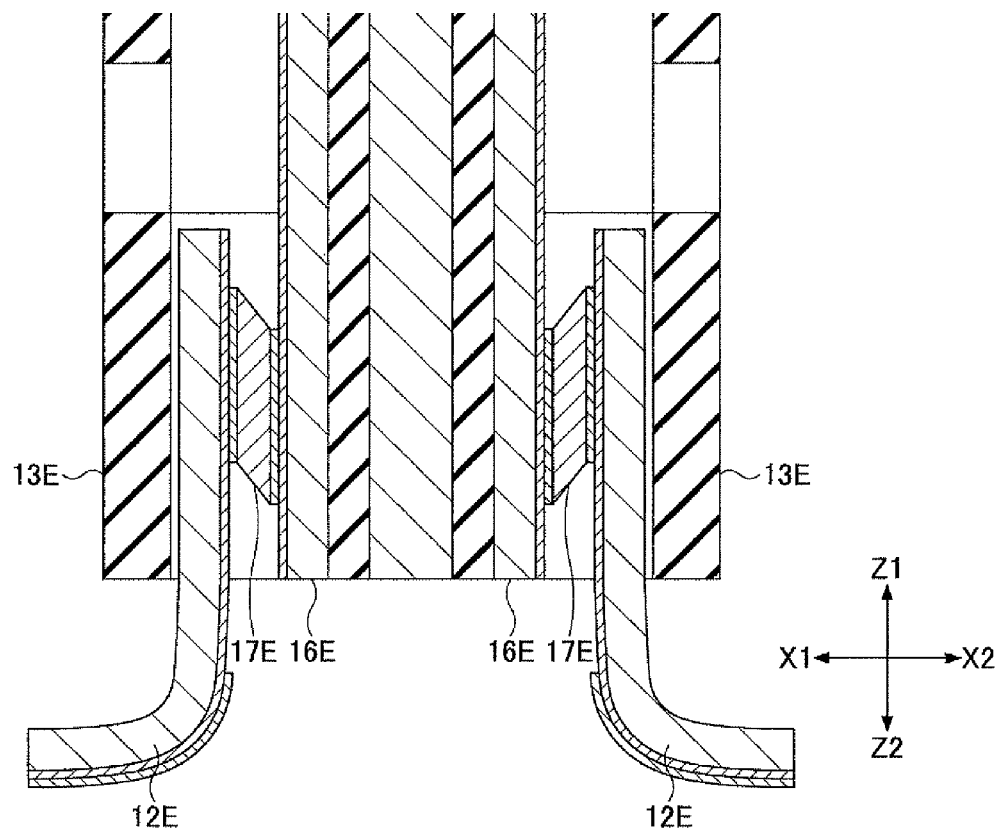

FIGS. 45A and 45B are a front-side cross-sectional view and a cross-sectional view taken along one-dot chain line A-A of FIG. 45A, respectively, of part of the jack connector 3A and the daughterboard 5A, illustrating placement of the jack connector 3A on the daughterboard 5A according to this embodiment. In FIG. 45B, the adhesive agent 19A and the daughterboard 5A are omitted for convenience of graphical representation.

The adhesive agent 19A for adhering (bonding) the leads 12E to the daughterboard 5A is provided on the daughterboard 5A. The adhesive agent 19A may be a solder paste higher in melting point than the conductive layers (solder layer) 17E. Examples of the adhesive agent 19A include a Sn—Ag—Cu alloy having a melting point of 220° C. In the case illustrated in FIGS. 45A and 45B, there is a gap between some of the leads 12E and the adhesive agent (solder paste) 19A due to the (surface) warpage of the daughterboard 5A.

Figure 46A:
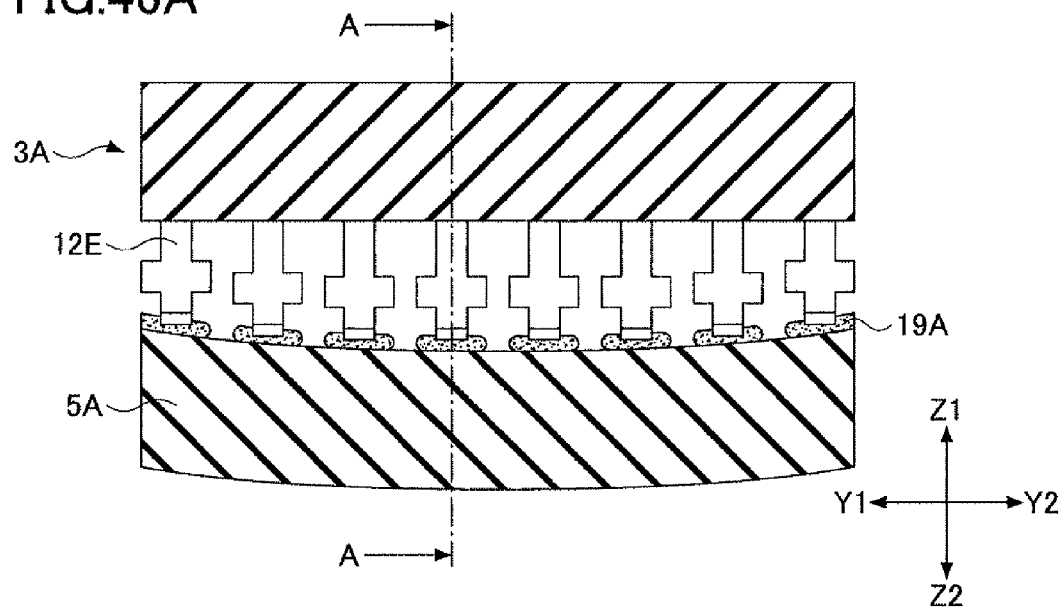
FIGS. 46A and 46B are a front-side cross-sectional view and a cross-sectional view taken along one-dot chain line A-A of FIG. 46A, respectively, of part of the jack connector and the daughterboard after heating the structure of FIGS. 45A and 45B, illustrating a mounting structure of the jack connector according to the second embodiment of the present invention.
Figure 46B:
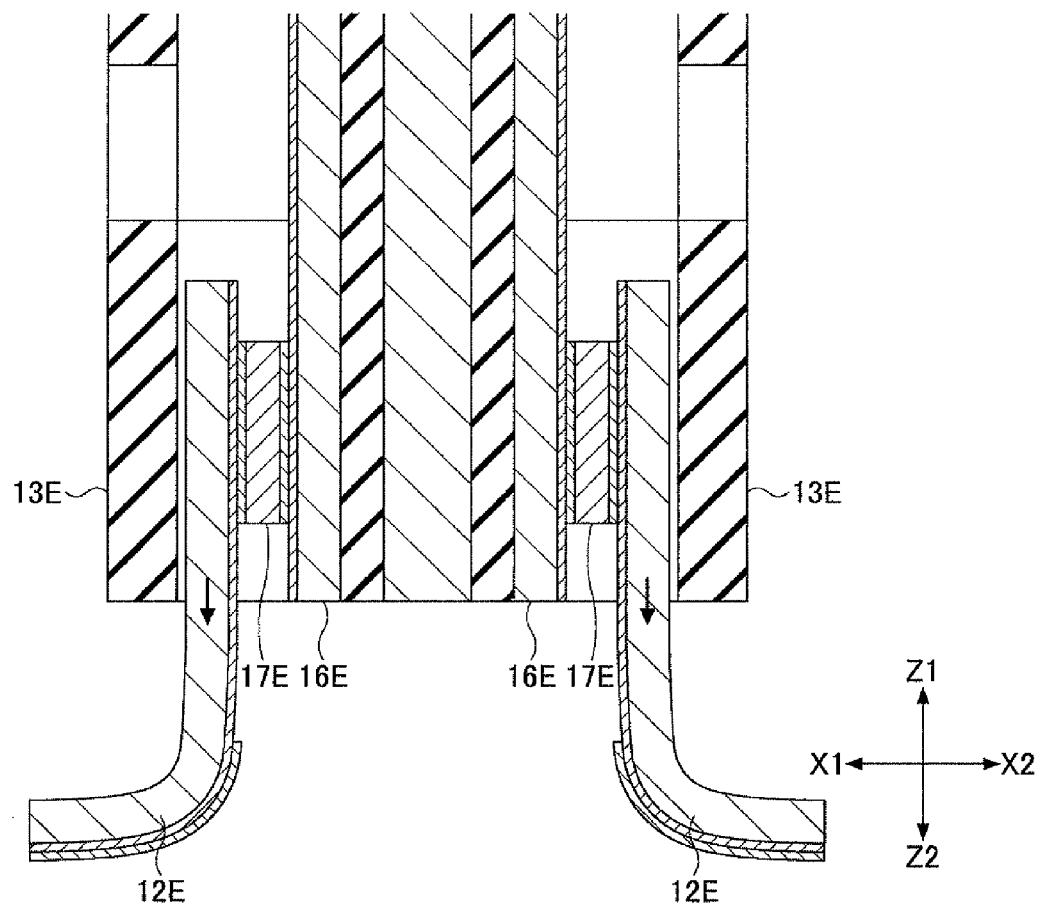

FIGS. 46A and 46B are a front-side cross-sectional view and a cross-sectional view taken along one-dot chain line A-A of FIG. 46A, respectively, of part of the jack connector 3A and the daughterboard 5A after heating the structure of FIGS. 45A and 45B, illustrating a mounting structure of the jack connector 3A according to this embodiment. In FIG. 46B, the adhesive agent 19A and the daughterboard 5A are omitted for convenience of graphical representation.

When the adhesive agent (solder paste) 19A is caused to melt by application of heat, the conductive layers (solder layers) 17E melt to allow the leads 12E to move inside the corresponding guide grooves 132E. In this state, the surface tension of the molten conductive layers 17E causes the leads 12E to be pushed out of the corresponding guide grooves 132E in the Z2 direction so as to absorb the (surface) warpage of the daughterboard 5A. As a result, it is possible to ensure the connection of the leads 12E to the daughterboard 5A after the heat treatment, so that it is possible to increase the reliability of the electrical and mechanical connections of the leads 12E to the daughterboard 5A.

Further, according to the above-described configuration, the second region 45E of lower solder wettability is formed between the first region 41E to come into contact with the conductive layer 17E and the fourth region 43E to come into contact with the adhesive agent (solder paste) 19A. Accordingly, it is possible to prevent the interdiffusion of the liquid melt of the conductive layer 17E and the liquid melt of the adhesive agent 19A by separating the liquid melts from each other. This makes it possible to maintain the compositions of the conductive layer 17E and the adhesive agent 19A and thus to obtain a target or desired joining strength and durability after heat treatment, so that it is possible to increase the reliability of the mechanical connection of the leads 12E and the daughterboard 5A.

The present invention is not limited to this embodiment, and variations and modifications may be made without departing from the scope of the present application.

For example, in this embodiment, the present invention is applied to the jack connector 3A. However, the present invention is not limited to this, and may also be applied to the plug connector 2A (for example, FIG. 8).

Further, in this embodiment, some of the leads 12E are connected to the front (X2-side) surface of the wiring board 11E through the conductive layers (solder layers) 17A of a high melting point, and thereafter, the remaining leads 12E are connected to the rear (X1-side) surface of the wiring board 11E through the conductive layers (solder layers) 17A of a low melting point. However, the present invention is not limited to this configuration. For example, all the leads 12E may be connected to the front (X2-side) and rear (X1-side) surfaces of the wiring board 11E simultaneously through the conductive layers 17E of the same melting point.

Further, according to this embodiment, as illustrated in FIGS. 44A and 44B, the solder pastes 17Ea and 17Eb provided between the pad electrodes 16E and the corresponding leads 12E are melted by heat treatment and solidified to form the conductive layers (solder layers) 17E, but the present invention is not limited to this configuration. For example, a solder layer may be formed on one or both of the first regions 41E and 42E before providing the solder paste 17Ea or 17Eb. Preforming such a solder layer further ensures that the solder melted by heat treatment spreads over and wets the first regions 41E and 42E.

Further, as illustrated in FIG. 42, the conductive layers 17E have a substantially parallelogram-shaped cross section along the X-Z plane, but the present invention is not limited to this configuration. For example, the conductive layers 17E may have a substantially trapezoidal shape. In this case, the cross-sectional shape of the molten conductive layers 17E is caused to become an isosceles trapezoid because of their surface tension.

Figure 47:
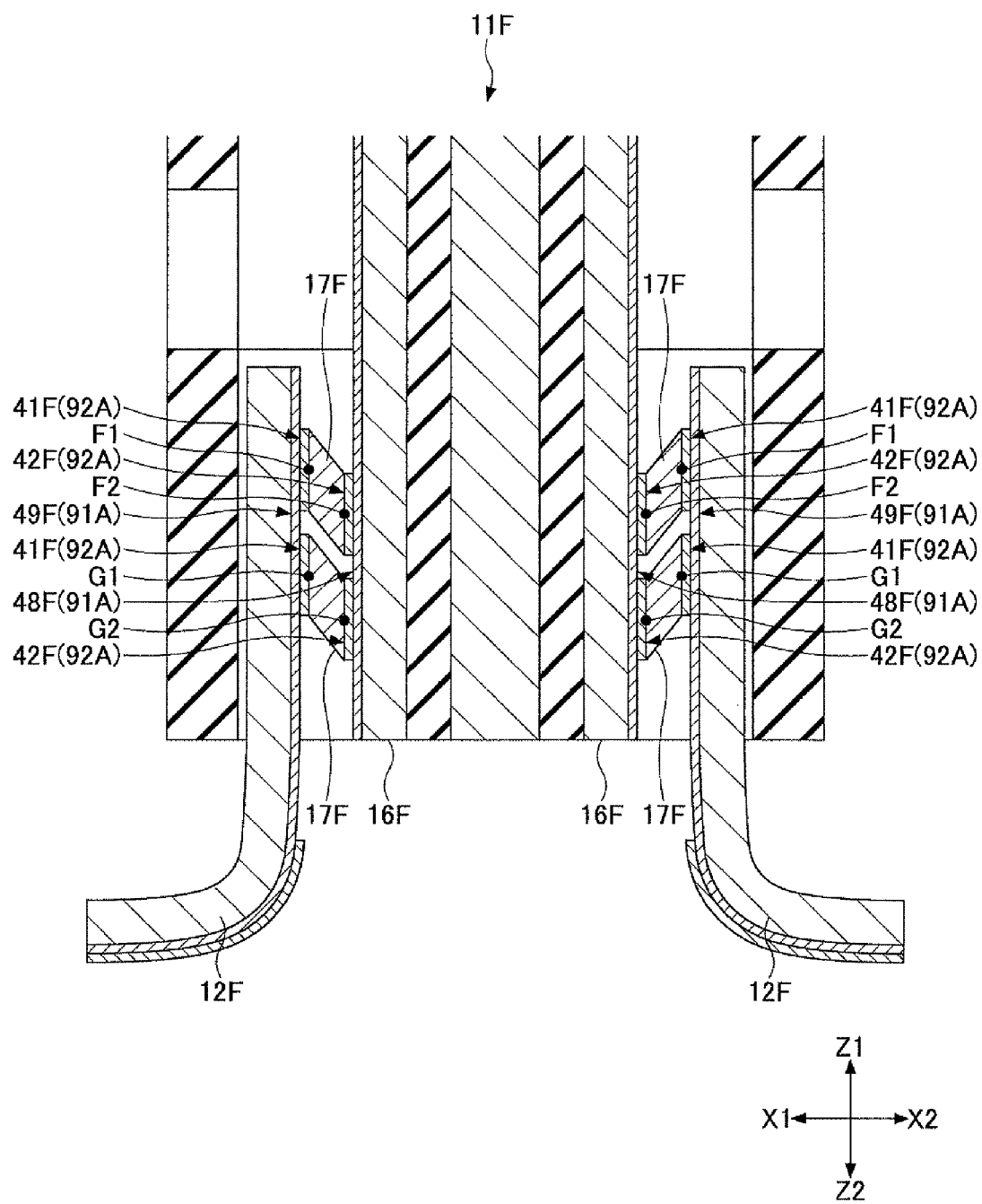
FIG. 47 is a cross-sectional view of the module according to a variation of the second embodiment of the present invention.

Further, according to this embodiment, as illustrated in FIG. 42, one conductive layer 17E is provided between each pad electrode 16E and the corresponding lead 12E. However, the present invention is not limited to this configuration, and as illustrated in FIG. 47, multiple conductive layers 17F may be provided between one pad electrode 16F and a corresponding one lead 12F. In this case, the pad electrode 16F includes first regions 42F and a fourth region 48F provided between the adjacent first regions 42F, and the lead 12F includes first regions 41F and a fifth region 49F provided between the adjacent first regions 41F. The fourth region 48F and the fifth region 49F are lower in wettability with respect to the liquid melt of the conductive layers 17F than the first regions 42F and the first regions 41F, respectively. The centers F1 and G1 of the first regions 41F of the lead 12F is offset in a direction away from an external board (in the Z1 direction) relative to the centers F2 and G2, respectively, of the first region 42F of the corresponding pad electrode 16F (a wiring board 11F).

Further, according to this embodiment, the conductive layers 17E may be formed of solder. The conductive layers 17E are not limited to particular types of materials and may be formed of any material as long as the conductive layers 17E are meltable at the time of bonding the leads 12E to the daughterboard 5A. For example, the conductive layers 17E may be formed of a metal other than solder, such as In having a melting point of approximately 160° C. Further, the starting material of the conductive layers 17E may be in the form of either paste or foil.

Further, according to this embodiment, the conductive layers 17E have a lower melting point than the adhesive agent 19A for bonding the leads 12E to the daughterboard 5A. However, the conductive layers 17E have a higher melting point than the adhesive agent 19A as long as the conductive layers 17E are meltable at the time of bonding the leads 12E to the daughterboard 5A.

Further, according to this embodiment, solder is used for the adhesive agent 19A. However, the adhesive agent 19A is not limited to particular types. For example, an anisotropic conductive film (ACF) formed of a mixture of thermosetting resin and metal particulates, or a metal other than solder may be used for the adhesive agent 19A. The adhesive agent 19A may be in the form of either paste or foil.

The present invention is not limited to the specifically disclosed embodiments, and variations and modifications may be made without departing from the scope of the present invention.

What is claimed is:

1. A connector, comprising:
   a wiring board;
   a lead configured to connect the wiring board electrically to an external board; and a conductive layer configured to connect the lead to the wiring board so as to allow the lead to move in predetermined directions relative to the wiring board when the conductive layer is melted, wherein the lead includes a first region, a second region, and a third region, the first region being in contact with the conductive layer and being sandwiched between the second region and the third region in directions parallel to the predetermined directions, the second region and the third region being lower in wettability with respect to a liquid melt of the conductive layer than the first region, the wiring board includes a first region and a pair of second regions, the first region being in contact with the conductive layer and being sandwiched between the second regions in the directions parallel to the predetermined directions, the second regions being lower in wettability with respect to the liquid melt of the conductive layer than the first region, and a center of the first region of the lead is offset in a direction parallel to the predetermined directions and away from the external board relative to a center of the first region of the wiring board.

2. The connector as claimed in claim 1, wherein the wiring board further includes a pair of third regions, the third regions being lower in wettability with respect to the liquid melt of the conductive layer than the first region of the wiring board, the first region of the wiring board being sandwiched between the third regions in directions perpendicular to the predetermined directions.

3. The connector as claimed in claim 1, further comprising:

an insulative spacer fixed to the wiring board, the insulative spacer including a guide groove configured to guide the lead in the predetermined directions when the conductive layer is melted; and a window part formed near the guide groove.

* * * * *